US012765164B2

(12) United States Patent
Lee et al.

(10) Patent No.: US 12,765,164 B2
(45) Date of Patent: Oct. 13, 2026

(54) LIGHT EMITTING ELEMENT, AND DISPLAY APPARATUS INCLUDING THE SAME

(71) Applicant: Samsung Display Co., Ltd., Yongin-si (KR)

(72) Inventors: Jongwon Lee, Yongin-si (KR); Seung Cheol Kim, Yongin-si (KR); Chang-Min Lee, Yongin-si (KR); Hakchoong Lee, Yongin-si (KR); Jaehoon Hwang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 259 days.

(21) Appl. No.: 18/630,147

(22) Filed: Apr. 9, 2024

(65) Prior Publication Data

US 2025/0072202 A1 Feb. 27, 2025

(30) Foreign Application Priority Data

Jul. 19, 2023 (KR) ........................ 10-2023-0093694

(51) Int. Cl.

| | |
|---|---|
| ***H10K 50/13*** | (2023.01) |
| ***H10K 50/115*** | (2023.01) |
| ***H10K 50/12*** | (2023.01) |
| ***H10K 50/15*** | (2023.01) |
| ***H10K 50/16*** | (2023.01) |
| ***H10K 59/35*** | (2023.01) |

(52) U.S. Cl.

CPC ........... *H10K 50/13* (2023.02); *H10K 50/115* (2023.02); *H10K 50/12* (2023.02); *H10K 50/15* (2023.02); *H10K 50/16* (2023.02); *H10K 59/35* (2023.02)

(58) Field of Classification Search

None

See application file for complete search history.

(56) References Cited

U.S. PATENT DOCUMENTS

| | | | |
|---|---|---|---|
| 2021/0384442 A1 | 12/2021 | Watabe et al. | |
| 2022/0320470 A1 | 10/2022 | Watabe et al. | |
| 2023/0165095 A1 | 5/2023 | Lee et al. | |
| 2025/0072202 A1 * | 2/2025 | Lee | H10K 50/13 |

FOREIGN PATENT DOCUMENTS

| | | |
|---|---|---|
| KR | 10-2020-0051658 | 5/2020 |
| KR | 10-2022-0133786 | 10/2022 |
| KR | 10-2023-0040758 | 3/2023 |

* cited by examiner

*Primary Examiner* — Jack S Chen

(74) *Attorney, Agent, or Firm* — CANTOR COLBURN LLP

(57) ABSTRACT

A light emitting element includes a first electrode, a second electrode facing the first electrode, and a plurality of light emitting structures stacked between the first electrode and the second electrode, each of the plurality of light emitting structures including a hole transport region, a light emitting layer, and an electron transport region. At least one of the light emitting structures is a green light emitting structure which emits green light, and the light emitting layer of the green light emitting structure includes a first sub-light emitting layer including a low refractive material having a refractive index value less than or equal to about 1.7 at 460 nm, and a second sub-light emitting layer not including the low refractive material, and disposed on the first sub-light emitting layer, so that the light emitting element may exhibit high light emission efficiency.

25 Claims, 12 Drawing Sheets

LIGHT EMITTING ELEMENT, AND DISPLAY APPARATUS INCLUDING THE SAME

CROSS-REFERENCE TO RELATED APPLICATION(S)

This application claims priority to and benefits of Korean Patent Application No. 10-2023-0093694 under 35 U.S.C. § 119, filed on Jul. 19, 2023, in the Korean Intellectual Property Office (KIPO) the entire contents of which are incorporated herein by reference.

BACKGROUND

1. Technical Field

The disclosure herein relates to a light emitting element having multiple stacked light emitting structures, and a display device including the same.

2. Description of the Related Art

Various display devices used for multimedia devices, such as televisions, mobile phones, tablet computers, and game consoles, are being developed. In such display devices, a so-called self-luminescence display element which realizes display by allowing a light emitting material including an organic compound, a quantum dot, or the like to emit light in a light emitting layer disposed between electrodes facing each other is used.

In applying a light emitting element in a display device, the light emitting element is required to have high light emission efficiency and a long lifespan, and the development of the material for the light emitting element and the stacking structure of the light emitting element to stably implement the above is in constant demand.

SUMMARY

The disclosure provides a light emitting element with excellent light extraction efficiency and improved light emission efficiency.

The disclosure also provides a display device including a light emitting element which has high light emission efficiency.

In an embodiment of the disclosure, a light emitting element may include a first electrode, a second electrode facing the first electrode, and a plurality of light emitting structures stacked between the first electrode and the second electrode, each of the plurality of light emitting structures including a hole transport region, a light emitting layer, and an electron transport region. At least one of the plurality of light emitting structures may be a green light emitting structure which emits green light. The light emitting layer of the green light emitting structure may include a first sub-light emitting layer including a low refractive material having a refractive index value less than or equal to about 1.7 at 460 nm, and a second sub-light emitting layer not including the low refractive material, and disposed on the first sub-light emitting layer.

In an embodiment, the first sub-light emitting layer and the second sub-light emitting layer may each include a hole transporting first host, an electron transporting second host, and a green light emitting dopant.

In an embodiment, the low refractive material may be a hole transporting host.

In an embodiment, the first sub-light emitting layer may be directly disposed on the hole transport region of the green light emitting structure.

In an embodiment, the hole transport region of the green light emitting structure may include a hole transport layer, and an auxiliary hole transport layer disposed on the hole transport layer, and including a low refractive hole transporting material having a refractive index value less than or equal to about 1.7 at 460 nm.

In an embodiment, the first sub-light emitting layer may be directly disposed on the auxiliary hole transport layer.

In an embodiment, the low refractive material and the low refractive hole transport material may be same.

In an embodiment, the plurality of light emitting structures may include a first light emitting structure disposed on the first electrode and emitting blue light, a second light emitting structure disposed on the first light emitting structure and emitting blue light, a third light emitting structure disposed on the second light emitting structure and emitting blue light, and the green light emitting structure disposed on the third light emitting structure.

In an embodiment, the light emitting layer of each of the first light emitting structure, the second light emitting structure, and the third light emitting structure may include a hole transporting host, an electron transporting host, and a blue light emitting dopant.

In an embodiment, the plurality of light emitting structures may include a first light emitting structure disposed on the first electrode and emitting blue light, a second light emitting structure disposed on the first light emitting structure and emitting blue light, and the green light emitting structure disposed on the second light emitting structure.

In an embodiment, the plurality of light emitting structures may include a first light emitting structure, a second light emitting structure, a third light emitting structure, and a fourth light emitting structure each emitting blue light and sequentially stacked between the first electrode and the second electrode. The green light emitting structure may include a first green light emitting structure disposed between the second light emitting structure and the third light emitting structure, and a second green light emitting structure disposed on an upper side of the fourth light emitting structure. The second green light emitting structure may include the first sub-light emitting layer having the low refractive material and the second sub-light emitting layer not including the low refractive material.

In an embodiment, the first sub-light emitting layer and the second sub-light emitting layer may have a same thickness.

In an embodiment of the disclosure, a light emitting element may include a first electrode, a second electrode facing the first electrode, a plurality of light emitting structures sequentially stacked between the first electrode and the second electrode, each of the plurality of light emitting structures including a hole transport region, a light emitting layer, and an electron transport region, and a charge generating layer disposed between adjacent ones of the plurality of light emitting structures between the first electrode and the second electrode. Two or more of the plurality of light emitting structures may be blue light emitting structures that emit blue light, and at least one of the plurality of light emitting structures may be a green light emitting structure that emits green light. The green light emitting structure may include a first sub-light emitting layer including a first host, a first dopant, and a low refractive material having a refractive index value less than or equal to about 1.7 at 460 nm, and a second sub-light emitting layer disposed on the first sub-light emitting layer, and including a second host and a second dopant.

In an embodiment, the charge generating layer may include a n-type charge generating layer doped with a n-type dopant, and a p-type charge generating layer doped with a n-p dopant.

In an embodiment, the second sub-light emitting layer may not include the low refractive material, the first host and the second host may be same, and the first dopant and the second dopant may be same.

In an embodiment, the plurality of light emitting structures may include a first blue light emitting structure disposed on the first electrode, a second blue light emitting structure disposed on the first blue light emitting structure, a third blue light emitting structure disposed on the second blue light emitting structure, and the green light emitting structure disposed on the third blue light emitting structure.

In an embodiment, the hole transport region of the green light emitting structure may include an auxiliary hole transport layer directly disposed on a lower side of the first sub-light emitting layer, and including a low refractive hole transport material having a refractive index value less than or equal to about 1.7 at 460 nm.

In an embodiment, light emitted from the plurality of light emitting structures may be emitted to an upper side of the second electrode.

In an embodiment, among the plurality of light emitting structures, the green light emitting structure may be disposed adjacent to the second electrode.

In an embodiment, the light emitting layer of each of the first blue light emitting structure, the second blue light emitting structure, and the third light emitting structure may not include the low refractive index material.

In an embodiment of the disclosure, a display device may include a light emitting element that outputs source light, and an optical layer disposed on the light emitting element, and either transmitting the source light or converting the wavelength of the source light. The light emitting element may include a first electrode, a second electrode facing the first electrode, and a plurality of light emitting structures stacked between the first electrode and the second electrode, each of the plurality of light emitting structures including a hole transport region, a light emitting layer, and an electron transport region. At least one of the plurality of light emitting structures may be a green light emitting structure that emits green light. The light emitting layer of the green light emitting structure may include a first sub-light emitting layer including a low refractive material having a refractive index value less than or equal to about 1.7 at 460 nm, and a second sub-light emitting layer not including the low refractive material, and disposed on the first sub-light emitting layer.

In an embodiment, the optical layer may include a light control layer including quantum dots that convert the wavelength of the source light.

In an embodiment, the light emitting element may further include a first pixel region that emits red light, a second pixel region that emits green light, and a third pixel region that emits blue light. The first pixel region, the second pixel region, and the third pixel region may not overlap with each other in a plan view. The light control layer may include a first light control part disposed corresponding to the first pixel region, and including a first quantum dot that converts the wavelength of the source light, a second light control part disposed corresponding to the second pixel region, and including a second quantum dot that converts the wavelength of the source light, and a third light control part disposed corresponding to the third pixel region.

In an embodiment, the low refractive material may be a hole transporting host.

In an embodiment, the hole transport region of the green light emitting structure may include a hole injection layer, a hole transport layer disposed on the hole injection layer, and an auxiliary hole transport layer disposed on the hole transport layer, and including a low refractive hole transporting material having a refractive index value less than or equal to about 1.7 at 460 nm. The first sub-light emitting layer may be directly disposed on the auxiliary hole transport layer.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings.

DETAILED DESCRIPTION OF THE EMBODIMENTS

Figure 1A:
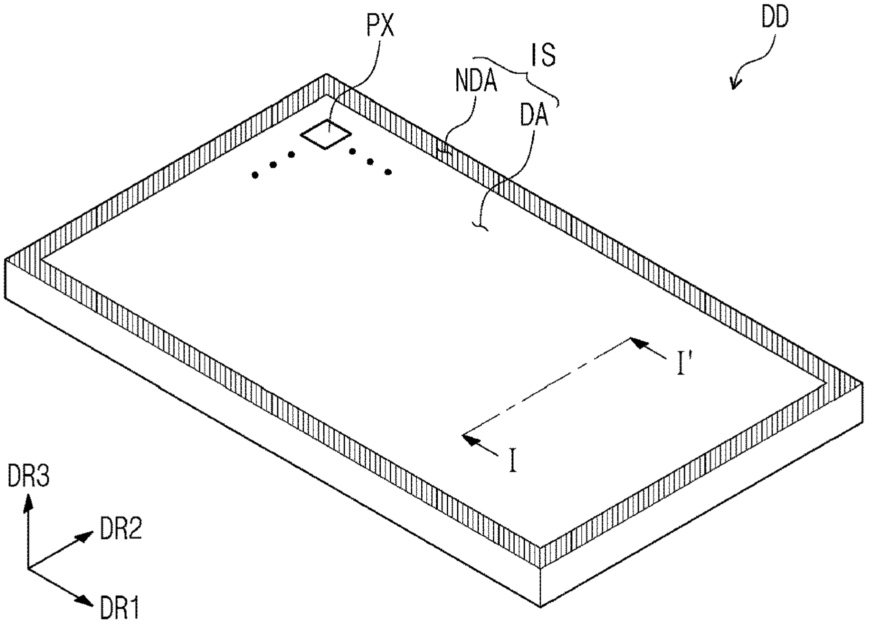
FIG. 1A is a perspective view of a display device according to an embodiment of the disclosure.

The disclosure may be modified in many alternate forms, and thus specific embodiments will be illustrated in the drawings and described in detail. It should be understood, however, that it is not intended to limit the disclosure to the particular forms disclosed, but rather, is intended to cover all modifications, equivalents, and alternatives falling within the spirit and scope of the disclosure.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

Like reference numerals refer to like elements. Also, in the drawings, the thickness, the ratio, and the dimensions of elements are exaggerated for an effective description of technical contents. The term "and/or" includes any and all combinations of one or more of which associated elements may define.

It will be understood that, although the terms "first," "second," etc. may be used herein to describe various elements, these elements should not be limited by these terms. These terms are only used to distinguish one element from another. For example, a first element may be referred to as a second element, and a second element may also be referred to as a first element in a similar manner without departing the scope of rights of the disclosure. The terms of a singular form may include plural forms unless the context clearly indicates otherwise.

In addition, terms such as "below," "lower," "above," "upper," and the like are used to describe the relationship of the elements shown in the drawings. The terms are used as a relative concept and are described with reference to the direction indicated in the drawings.

It should be understood that the term "comprise," or "have" is intended to specify the presence of stated features, integers, steps, operations, elements, components, or combinations thereof in the disclosure, but do not preclude the presence or addition of one or more other features, integers, steps, operations, elements, components, or combinations thereof.

In the disclosure, being "directly disposed" may mean that there is no layer, film, region, plate, or the like added between a portion of a layer, a film, a region, a plate, or the like and other portions. For example, being "directly disposed" may mean being disposed without additional members such as an adhesive member between two layers or two members.

In the specification and the claims, the phrase "at least one of" is intended to include the meaning of "at least one selected from the group of" for the purpose of its meaning and interpretation. For example, "at least one of A and B" may be understood to mean "A, B, or A and B." In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Unless otherwise defined, all terms (including technical and scientific terms) used herein have the same meaning as commonly understood by one of ordinary skill in the art to which the disclosure pertains. It is also to be understood that terms such as terms defined in commonly used dictionaries should be interpreted as having meanings consistent with the meanings in the context of the related art, and should not be interpreted in too ideal a sense or an overly formal sense unless explicitly defined herein.

Hereinafter, a light emitting element of an embodiment and a display device of an embodiment will be described with reference to the accompanying drawings.

Figure 1B:
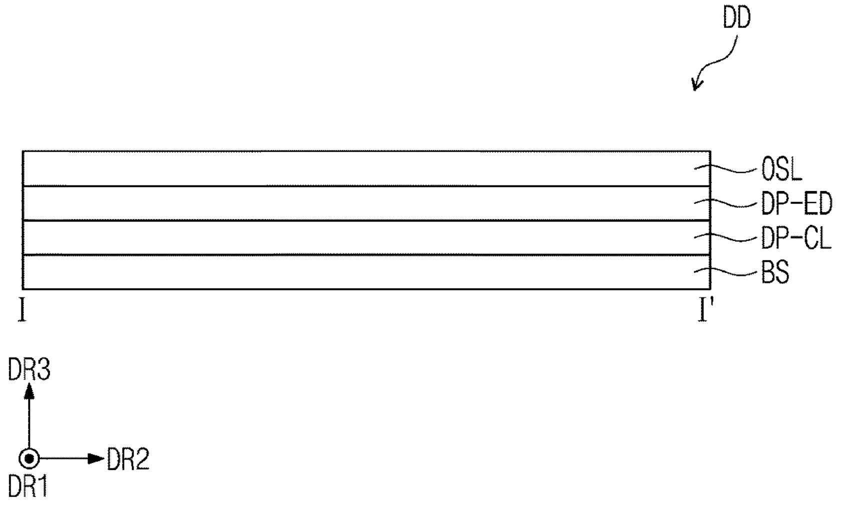
FIG. 1B is a schematic cross-sectional view of a display device according to an embodiment of the disclosure.
Figure 1C:
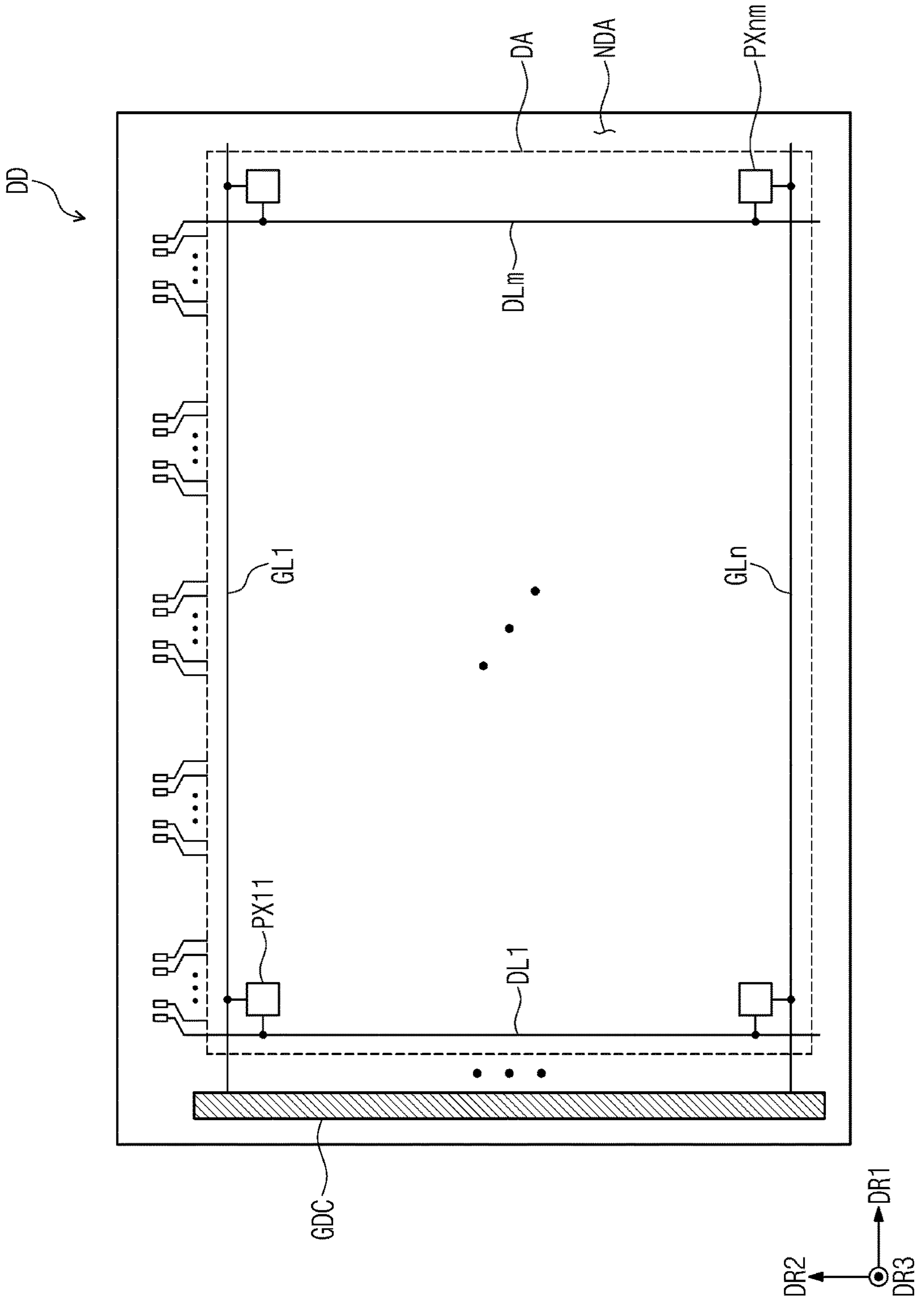
FIG. 1C is a plan view of a display device according to an embodiment of the disclosure.

FIG. 1A is a perspective view of a display device of an embodiment of the disclosure. FIG. 1B is a schematic cross-sectional view of a display device according to an embodiment of the disclosure. FIG. 1C is a plan view of a display device according to an embodiment of the disclosure. FIG. 1B may correspond to line I-I' of FIG. 1A.

A display device DD of an embodiment may be a device which is activated in response to an electrical signal and displays images. For example, the display device DD may be a large-sized device such as a television and an external billboard, and may also be a small-and-medium-sized device such as a monitor, a mobile phone, a tablet, a navigation system unit, and a game console. However, embodiments of the display device DD are exemplary, and the display device DD is not limited to any one thereof without departing from the disclosure.

The display device DD may be rigid or flexible. Being "flexible" refers to having properties of being able to be bent. For example, a flexible display device DD may include a curved device, a rollable device, or a foldable device.

In FIG. 1A and the following drawings, a first direction axis DR1 to a third direction axis DR3 are illustrated, and directions indicated by the first to third direction axes DR1, DR2, and DR3 described in the specification are relative concepts, and may be converted into different directions. The directions indicated by the first to third direction axes DR1, DR2, and DR3 may be described as first to third directions DR1, DR2, and DR3, and may be denoted by the same reference numerals. In the specification, the first direction axis DR1 and the second direction axis DR2 may be perpendicular to each other, and the third direction axis DR3 may be a normal direction with respect to a plane defined by the first direction axis DR1 and the second direction axis DR2.

The thickness direction of the display device DD may be a direction parallel to a third direction axis DR3, which is a normal direction with respect to a plane defined by the first direction axis DR1 and the second direction axis DR2. In the specification, a front surface (or an upper surface) and a rear surface (or a lower surface) of members constituting the display device DD may be defined on the basis of the third direction axis DR3. The front surface (or upper surface) and the rear surface (or lower surface) of members constituting the display device DD may oppose each other in the third direction DR3, and a normal direction of each of the front surface and the rear surface may be substantially parallel to the third direction DR3. A separation distance between the front surface and the rear surface, which is defined along the third direction DR3, may correspond to the thickness of a member.

In the specification, "on a plane" or "in a plan view" may be defined as a state viewed in the third direction DR3. In the specification, "on a cross-section" or "in a cross-sectional view" may be defined as a state viewed in the first direction DR1 or the second direction DR2. Directions indicated by the first to third directions DR1, DR2, and DR3 are a relative concept, and may be converted to different directions.

The display device DD according to an embodiment may display images through a display surface IS. The display surface IS may include a plane defined by the first direction DR1 and the second direction DR2. The display surface IS may include a display region DA and the non-display region NDA. A pixel PX may be disposed in the display region DA, and the pixel PX may be not disposed in the non-display region NDA. The non-display region NDA may be defined along the edge of the display surface IS. The non-display region NDA may surround the display region DA. However, the disclosure is not limited thereto, and in an embodiment of the disclosure, the non-display region NDA may be omitted, or may be disposed on only a side of the display region DA.

In an embodiment of the disclosure, the display device DD provided with a planar display surface IS is illustrated, but the disclosure is not limited thereto. The display device DD may include a curved display surface or a three-dimensional display surface. The three-dimensional display surface may include multiple display regions indicating different directions from each other.

Referring to FIG. 1B, the display device DD may include a base layer BS, a circuit layer DP-CL, and a display layer DP-ED which are sequentially stacked in the direction of the third direction axis DR3. The display device DD of an embodiment may further include an optical layer OSL disposed on the display layer DP-ED.

The base layer BS may be a support substrate on which the circuit layer DP-CL and the display layer DP-ED are provided. The circuit layer DP-CL may include at least one insulation layer and a circuit element. The circuit element may include a signal line, a driving circuit of a pixel, or the like. The circuit layer DP-CL may be formed through a forming process of an insulation layer, a semiconductor layer, and a conductive layer by coating, deposition, or the like, and a patterning process of the insulation layer, the semiconductor layer, and the conductive layer by a photolithography process. The display layer DP-ED may include a display element. The optical layer OSL may convert the color of light provided from the display element. The optical layer OSL may include a light control pattern and a structure for increasing light conversion efficiency.

FIG. 1C illustrates a planar arrangement relationship of signal lines GL1 to GLn and DL1 to DLm and pixels PX11 to PXnm. The signal lines GL1 to GLn and DL1 to DLm may include multiple gate lines GL1 to GLn and multiple data lines DL1 to DLm.

Each of the pixels PX11 to PXnm may be connected to a corresponding gate line among the gate lines GL1 to GLn and a corresponding data line among the data lines DL1 to DLm. Each of the pixels PX11 to PXnm may include a pixel driving circuit and a display element. Depending on the configuration of the pixel driving circuit of each of the pixels PX11 to PXnm, more types of signal lines may be provided in a display device DD.

The pixels PX11 to PXnm in a matrix form are illustrated, but the disclosure is not limited thereto. In an embodiment, the pixels PX11 to PXnm may be disposed in a PenTile® form. For example, points at which the pixels PX11 to PXnm are disposed may correspond to vertices of a diamond. A gate driving circuit GDC may be integrated into the display device DD through an oxide silicon gate driver circuit (OSG) or amorphose silicon gate driver circuit (ASG) process.

Figure 2:
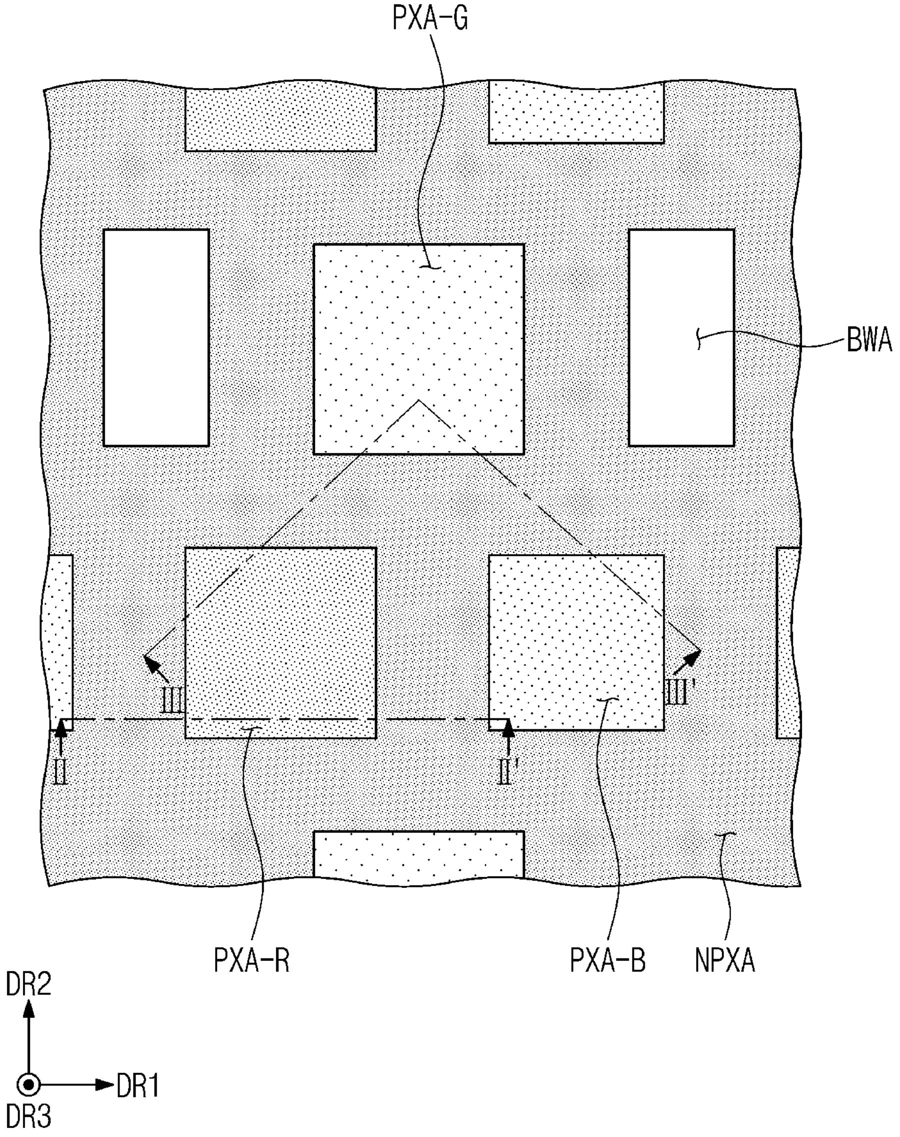
FIG. 2 is a plan view showing an enlarged portion of a display device according to an embodiment of the disclosure.

FIG. 2 is a plan view of an enlarged portion of a display device of an embodiment of the disclosure. FIG. 2 schematically illustrates a plane in which the display device DD (FIG. 1A) of an embodiment includes three pixel regions PXA-R, PXA-G, and PXA-B), and a bank well region BWA adjacent thereto. In an embodiment of the disclosure, the three types of pixel regions PXA-R, PXA-G, and PXA-B illustrated in FIG. 2 may be repeatedly disposed throughout the display region DA (see FIG. 1A). The pixel regions PXA-R, PXA-G, and PXA-B may also be referred to as light emitting regions.

Around first to third pixel regions PXA-R, PXA-G, and PXA-B, a peripheral region NPXA may be disposed. The peripheral region NPXA may also be referred to as a non-light emitting region.

The peripheral region NPXA may set boundaries of the first to third pixel regions PXA-R, PXA-G, and PXA-B. The peripheral region NPXA may surround the first to third pixel regions PXA-R, PXA-G, and PXA-B. In the peripheral region NPXA, a structure for preventing color mixing between the first to third pixel regions PXA-R, PXA-G, and PXA-B, for example, a pixel definition layer PDL (see FIG. 3), a bank BMP (see FIG. 3), or the like may be disposed.

In FIG. 2, the first to third pixel regions PXA-R, PXA-G, and PXA-B having the same planar shape and different planar areas are schematically illustrated, but the disclosure is not limited thereto. Areas of two or more pixel regions among the first to third pixel regions PXA-R, PXA-G, and PXA-B may be the same. The area of each of the first to third pixel regions PXA-R, PXA-G, and PXA-B may be set according to the color of emitted light. Among primary colors, the area of a pixel region emitting red light may be the largest, and the area of a pixel region emitting blue light may be the smallest.

In FIG. 2, the first to third pixel regions PXA-R, PXA-G, and PXA-B each having a rectangular shape are illustrated, but the disclosure is not limited thereto. In a plan view, the first to third pixel regions PXA-R, PXA-G, and PXA-B may each have a different polygonal shape (including a substantially polygonal shape) such as a rhombic shape or a pentagonal shape. In an embodiment, the first to third pixel regions PXA-R, PXA-G, and PXA-B may have a rectangular shape (a substantially rectangular shape) having round corner regions in a plan view.

FIG. 2 schematically illustrates that the second pixel region PXA-G is disposed in a first row and the first pixel region PXA-R and the third pixel region PXA-B are disposed in a second row, but the disclosure is not limited thereto, and the arrangement of the first to third pixel regions PXA-R, PXA-G, and PXA-B may be variously changed. For example, the first to third pixel regions PXA-R, PXA-G, PXA-B may be disposed on a same row.

One of the first to third pixel regions PXA-R, PXA-G, and PXA-B may provide red light, another one of the first to third pixel regions PXA-R, PXA-G, and PXA-B may provide green light, and the other of the first to third pixel regions PXA-R, PXA-G, and PXA-B may provide blue light. In an embodiment, the first pixel region PXA-R may provide red light, the second pixel region PXA-G may provide green light, and the third pixel region PXA-B may provide blue light.

The first pixel region PXA-R may emit light having a light emission wavelength in a range of about 620 nm to about 700 nm, the second pixel region PXA-G may emit light having a light emission wavelength in a range of about 520 nm to about 600 nm, and the third pixel region PXA-B may emit light having a light emission wavelength in a range of about 410 nm to about 480 nm. The first pixel region PXA-R may be referred to as a red pixel region, the second pixel region PXA-G may be referred to as a green pixel region, and the third pixel region PXA-B may be referred to as a blue pixel region.

In the display region DA (see FIG. 1A), the bank well region BWA may be defined. The bank well region BWA may be a region in which a bank well is formed to prevent defects caused by erroneous adhesion during a process of patterning multiple light control units CCP-R, CCP-G, and CCP-B (see FIG. 4A) which are included in a light control layer CCL (see FIG. 4A). For example, the bank well region BWA may be a region in which a bank well formed by removing a portion of the bank BMP (see FIG. 4A) is defined.

FIG. 2. schematically illustrates that two bank well regions BWA are defined adjacent to the second pixel region PXA-G, but the disclosure is not limited thereto, and the shape and disposition of the bank well region BWA may be variously changed.

Figure 3:
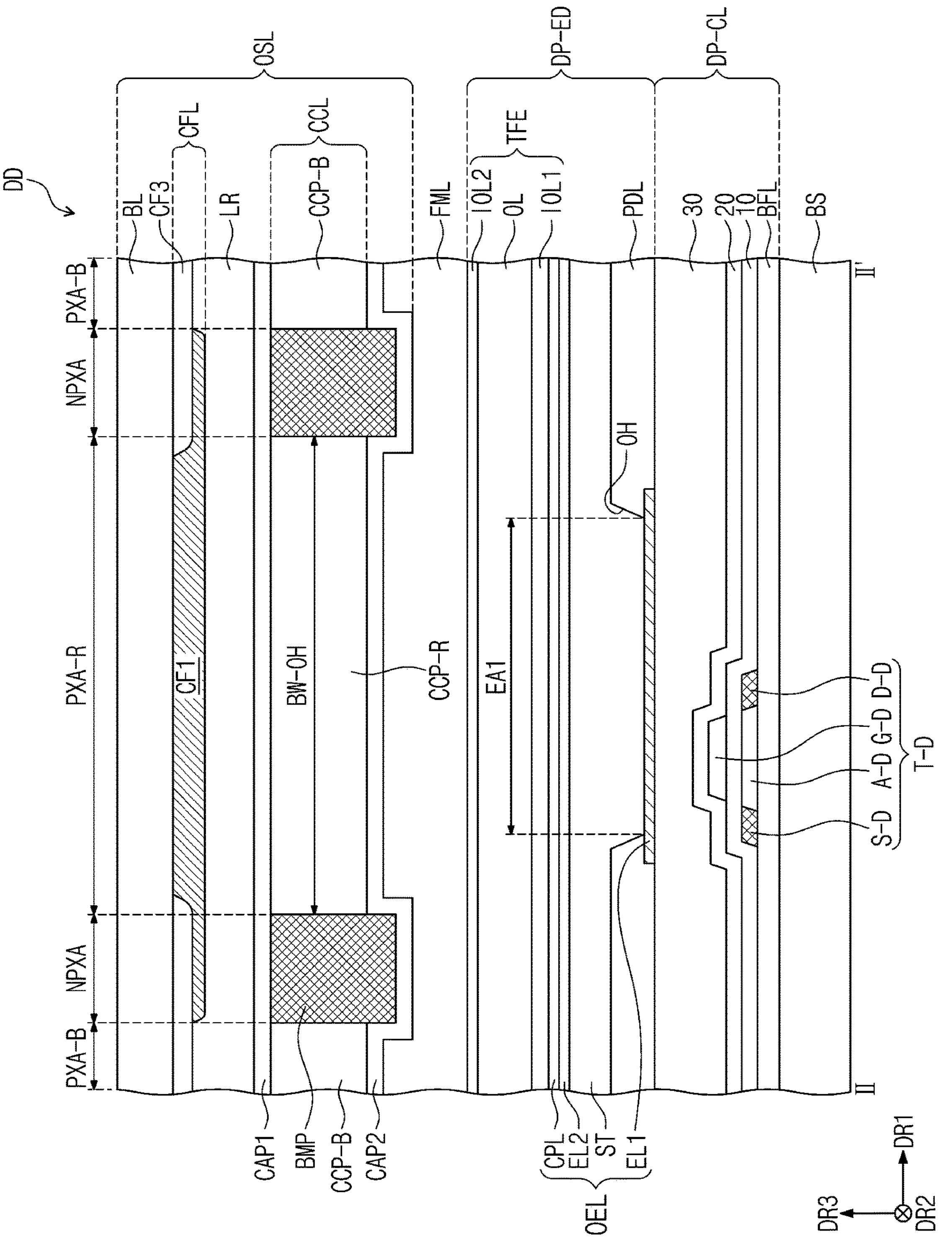
FIG. 3 is a schematic cross-sectional view of a portion of a display device according to an embodiment of the disclosure.
Figure 4A:
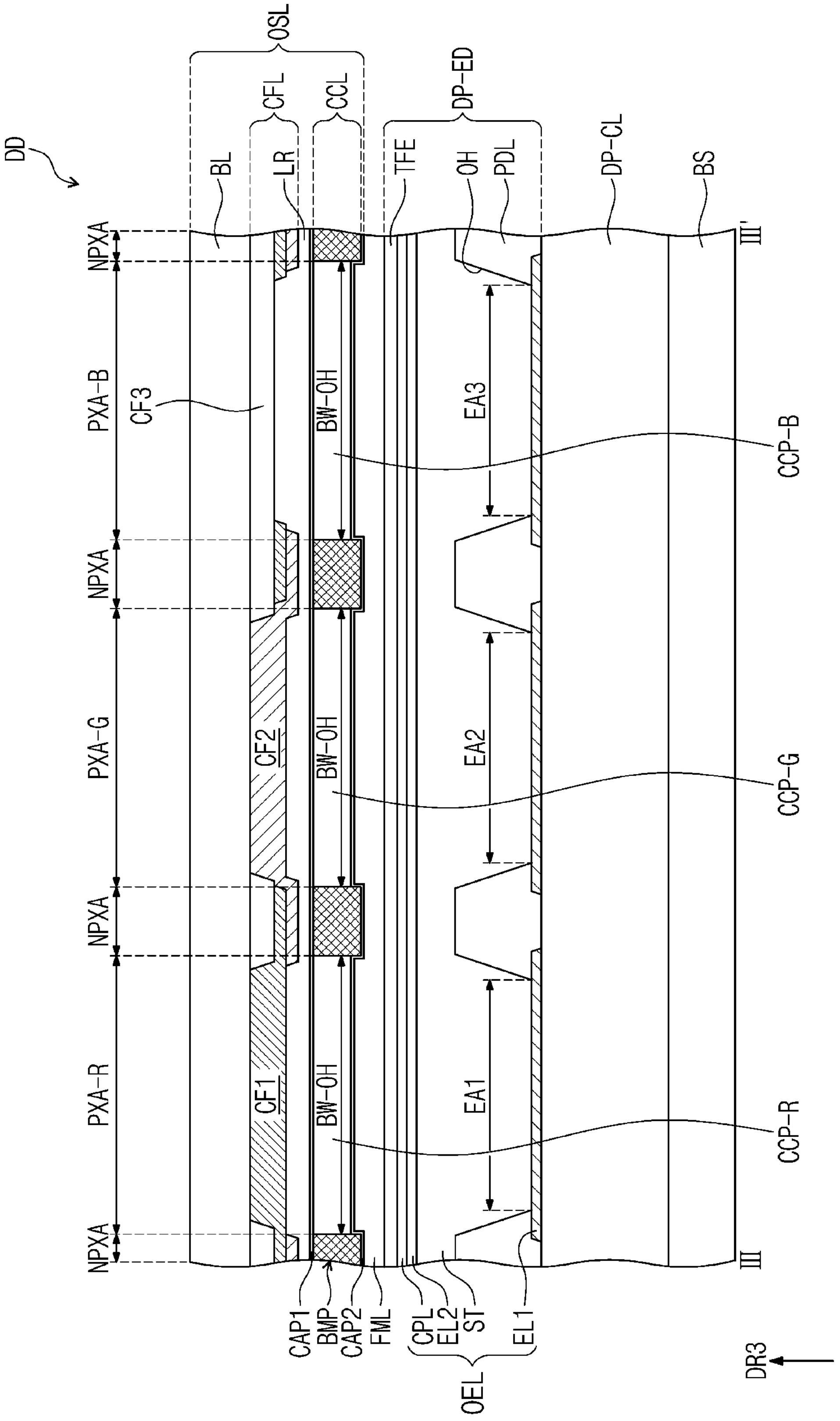
FIG. 4A is a schematic cross-sectional view of a portion of a display device according to an embodiment of the disclosure.

FIG. 3 is a schematic cross-sectional view of a portion of a display device according to an embodiment of the disclosure. FIG. 4A is a schematic cross-sectional view illustrating a partial region of a display device according to an embodiment of the disclosure. FIG. 3 may correspond to line II-II' of FIG. 2, and FIG. 4A may correspond to line III-III' of FIG. 2.

Referring to FIG. 3 and FIG. 4A, and the like, the display device DD of an embodiment may include the base layer BS, the circuit layer DP-CL disposed on the base layer BS, and the display layer DP-ED disposed on the circuit layer DP-CL. In the specification, a stacked structure including the base layer BS, the circuit layer DP-CL, and the display layer DP-ED may be referred to as a lower panel. Unlike FIG. 3, FIG. 4A briefly illustrates the configuration of the circuit layer DP-CL and the configuration of an encapsulation layer TFE, and shows a portion of the display device in multiple pixel regions.

The base layer BS may be a member which provides a base surface on which components included in the circuit layer DP-CL are disposed. In an embodiment, the base layer BS may be a glass substrate, a metal substrate, a polymer substrate, or the like. However, the disclosure is not limited thereto, and the base layer BS may be an inorganic layer, a functional layer, or a composite material layer.

The base layer BS may have a multi-layered structure. For example, the base layer BS may have a three-layered structure of a polymer resin layer, an adhesive layer, and a polymer resin layer. For example, the polymer resin layer may include a polyimide-based resin. For example, the polymer resin layer may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perylene-based resin. In the specification, an "α-based" resin means that a functional group of the "α" is included.

The circuit layer DP-CL may be disposed on the base layer BS. The circuit layer DP-CL may include a transistor T-D as a circuit element. The configuration of the circuit layer DP-CL may vary according to the design of a driving circuit of the pixel PX (see FIG. 1A), and in FIG. 3, one transistor T-D is illustrated, and the arrangement of an active A-D, a source S-D, a drain D-D, and a gate G-D constituting the transistor T-D is schematically illustrated. The active A-D, the source S-D, and the drain D-D may be regions distinguished according to the doping concentration or conductivity of a semiconductor pattern.

The circuit layer DP-CL may include a buffer layer BFL, a first insulation layer 10, a second insulation layer 20, a third insulation layer 30, and the like which are disposed on the base layer BS. For example, the buffer layer BFL, the first insulation layer 10, and the second insulation layer 20 may be inorganic layers, and the third insulation layer 30 may be an organic layer.

The display layer DP-ED may include a light emitting element OEL as a display element. The light emitting element OEL may generate source light. In an embodiment, the source light may be white light or blue light. In an embodiment, the display layer DP-ED may include an organic light emitting diode as the light emitting element OEL. For example, light emitting layers EML-1, EML-2, EML-3, and EML-4 (see FIG. 5) included in the light emitting element OEL may each include an organic light emitting material as a light emitting material.

The light emitting element OEL may include a first electrode EL1, a second electrode EL2 facing the first electrode EL1, and a light emitting stack ST disposed between the first electrode EL1 and the second electrode EL2. The light emitting stack ST may include multiple light emitting structures EU-1, EU-2, EU-3, and EU-4 (see FIG. 5). In an embodiment, the light emitting stack ST may include three or more light emitting structures separated from each other and stacked in the thickness direction. The light emitting stack ST may include multiple blue light emitting structures which emit blue light, and at least one green light emitting structure which emits green light.

Figure 5:
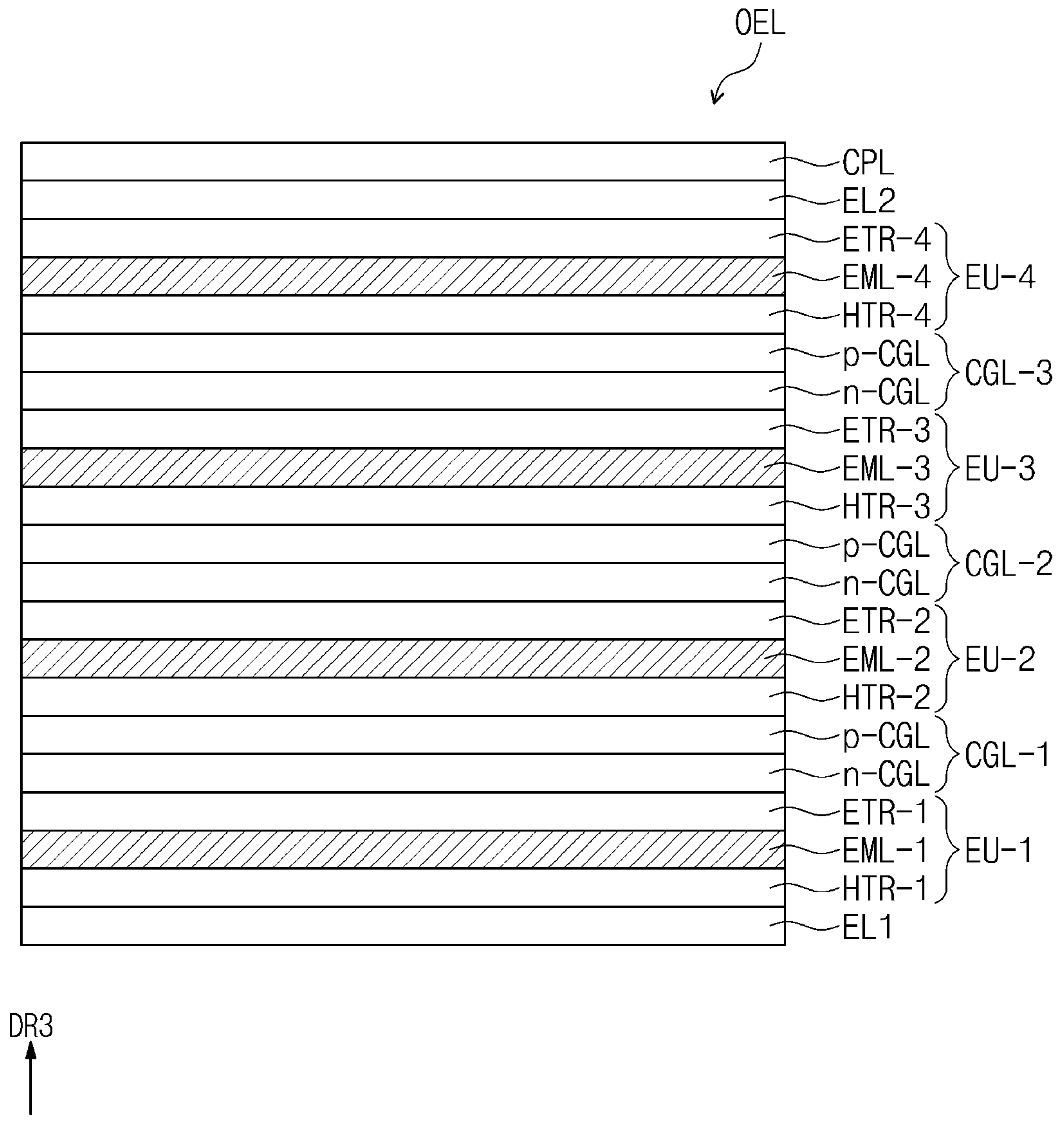
FIG. 5 is a schematic cross-sectional view of a light emitting element of an embodiment of the disclosure.

The light emitting stack ST may include charge generating layers CGL-1, CGL-2, CGL-3, and CGL-3 (see FIG. 5) disposed between the light emitting structures EU-1, EU-2, EU-3, and EU-4 (see FIG. 5). Light emitting structures and charge generating layers included in the light emitting element OEL will be described in more detail below. The light emitting element OEL may further include a capping layer CPL disposed in an upper portion of the second electrode EL2.

The first electrode EL1 may be disposed on the third insulating layer 30. The first electrode EL1 may be directly or indirectly connected to the transistor T-D, and in FIG. 3, the connection structure between the first electrode EL1 and the transistor T-D is not shown. The first electrode EL1 may be an anode or a cathode. The first electrode EL1 may be a pixel electrode. The first electrode EL1 may be a transmissive electrode, a transflective electrode, or a reflective electrode.

The display layer DP-ED may include the pixel definition layer PDL. For example, the pixel definition layer PDL may be an organic layer. On the pixel definition layer PDL, a light emitting opening OH may be defined. The light emitting opening OH of the pixel definition layer PDL may expose at least a portion of the first electrode EL1. In an embodiment, light emitting regions EA1, EA2, and EA3 may be defined by the light emitting opening OH.

The display layer DP-ED may include a first light emitting region EA1, a second light emitting region EA2, and a third light emitting region EA3. The first light emitting region EA1, the second light emitting region EA2, and the third light emitting region EA3 may be regions separated by the pixel definition layer PDL. The first light emitting region EA1, the second light emitting region EA2, and the third light emitting region EA3 may respectively correspond to the first pixel region PXA-R, the second pixel region PXA-G, and the third pixel region PXA-B.

The light emitting regions EA1, EA2, and EA3 may overlap the pixel regions PXA-R, PXA-G, and PXA-B, and may not overlap the bank well region BWA in a plan view. In a plan view, the area of the pixel regions PXA-R, PXA-G, and PXA-B separated by the bank BMP may be greater than the area of the light emitting region EA1, EA2, and EA3 separated by the pixel definition layer PDL.

The light emitting stack ST may be disposed overlapping the pixel regions PXA-R, PXA-G, and PXA-B in a plan view. In an embodiment, the light emitting stack ST may be commonly disposed in the pixel regions PXA-R, PXA-G, and PXA-B. Each of the light emitting structures EU-1, EU-2, EU-3, and EU-4 (see FIG. 5) included in the light emitting stack ST may be commonly disposed throughout the pixel regions PXA-R, PXA-G, and PXA-B.

However, the disclosure is not limited thereto. At least one of the light emitting structures EU-1, EU-2, EU-3, and EU-4 (see FIG. 5) may be separated and formed in each of the first to third pixel regions PXA-R, PXA-G, and PXA-B. In an embodiment, at least one of the light emitting structures EU-1, EU-2, EU-3, and EU-4 (see FIG. 5) may be patterned in the light emitting opening OH, and separated and formed in each of the first to third pixel regions PXA-R, PXA-G, and PXA-B.

The second electrode EL2 may be disposed facing the first electrode EL1 with the light emitting stack ST interposed between the first electrode EL1 and the second electrode EL2. The second electrode EL2 may be a common electrode. The second electrode EL2 may be a cathode or an anode, but the disclosure is not limited thereto. For example, in case that the first electrode EL1 is an anode, the second electrode EL2 may be a cathode, and in case that the first electrode EL1 is a cathode, the second electrode EL2 may be an anode. The second electrode EL2 may be a transmissive electrode, a transflective electrode, or a reflective electrode.

The display layer DP-ED may include the encapsulation layer TFE which protects the light emitting element OEL. The encapsulation layer TFE may include an organic material or an inorganic material. The encapsulation layer TFE may have a multi-layered structure in which an inorganic layer/an organic layer are repeated. In an embodiment, the encapsulation layer TFE may include a first inorganic layer IOL1, an organic layer OL, and a second inorganic layer IOL2 which are sequentially stacked. However, layers constituting the encapsulation layer TFE are not limited thereto. The encapsulation layer TFE may be directly provided on the light emitting element OEL in a continuous process.

The first and second inorganic layers IOL1 and IOL2 may protect the light emitting element OEL from moisture and oxygen, and the organic layer OL may protect the light emitting element OEL from foreign substances such as dust particles. For example, the organic layer OL may prevent imprint defects of the light emitting element OEL caused by foreign substances introduced during a manufacturing process. Although not illustrated, the display device DD may further include a refractive index control layer disposed on an upper side of the encapsulation layer TFE for improving light emission efficiency.

The inorganic layers IOL1 and IOL2 may include at least one of silicon nitride, silicon oxynitride, silicon oxide, titanium oxide, and aluminum oxide. The organic layer OL may include an acrylic organic material. However, the types of materials constituting the inorganic layers IOL1 and IOL2 and the organic layer OL are not limited thereto.

As illustrated in FIG. 3 and FIG. 4A, the optical layer OSL may be disposed on the encapsulation layer TFE. The optical layer OSL may include the light control layer CCL. In an embodiment, the light control layer CCL may include quantum dots. The optical layer OSL may include, in addition to the light control layer CCL, a low refractive layer LR, a color filter layer CFL, and a base substrate BL. In the specification, the optical layer OSL may be referred to as an upper panel.

The light control layer CCL may be disposed on the display layer DP-ED including the light emitting element OEL. The light control layer CCL may include the bank BMP and light control units CCP-R, CCP-G, and CCP-B.

The bank BMP may include a base resin and an additive. The base resin may be formed of various resin compositions which may be commonly referred to as a binder. The additive may include a coupling agent and/or a photo initiator. The additive may further include a dispersant.

The bank BMP may include a black coloring agent for blocking light. The bank BMP may include a black dye or a black pigment mixed in the base resin. In an embodiment, the black coloring agent may include carbon black, or may include a metal such as chromium or an oxide thereof.

The bank BMP may include a bank opening BW-OH corresponding to the light emitting opening OH. In a plan view, the bank opening BW-OH may overlap the light emitting opening OH, and may have an area greater than an area of the light emitting opening OH. For example, the bank opening BW-OH may have a large area compared to the light emitting regions EA1, EA2, and EA3 defined by the light emitting opening OH. In the specification, "corresponding to" means that the two components overlap when viewed in the third direction DR3, which is the thickness direction of the display device DD, and is not limited to having the same area.

The light control units CCP-R, CCP-G, and CCP-B may be disposed on the inner side of the bank opening BW-OH. At least some of the light control units CCP-R, CCP-G, and CCP-B may change the optical properties of the source light. In an embodiment, at least some of the light control units CCP-R, CCP-G, and CCP-B may include quantum dots which change the optical properties of the source light.

In an embodiment, a first light control unit CCP-R may include a quantum dot for changing the optical properties of the source light. The quantum dot included in the first light control unit CCP-R may convert the source light into light of a different wavelength. For example, in the first light control unit CCP-R overlapping the first pixel region PXA-R, the quantum dot may convert the source light into red light.

In the specification, a quantum dot may be a crystal of a semiconductor compound. A quantum dot may emit light of various light emission wavelengths according to the size of a crystal. A quantum dot may emit light of various light emission wavelengths by adjusting an element ratio in the quantum dot compound.

The diameter of a quantum dot may be, for example, in a range of about 1 nm to about 10 nm. A quantum dot may be synthesized by a wet chemical process, an organo metal chemical deposition process, a molecular beam epitaxy process, or a process similar thereto.

Among manufacturing processes of quantum dots, the wet chemical process is a method of mixing an organic solvent and a precursor material, and growing a quantum dot particle crystal. When the quantum dot particle crystal is growing, the organic solvent naturally serves as a dispersant coordinated on the surface of the quantum dot crystal, and may control the growth of the particle crystal. Therefore, the wet chemical process may be more readily performed than a vapor deposition method such as Metal Organic Chemical Vapor Deposition (MOCVD) or Molecular Beam Epitaxy (MBE), and may control the growth of quantum dot particles through a low-cost process.

A core of a quantum dot may include at least one of a Group II-VI compound, a Group III-V compound, a Group III-VI compound, a Group I-III-VI compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The Group II-VI compound may further include a Group I metal and/or a Group IV element. The Group I-II-VI compound may be selected from CuSnS and CuZnS, and the Group II-IV-VI compound may be selected from ZnSnS and the like. The Group I-II-IV-VI compound may be selected from a quaternary compound selected from the group consisting of $Cu_2ZnSnS_2$, $Cu_2ZnSnS_4$, $Cu_2ZnSnSe_4$, $Ag_2ZnSnS_2$, and a mixture thereof.

The Group III-VI compound may include a binary compound such as $In_2S_3$, $In_2Se_3$, and the like, a ternary compound such as $InGaS_3$, $InGaSe_3$, and the like, or a combination thereof.

The Group I-III-VI compound may be selected from a ternary compound selected from the group consisting of AgInS, $AgInS_2$, CuInS, $CuInS_2$, $AgGaS_2$, $CuGaS_2$ $CuGaO_2$, $AgGaO_2$, $AgAlO_2$, and a mixture thereof, and a quaternary compound such as $AgInGaS_2$, $CuInGaS_2$, and the like.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compound may further include a Group II metal. For example, InZnP or the like may be selected as the Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof.

An example of the Group II-IV-V semiconductor compound may be a ternary compound selected from the group consisting of ZnSnP, $ZnSnP_2$, $ZnSnAs_2$, $ZnGeP_2$, $ZnGeAs_2$, $CdSnP_2$, and $CdGeP_2$, and a mixture thereof.

The Group IV element may be selected from the group consisting of Si, Ge, and a mixture thereof. The Group IV compound may be a binary compound selected from the group consisting of SiC, SiGe, and a mixture thereof.

Each element included in a multi-element compound such as the binary compound, the ternary compound, and the quaternary compound, may be present in a particle at a uniform concentration or non-uniform concentration. For example, the representation of a formula representing a quantum dot indicates the type of elements included in a quantum dot compound, and the element ratio in the compound may vary. For example, $AgInGaS_2$ may mean $AgIn_xGa_{1-x}S_2$ (wherein x is a real number between 0 and 1).

A binary compound, a ternary compound, or a quaternary compound may be present in a particle at a uniform concentration, or may be present in the same particle with a partially different concentration distribution. The binary compound, the ternary compound, or the quaternary compound may have a core/shell structure in which one quantum dot surrounds another quantum dot. In the core/shell structure, the binary compound, the ternary compound, or the quaternary compound may have a concentration gradient in which the concentration of an element present in the shell becomes lower toward the center.

In embodiments, a quantum dot may have the above core-shell structure including a core having a nano-crystal and a shell surrounding the core. The shell of the quantum dot may serve as a protection layer to prevent the chemical deformation of the core so as to maintain semiconductor properties, and/or a charging layer to impart electrophoresis properties to the quantum dot. The shell may be a monolayer or a multi-layer. An example of the shell of a quantum dot may be a metal or non-metal oxide, a semiconductor compound, or a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$, but the disclosure is not limited thereto.

The semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, but the disclosure is not limited thereto.

A quantum dot may have a full width of half maximum (FWHM) of a light emission wavelength spectrum less than or equal to about 45 nm. For example, a quantum dot may have a full width of half maximum (FWHM) of a light emission wavelength spectrum less than or equal to about 40 nm. For example, a quantum dot may have a full width of half maximum (FWHM) of a light emission wavelength spectrum less than or equal to about 30 nm. Color purity or color reproducibility may be improved in the above range. Light emitted through such a quantum dot may be emitted in all directions, so that a wide viewing angle may be improved.

Although the form of a quantum dot is not particularly limited as long as it is a form commonly used in the art, a quantum dot in the form of, for example, spherical, pyramidal, multi-arm, or cubic nanoparticles, nanotubes, nanowires, nanofibers, nanoplate particles, and the like may be used.

A quantum dot may adjust an energy band gap by adjusting the size of the quantum dot or adjusting an element ratio in a quantum dot compound, so that light of various wavelength bands may be obtained from a quantum dot light emitting layer. Therefore, a light emitting element which emits light of various wavelengths may be implemented by using a quantum dot as described above (using quantum dots of different sizes from each other or having different element ratios in a quantum dot compound). For example, the adjustment of the size of a quantum dot or the element ratio in a quantum dot compound may be selected to emit red, green, and/or blue light. Quantum dots may be configured to emit white light by combining light of various colors.

In an embodiment, a quantum dot included in the first light control unit CCP-R overlapping the first pixel region PXA-R may emit red light. The smaller the particle size of a quantum dot, the shorter the wavelength region of light may be emitted. For example, in quantum dots having the same core, the particle size of a quantum dot which emits green light may be smaller than the particle size of a quantum dot which emits red light. In quantum dots having the same core, the particle size of a quantum dot which emits blue light may be smaller than the particle size of a quantum dot which emits green light. However, the disclosure is not limited thereto, and even in quantum dots having the same core, the size of a particle may be controlled according to materials for forming a shell, the thickness of the shell, and the like.

In case that a quantum dot has various light emitting colors such as blue, red, and green, quantum dots having different light emission colors may have different core materials.

The light control units CCP-R, CCP-G, and CCP-B of the light control layer CCL may include a scatterer. The first light control unit CCP-R may include a quantum dot which converts the source light into red light, and a scatterer which scatters light.

The scatterer may be an inorganic particle. For example, the scatterer may include at least one of $TiO_2$, ZnO, $Al_2O_3$, $SiO_2$, and hollow silica. The scatterer may include at least one of $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica.

The first light control unit CCP-R may include a base resin which disperses a quantum dot and a scatterer. The base resin may be a medium in which a quantum dot and a scatterer are dispersed, and may be composed of various resin compositions which may be commonly referred to as a binder. For example, the base resin may be an acrylic resin, a urethane-based resin, a silicon-based resin, an epoxy-based resin, or the like. The base resin may be a transparent resin.

In an embodiment, the first light control unit CCP-R may be formed by an inkjet printing process. A liquid ink composition may be provided inside the bank opening BW-OH, and polymerization and curing reactions may be performed by a thermal-curing process or photo-curing process to form the first light control unit CCP-R from the ink composition.

A part of the description of the first light control unit CCP-R may be equally applied to a second light control unit CCP-G and a third light control unit CCP-B.

Referring to FIG. 4A, the light control layer CCL may include the light control units CCP-R, CCP-G, and CCP-B different from each other. The light control units CCP-R, CCP-G, and CCP-B may be spaced apart from each other. The light control units CCP-R, CCP-G, and CCP-B may be spaced apart from each other by the bank BMP. The light control units CCP-R, CCP-G, and CCP-B may be respectively disposed inside the bank openings BW-OH defined in the bank BMP. However, the disclosure is not limited thereto.

In FIG. 4A, the bank BMP is illustrated as having a rectangular shape in a cross-sectional view, and not overlapping the light control units CCP-R, CCP-G, and CCP-B, but edges of the light control units CCP-R, CCP-G, and CCP-B may at least partially overlap the bank BMP. The bank BMP may have a trapezoidal shape in a cross-sectional view. The bank BMP may have a shape in which the width in a cross-sectional view increases as it is adjacent to the display layer DP-ED.

The second light control unit CCP-G and the third light control unit CCP-B may also be formed by an inkjet printing process. Liquid ink compositions respectively forming the second light control unit CCP-G and the third light control unit CCP-B may be provided inside the bank opening BW-OH, and polymerization and curing reactions may be performed by a thermal-curing process or photo-curing process to form the second light control unit CCP-G and the third light control unit CCP-B from the ink compositions.

In an embodiment, the second light control unit CCP-G may include a quantum dot for changing the optical properties of the source light. The quantum dot included in the second light control unit CCP-G may convert the source light into light of a different wavelength. For example, in the second light control unit CCP-G overlapping the second pixel region PXA-G in a plan view, the quantum dot may convert the source light into green light.

The third light control unit CCP-B overlapping the third pixel region PXA-B may not include a quantum dot. However, the disclosure is not limited thereto, and the third light control unit CCP-B may include a quantum dot which converts the wavelength of a portion of the source light provided from the light emitting element OEL.

The second light control unit CCP-G and the third light control unit CCP-B may also include a scatterer. For example, in an embodiment, the first light control unit CCP-R may include a first quantum dot and a scatterer, the second light control unit CCP-G may include a second quantum dot and a scatterer, and the third light control unit CCP-B may not include a quantum dot, but may include a scatterer.

Each of the second light control unit CCP-G and the third light control unit CCP-B may also further include a base resin which disperses a quantum dot and a scatterer. The same contents as those described with reference to the first light control unit CCP-R may be applied to the scatterer and the base resin.

The optical layer OSL may include a first barrier layer CAP1. The first barrier layer CAP1 may serve to prevent the penetration of moisture and/or oxygen (hereinafter, referred to as 'moisture/oxygen'), and improve the optical properties of the optical layer OSL by adjusting a refractive index. The first barrier layer CAP1 may be disposed on an upper portion or lower portion of the light control layer CCL. The first barrier layer CAP1 may be disposed on an upper surface or a lower surface of the light control units CCP-R, CCP-G, and CCP-B to block the light control units CCP-R, CCP-G, and CCP-B from being exposed to moisture/oxygen, and particularly, block quantum dots included in the light control units CCP-R, CCP-G, and CCP-B from being exposed to moisture/oxygen. The first barrier layer CAP1 may also protect the light control units CCP-R, CCP-G, and CCP-B from external impacts.

In an embodiment, the first barrier layer CAP1 may be spaced apart from the display layer DP-ED with the light control units CCP-R, CCP-G, and CCP-B interposed between the first barrier layer CAP1 and the display layer DP-ED. For example, the first barrier layer CAP1 may be disposed on an upper surface of the light control units CCP-R, CCP-G, and CCP-B. In an embodiment, the optical layer OSL may further include a second barrier layer CAP2 disposed between the light control layer CCL and the display layer DP-ED. In an embodiment, the first barrier layer CAP1 may cover the upper surface of the light control units CCP-R, CCP-G, and CCP-B adjacent to the low refractive layer LR, and the second barrier layer CAP2 may cover a lower surface of the light control units CCP-R, CCP-G, and CCP-B adjacent to the display layer DP-ED. In the specification, the "upper surface" may be a surface positioned at an upper portion with respect to the third direction DR3, and the "lower surface" may be a surface positioned at a lower portion with respect to the third direction DR3.

The first barrier layer CAP1 and the second barrier layer CAP2 may cover a surface of not only the light control units CCP-R, CCP-G, CCP-B, but also the bank BMP.

The first barrier layer CAP1 may cover a surface of the bank BMP and the light control units CCP-R, CCP-G, and CCP-B, which are adjacent to the low refractive layer LR. The first barrier layer CAP1 may be disposed (e.g., directly disposed) on a lower portion of the low refractive layer LR. The second barrier layer CAP2 may be disposed following steps of the bank BMP and the light control units CCP-R, CCP-G, and CCP-B. The second barrier layer CAP2 may be disposed (e.g., directly disposed) on an upper portion of a filling layer FML.

The first barrier layer CAP1 and the second barrier layer CAP2 may include an inorganic material. In an embodiment, the first barrier layer CAP1 may include silicon oxynitride (SiON). Both the first barrier layer CAP1 and the second barrier layer CAP2 may include silicon oxynitride. However, the disclosure is not limited thereto, and the first barrier layer CAP1 may include silicon oxynitride, and the second barrier layer CAP2 may include silicon oxide ($SiO_x$).

The optical layer OSL may further include a color filter layer CFL disposed on the light control layer CCL. The color filter layer CFL may include at least one color filter CF1, CF2, or CF3. A color filter may transmit light of a specific wavelength range, and block light outside the corresponding wavelength range. In an embodiment, a first color filter CF1 may be a red filter, a second color filter CF2 may be a green filter, and a third color filter CF3 may be a blue filter.

Each of the color filters CF1, CF2, and CF3 may include a polymer photosensitive resin and a colorant. The colorant may include a pigment or a dye. The first color filter CF1 may include a red pigment or a red dye, the second color filter CF2 may include a green pigment or a green dye, and the third color filter CF3 may include a blue pigment or a blue dye. In an embodiment, the third color filter CF3 may not include a pigment or a dye.

Each of the first to third color filters CF1, CF2, and CF3 may be disposed corresponding to each of the first pixel region PXA-R, the second pixel region PXA-G, and the third pixel region PXA-B. Each of the first to third color filters CF1, CF2, and CF3 may overlap each of the first to third light control units CCP-R, CCP-G, and CCP-B in a plan view, respectively.

Referring to FIG. 4A, corresponding to the peripheral region NPXA, the color filters CF1, CF2, and CF3 which transmit different light from each other may overlap with each other in a plan view. In response to the peripheral region NPXA, corresponding to the peripheral region NPXA, the color filters CF1, CF2, and CF3 may overlap in the third direction DR3, which is the thickness direction, to distinguish the boundary between the pixel regions PXA-R, PXA-G, and PXA-B. Unlike what is illustrated, the color filter layer CFL may include a light blocking portion (not shown) to distinguish the boundary between adjacent color filters CF1, CF2, and CF3. The light blocking portion (not shown) may be formed of a blue filter, or may be formed by including an organic light blocking material or an inorganic light blocking material containing a black pigment or a black dye.

Referring to FIG. 3 and FIG. 4A, the optical layer OSL may further include the low refractive layer LR. The low refractive layer LR may be disposed between the light control layer CCL and the color filter layer CFL. The low refractive layer LR may be disposed on an upper portion of the light control layer CCL to block the light control units CCP-R, CCP-G, and CCP-B from being exposed to moisture/oxygen. The low refractive layer LR may be disposed between the light control units CCP-R, CCP-G, and CCP-B and the color filters CF1, CF2, and CF3 to increase light extraction efficiency, or to perform a function of an optical functional layer, which is to prevent reflected light from entering the light control layer CCL, or the like. The low refractive layer LR may be a layer having a relatively lower refractive index compared to an adjacent layer.

The low refractive layer LR may include at least one inorganic layer. For example, the low refractive layer LR may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, a thin metal film having light transmittance, or the like. However, the disclosure is not limited thereto, and the low refractive layer LR may include an organic film. The low refractive layer LR may have, for example, a structure in which multiple hollow particles are dispersed in an organic polymer resin. The low refractive layer LR may be composed of a single layer or multiple layers.

In an embodiment, the display device DD may further include the base substrate BL disposed on the color filter layer CFL. The base substrate BL may be a member which provides a base surface on which the color filter layer CFL, the low refractive layer LR, the light control layer CCL, and the like are disposed. The base substrate BL may be a glass substrate, a metal substrate, a plastic substrate, or the like. However, the disclosure is not limited thereto, and the base substrate BL may be an inorganic layer, an organic layer, or a composite material layer. Unlike what is illustrated, the base substrate BL may be omitted in an embodiment.

Although not illustrated, an anti-reflection layer may be disposed on the base substrate BL. The anti-reflection layer may be a layer which reduces the reflectance of external light entering from the outside. The anti-reflection layer may be a layer which selectively transmits light emitted from the display device DD. In an embodiment, the anti-reflection layer may be a single layer including a dye and/or a pigment dispersed in a base resin. The anti-reflection layer may be provided as one continuous layer entirely overlapping the first to third pixel regions PXA-R, PXA-G, and PXA-B in a plan view.

The anti-reflection layer may not include a polarizing layer. Accordingly, light passing through the anti-reflection layer and entering to the display layer DP-ED may be unpolarized light. The display layer DP-ED may receive unpolarized light from the anti-reflection layer.

The display device DD of an embodiment may include a lower panel including the display layer DP-ED, and an upper panel (the optical layer, OSL) including the light control layer CCL and the color filter layer CFL, and in an embodiment, the filling layer FML may be disposed between the lower panel and the upper panel. In an embodiment, the filling layer FML may fill between the display layer DP-ED and the optical layer OSL. The filling layer FML may be disposed (e.g., directly disposed) on the encapsulation layer TFE, and the second barrier layer CAP2 may be disposed (e.g., directly disposed on) the filling layer FML. A lower surface of the filling layer FML may contact an upper surface of the encapsulation layer TFE, and an upper surface of the filling layer FML may contact a lower surface of the second barrier layer CAP2.

The filling layer FML may serve as a buffer between the display layer DP-ED of the lower panel and the light control layer CCL of the upper panel. In an embodiment, the filling layer FML may perform a shock absorption function and the like, and may increase the strength of the display device DD. The filling layer FML may be formed from a filling resin including a polymer resin. For example, the filling layer FML may be formed from a filling layer resin including an acrylic resin, an epoxy-based resin, or the like.

The display device DD of an embodiment described with reference to FIG. 3 and FIG. 4A may further include a light emitting element described below. The display device DD of an embodiment may include multiple light emitting structures stacked, and include, among the light emitting structures, a green light emitting structure which includes a light emitting layer including a low refractive material, and thus, may have excellent light emission efficiency properties. For example, in a light emitting layer of at least one green light emitting structure among multiple light emitting structures included in the light emitting stack ST, a low refractive material may be included in a sub-light emitting layer adjacent to a hole transport region, and accordingly, the display device DD of an embodiment may have excellent light efficiency.

Figure 4B:
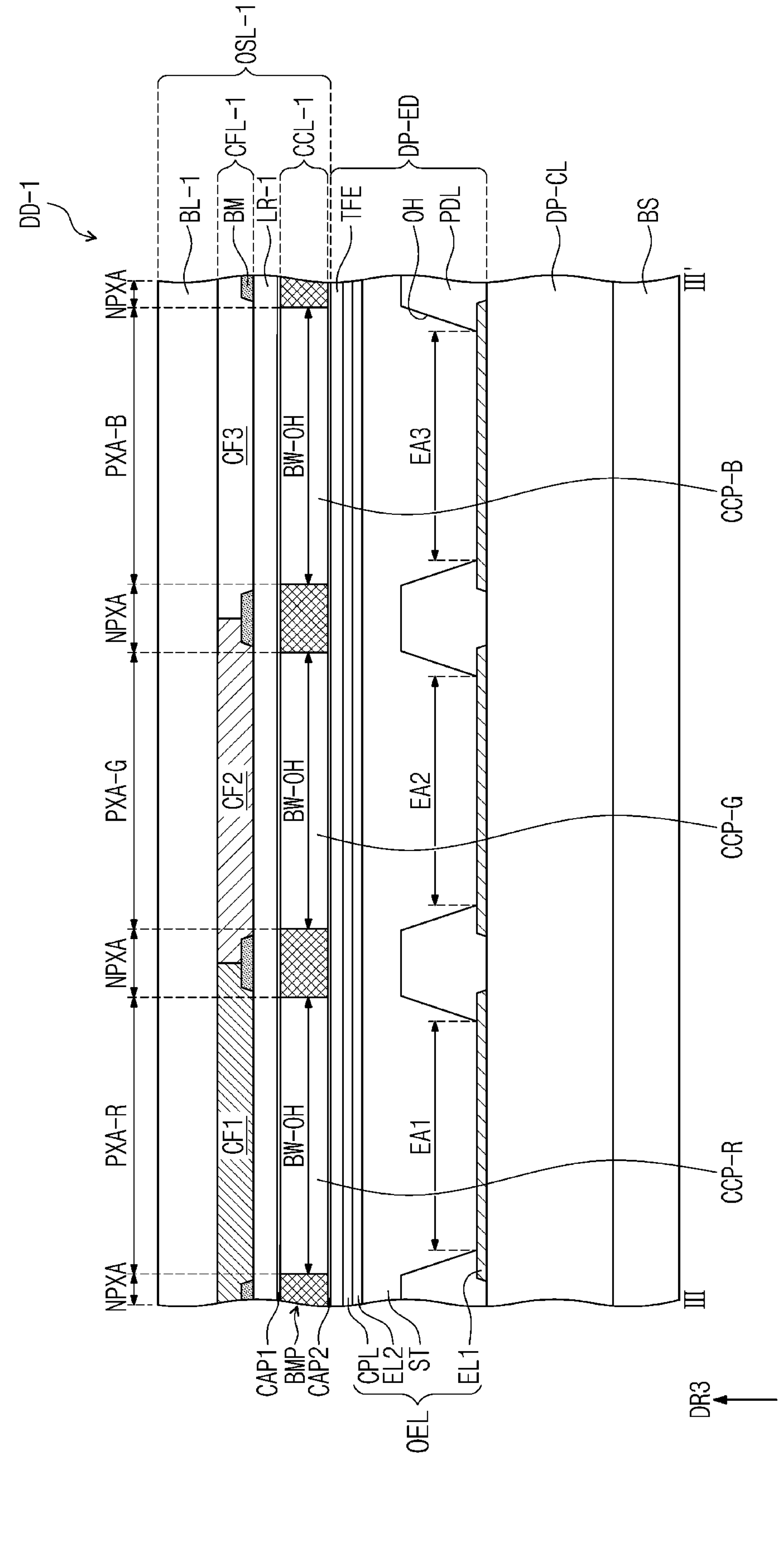
FIG. 4B is a schematic cross-sectional view of a portion of a display device according to an embodiment of the disclosure.
Figure 4C:
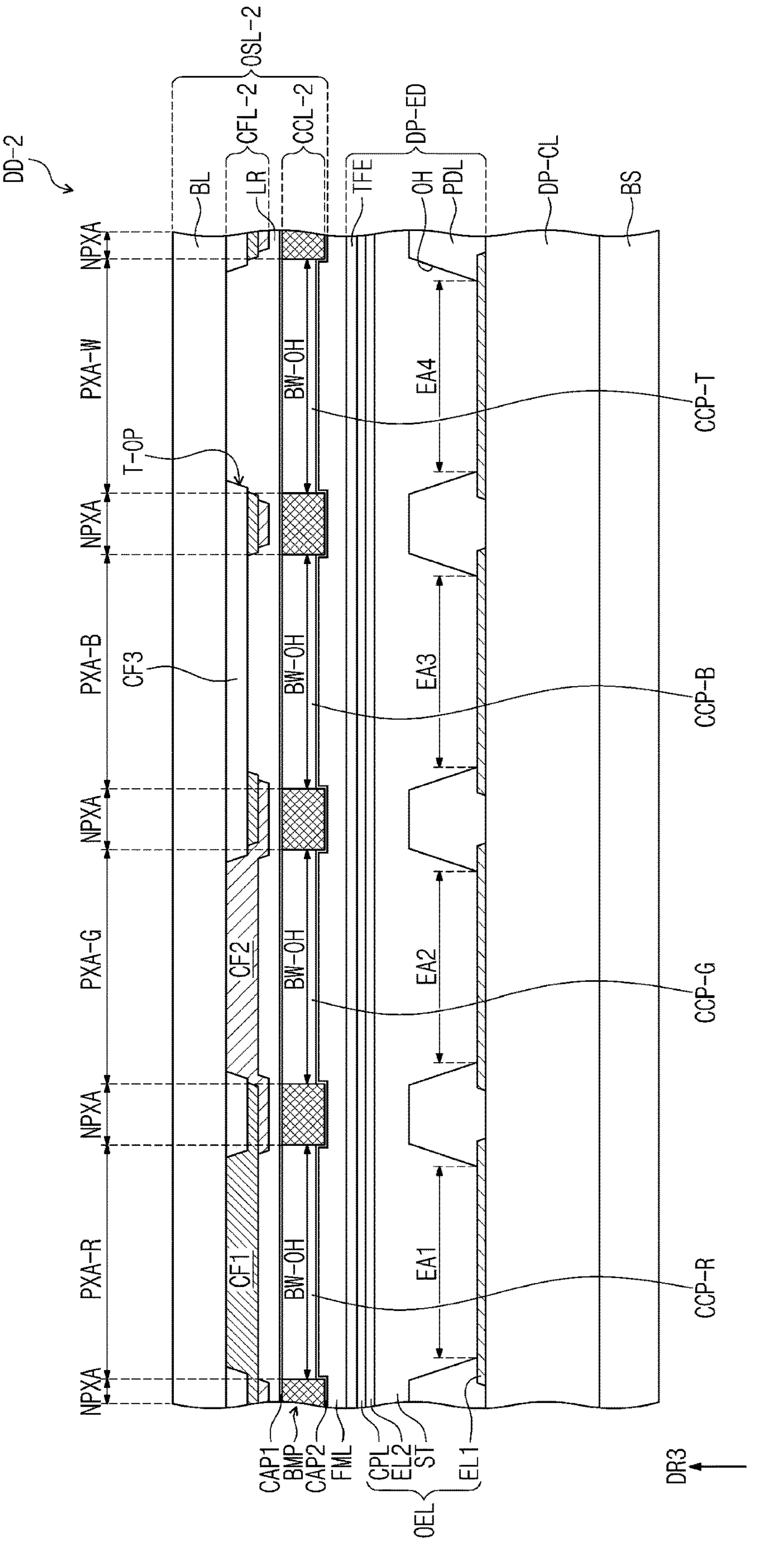
FIG. 4C is a schematic cross-sectional view of a portion of a display device according to an embodiment of the disclosure.

FIG. 4B and FIG. 4C are each a schematic cross-sectional view showing a portion of a display device according to an embodiment of the disclosure. The display device illustrated in FIG. 4B and FIG. 4C partially differs from the display device described with reference to FIGS. 3 and 4A in the configuration of the optical layer and the like. Hereinafter, in the description of the display device with reference to FIG. 4B and FIG. 4C, the contents described above with reference to FIG. 1 to FIG. 4A, and the like will not be described again, and instead, differences will be explained.

Referring to FIG. 4B, a display device DD-1 according to an embodiment may include a base layer BS, a circuit layer DP-CL disposed on the base layer BS, a lower panel including a display layer DP-ED disposed on the circuit layer DP-CL, and an optical layer OSL-1 disposed on the lower panel. In the display device DD-1 according to an embodiment, the optical layer OSL-1 may include a light control layer CCL-1, a low refractive layer LR-1, a color filter layer CFL-1, and a base substrate BL-1, which are sequentially stacked on an encapsulation layer TFE. The optical layer OSL-1 may include a first barrier layer CAP1 and a second barrier layer CAP2 which are respectively disposed on an upper surface and a lower surface of the light control layer CCL-1.

Compared to the display device DD illustrated in FIG. 4A, the display device DD-1 illustrated in FIG. 4B is an embodiment in which the optical layer OSL-1 is disposed by having an upper surface of the encapsulation layer TFE as a base surface. For example, light control units CCP-R, CCP-G, and CCP-B of the light control layer CCL-1 may be formed on the encapsulation layer TFE by a continuous process, and color filters CF1, CF2, and CF3 of the color filter layer CFL-1 may be sequentially formed on the light control layer CCL-1 through a continuous process. Compared to the embodiment illustrated in FIG. 4A, in the display device DD-1 illustrated in FIG. 4B, a filling layer FML (see FIG. 4A) may be omitted.

In an embodiment, the light control layer CCL-1 may have an upper surface of the second barrier layer CAP2 disposed on the encapsulation layer TFE as a base surface, and thus, may have a shape up-down inverted from the shape of the light control layer CCL illustrated in FIG. 4A. Specifically, each of multiple banks BMP and multiple light control units CCP-R, CCP-G, and CCP-B may have a shape up-down inverted from that illustrated in FIG. 4A. The color filter layer CFL-1 may have an upper surface of the light control layer CCL-1 as a base surface, and may have a shape different from the embodiment illustrated in FIG. 4A.

The color filter layer CFL-1 may include the color filters CF1, CF2, and CF3 and a light blocking portion BM. In the color filter layer CFL-1 of an embodiment, the light blocking portion BM may be a black matrix. The light blocking portion BM may include an organic light blocking material or an inorganic light blocking material containing a black pigment or a black dye. The light blocking portion BM may prevent a light leakage phenomenon, and may distinguish the boundary between adjacent color filters CF1, CF2, and CF3.

A display device DD-2 according to an embodiment illustrated in FIG. 4C differs from the display device DD illustrated in FIG. 4A in that a fourth pixel region PXA-W is further included in addition to the first to third pixel regions PXA-R, PXA-G, and PXA-B. The fourth pixel region PXA-W may be a white pixel region which emits white light.

In the display device DD-2 illustrated in FIG. 4C, a light emitting element OEL may generate white light, and the fourth pixel region PXA-W may be a region in which the light generated in the light emitting element OEL is not converted, but transmitted. FIG. 4C illustrates that the pixel regions PXA-R, PXA-G, PXA-G, and PXA-W have the same width in a direction, but the disclosure is not limited thereto, and the fourth pixel region PXA-W may have a size different from the size of each of other pixel regions PXA-R, PXA-B, and PXA-G. For example, the area of the fourth pixel region PXA-W may be different from the area of each of the first to third pixel regions PXA-R, PXA-G, and PXA-B in a plan view. The white light emitted from the fourth pixel region PXA-W may be a mixture of light of various wavelengths. The display layer DP-ED may include a fourth light emitting region EA4 corresponding to the fourth pixel region PXA-W.

A light control layer CCL-2 of the optical layer OSL-2 of the display device DD-2 according to an embodiment may further include a fourth light control unit CCP-T in addition to a first light control unit CCP-R, a second light control unit CCP-G, and a third light control unit CCP-B. The fourth light control unit CCP-T may overlap the fourth pixel region PXA-W in a plan view. A bank BMP may be provided between the fourth light control unit CCP-T and another adjacent light control unit. The fourth light control unit CCP-T may not include a light emitting body such as a quantum dot. The fourth light control unit CCP-T may be a transmission unit configured to transmit incident light without converting the wavelength thereof. The fourth light control unit CCP-T may include a base resin and a scatterer dispersed in the base resin. The same contents as those described with reference to FIG. 3 and FIG. 4A may be applied to the base resin and the scatterer of the embodiment of FIG. 4C.

In a color filter layer CFL-2 of the optical layer OSL-2 of the display device DD-2 according to an embodiment, an opening overlapping the fourth pixel region PXA-W in a plan view may be defined. At least a portion of the fourth pixel region PXA-W may not overlap color filters CF1, CF2, and CF3 and a light blocking portion BM which are included in the color filter layer CFL-2 in a plan view. The color filters CF1, CF2, and CF3 and the light blocking portion BM included in the color filter layer CFL-2 may not overlap the fourth light emitting region EA4 in a plan view.

For example, in an embodiment, an opening T-OP corresponding to the fourth pixel region PXA-W may be defined in a third color filter CF3 of the color filter layer CFL-2, and accordingly, the color filters CF1, CF2, and CF3 and the light blocking portion BM may not overlap the fourth pixel region PXA-W. However, the disclosure is not limited thereto, and the third color filter CF3 may overlap the fourth pixel region PXA-W, and the third color filter CF3 may be formed of a transparent photosensitive resin.

Each of the display devices DD-1 and DD-2 according to an embodiment illustrated in FIG. 4B and FIG. 4C may include a light emitting element OEL including a light emitting stack ST, and may include a low refractive material in a light emitting layer of at least one green light emitting structure among multiple light emitting structures included in the light emitting stack ST. For example, in a light emitting layer of at least one green light emitting structure among multiple light emitting structures included in the light emitting stack ST, a low refractive material may be included in a sub-light emitting layer adjacent to a hole transport region, and accordingly, the display devices DD-1 and DD-2 of an embodiment may exhibit excellent light efficiency.

Hereinafter, referring to FIG. 5 to FIG. 9 and the like, a light emitting element of an embodiment will be described.

Figure 6A:
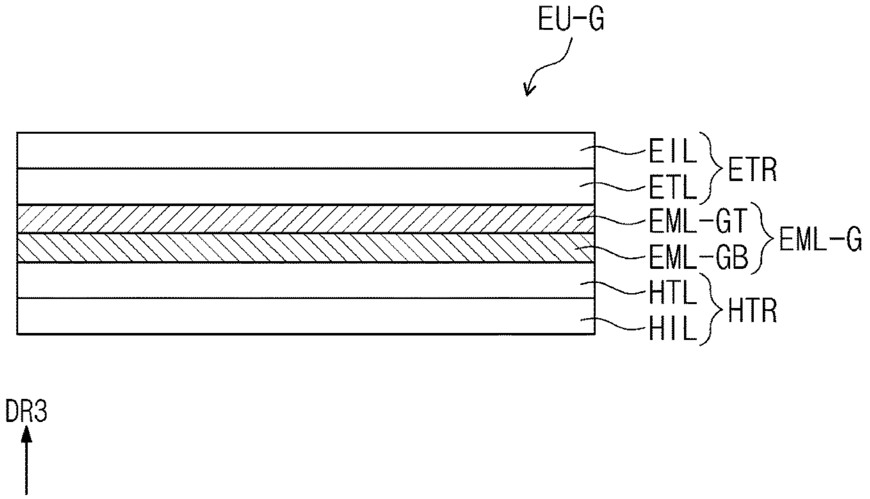
FIG. 6A is a schematic cross-sectional view of a light emitting structure according to an embodiment of the disclosure.
Figure 6B:
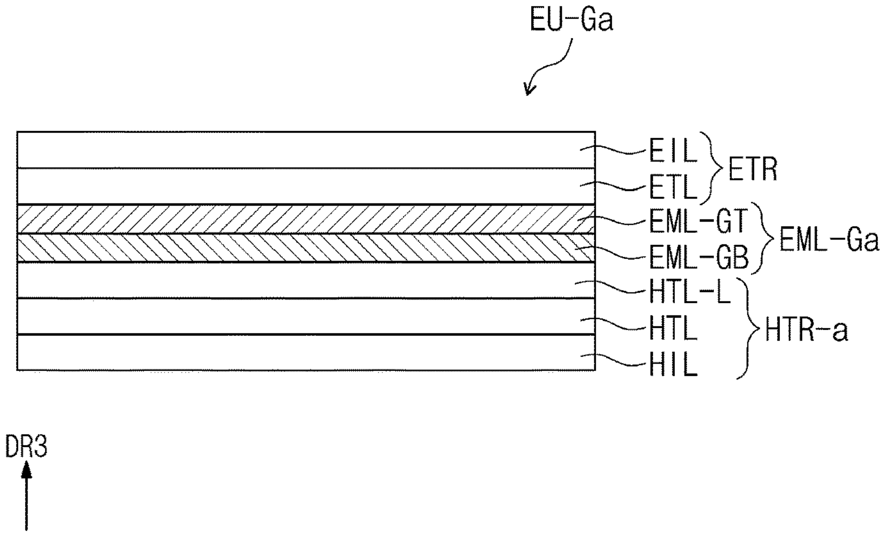
FIG. 6B is a schematic cross-sectional view of a light emitting structure according to an embodiment of the disclosure.
Figure 7A:
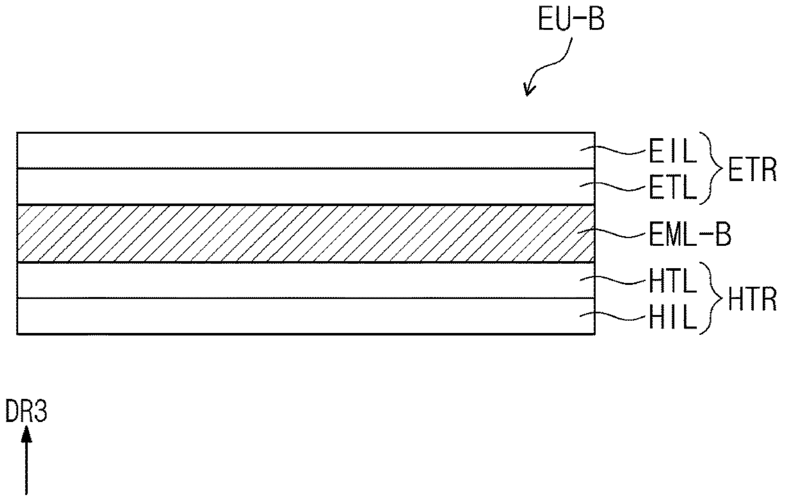
FIG. 7A is a schematic cross-sectional view of a light emitting structure according to an embodiment of the disclosure.
Figure 7B:
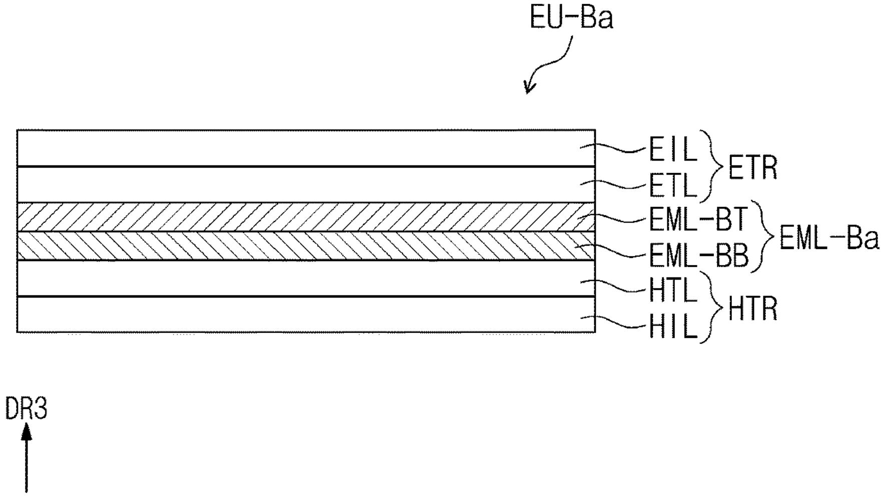
FIG. 7B is a schematic cross-sectional view of a light emitting structure according to an embodiment of the disclosure.

FIG. 5 is a schematic cross-sectional view schematically showing a light emitting element of an embodiment of the disclosure. FIG. 6A and FIG. 6B are each a schematic cross-sectional view showing an embodiment of a light emitting structure which emits green light among light emitting structures included in a light emitting element. FIG. 7A and FIG. 7B are each a schematic cross-sectional view showing an embodiment of a light emitting structure which emits blue light among light emitting structures included in a light emitting element.

A light emitting element OEL of an embodiment may include a first electrode EL1, a second electrode EL2 facing the first electrode EL1, and multiple light emitting structures EU-1, EU-2, EU-3, and EU-4 which are disposed between the first electrode EL1 and the second electrode EL2. For example, the light emitting element OEL of an embodiment may include three or more light emitting structures disposed between the first electrode EL1 and the second electrode EL2.

The light emitting element OEL of an embodiment may include a blue light emitting structure which emits blue light and a green light emitting structure which emits green light. The light emitting element OEL of an embodiment may include multiple blue light emitting structures EU-B and EU-Ba and at least one green light emitting structures EU-G and EU-Ga.

Referring to FIG. 5, the light emitting element OEL of an embodiment may include a first light emitting structure EU-1, a second light emitting structure EU-2, a third light emitting structure EU-3, and a fourth light emitting structure EU-4 which are sequentially stacked. For example, in an embodiment, the first light emitting structure EU-1, the second light emitting structure EU-2, and the third light emitting structure EU-3 may be blue light emitting structures which emit blue light, and the fourth light emitting structure EU-4 may be a green light emitting structure. However, the disclosure is not limited thereto, and the position of a green light emitting structure and the number of green light emitting structures included in the light emitting element OEL may vary.

In an embodiment illustrated in FIG. 5, light generated in the light emitting element OEL may be emitted from an upper surface of the second electrode EL2, for example, in the third direction DR3.

The light emitting element OEL according to an embodiment may include charge generating layers CGL-1, CGL-2, and CGL-3 disposed between the light emitting structures EU-1, EU-2, EU-3, and EU-4. The light emitting element OEL according to an embodiment may include a first charge generating layer CGL-1 disposed between the first light emitting structure EU-1 and the second light emitting structure EU-2, a second charge generating layer CGL-2 disposed between the second light emitting structure EU-2 and the third light emitting structure EU-3, and a third charge generating layer CGL-3 disposed between the third light emitting structure EU-3 and the fourth light emitting structure EU-4.

In case that a voltage is applied to the light emitting element OEL, the charge generating layers CGL-1, CGL-2, and CGL-3 may generate charges (electrons and holes) by forming a complex through an oxidation-reduction reaction. The charge generating layers CGL-1, CGL-2, and CGL-3 may provide the generated charges to each of adjacent light emitting structures EU-1, EU-2, EU-3, and EU-4. The charge generating layers CGL-1, CGL-2, and CGL-3 may increase the efficiency of a current generated in each of the light emitting structures EU-1, EU-2, EU-3, and EU-4, and may serve to control the balance of charges between adjacent light emitting structures EU-1, EU-2, EU-3, and EU-4.

Each of the charge generating layers CGL-1, CGL-2, and CGL-3 may have a layered structure in which an n-type charge generating layer n-CGL and a p-type charge generating layer p-CGL are bonded to each other.

The n-type charge generating layer n-CGL may be a charge generating layer which provides electrons to adjacent light emitting structures EU-1, EU-2, EU-3, and EU-4. The n-type charge generating layer n-CGL may be a layer in which a base material is doped with an n-dopant. The p-type charge generating layer p-CGL may be a charge generating layer which provides holes to adjacent light emitting structures EU-1, EU-2, EU-3, and EU-4. The p-type charge generating layer p-CGL may be a layer in which a base material is doped with a p-dopant.

Although not illustrated, a buffer layer may be further disposed between the n-type charge generating layer n-CGL and the p-type charge generating layer p-CGL.

Each of the charge generating layers CGL-1, CGL-2, and CGL-3 may include an n-type aryl amine-based material, or a p-type metal oxide. For example, each of the charge generating layers CGL-1, CGL-2, and CGL-3 may include an aryl amine-based organic compound, a metal, a metal oxide, a carbide, a fluoride, or a mixture thereof.

For example, the aryl amine-based organic compound may be α-NPD, 2-TNATA, TDATA, MTDATA, sprio-TAD, or sprio-NPB. For example, the metal may be cesium (Cs), molybdenum (Mo), vanadium (V), titanium (Ti), tungsten (W), barium (Ba), or lithium (Li). For example, the metal oxide, the carbide, and the fluoride may be $Re_2O_7$, $MoO_3$, $V_2O_5$, $WO_3$, $TiO_2$, $Cs_2CO_3$, BaF, LiF, or CsF.

In the light emitting element OEL according to an embodiment, the first electrode EL1 may be a reflective electrode. For example, the first electrode EL1 may include highly reflective Ag, Mg, Cu, Al, Pt, Pd, Au, Ni, Nd, Ir, Cr, Li, Ca, LiF/Ca, LiF/Al, Mo, Ti, W, In, Zn, Sn, or a compound or mixture thereof (for example, a mixture of Ag and Mg). According to an embodiment, the first electrode EL1 may have a multi-layered structure including a reflective layer formed of one of the above materials, and a transparent conductive layer formed of indium tin oxide (ITO), indium zinc oxide (IZO), zinc oxide (ZnO), indium tin zinc oxide (ITZO), or the like. For example, the first electrode EL1 may have a two-layered structure of ITO/Ag or a three-layered structure of ITO/Ag/ITO, but the disclosure is not limited thereto. The first electrode EL1 may include one of the above-described metal materials, a combination of two or more of the above-described metal materials, an oxide of one of the above-described metal materials, or the like. The thickness of the first electrode EL1 may be in a range of about 70 nm to about 1000 nm. For example, the thickness of the first electrode EL1 may be in a range of about 100 nm to about 300 nm.

In the light emitting element OEL according to an embodiment, the second electrode EL2 may be a transflective electrode or a transmissive electrode. In case that the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), or the like.

In case that the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, In, Zn, Sn, or a compound or a mixture thereof (for example, AgMg, AgYb, or MgAg). According to an embodiment, the second electrode EL2 may be of a multi-layered structure including a reflective layer or a transflective layer, both formed of the above-described materials, and a transparent conductive layer formed of indium tin oxide (ITO), indium zinc oxide (IZO), zinc oxide (ZnO), indium tin zinc oxide (ITZO), or the like. For example, the second electrode EL2 may include one of the above-described metal materials, a combination of two or more of the above-described metal materials, an oxide of one of the above-described metal materials, or the like.

Although not illustrated, the second electrode EL2 may be connected to an auxiliary electrode. In case that the second electrode EL2 is connected to the auxiliary electrode, the resistance of the second electrode EL2 may be reduced.

On the second electrode EL2 of the light emitting element OEL of an embodiment, a capping layer CPL may be further disposed. The capping layer CPL may include multiple layers or a single layer.

In an embodiment, the capping layer CPL may be an organic layer or an inorganic layer. For example, in case that the capping layer CPL includes an inorganic material, the capping layer CPL may include an alkaline metal compound such as LiF, an alkaline earth metal compound such as $MgF_2$, SiON, $SiN_x$, SiOy, or the like.

For example, in case that the capping layer CPL may include an organic material such as α-NPD, NPB, TPD, m-MTDATA, $Alq_3$, CuPc, N4,N4,N4',N4'-tetra (biphenyl-4-yl) biphenyl-4,4'-diamine (TPD15), 4,4',4"-Tris (carbazol sol-9-yl) triphenylamine (TCTA), and the like, or may include an epoxy resin, or an acrylate such as a methacrylate. However, the disclosure is not limited thereto, and the capping layer CPL may include at least one of the following compounds P1 to P5.

P1

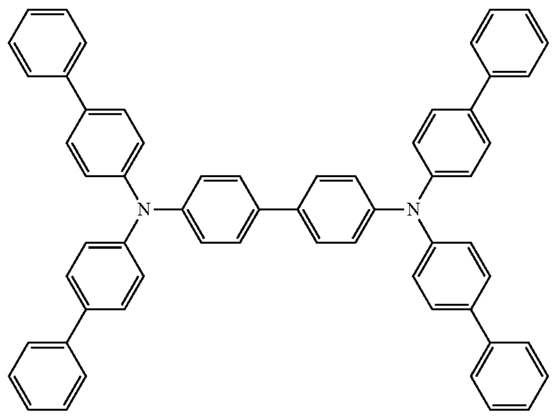

P2

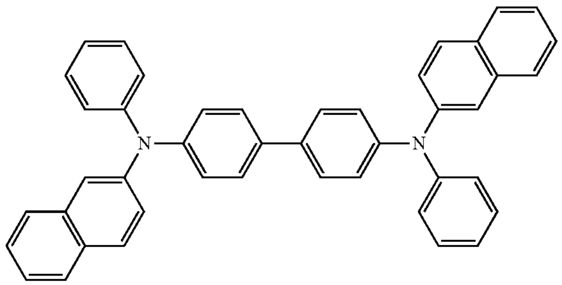

P3

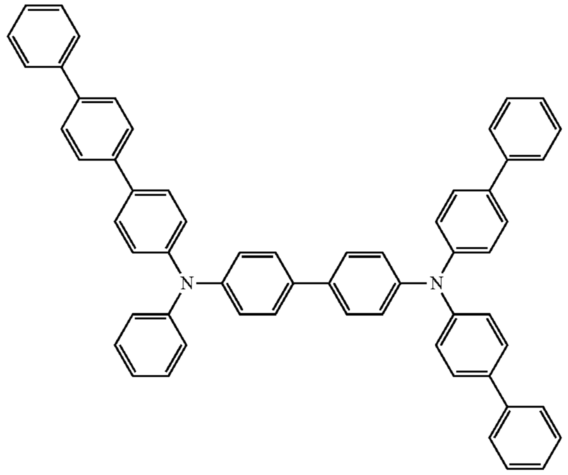

P4

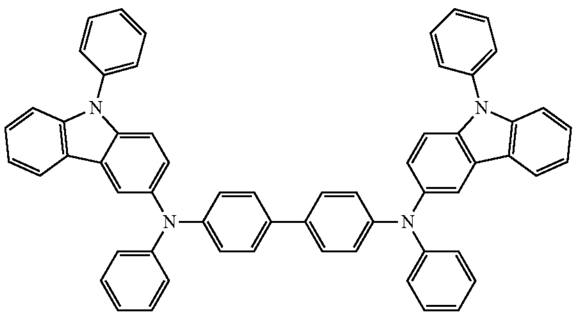

-continued

P5

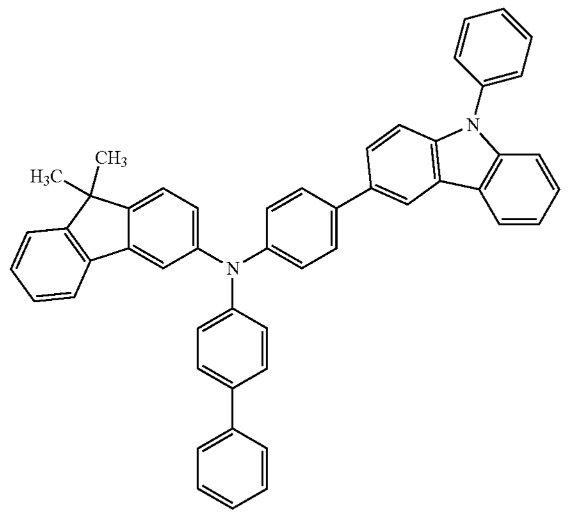

The refractive index of the capping layer CPL may be greater than or equal to about 1.6. For example, with respect to light having a wavelength region in a range of about 550 nm to about 660 nm, the refractive index of the capping layer CPL may be greater than or equal to about 1.6.

The light emitting structures EU-1, EU-2, EU-3, and EU-4 may respectively include light emitting layers EML-1, EML-2, EML-3, and EML-4. The light emitting structures EU-1, EU-2, EU-3, and EU-4 may respectively include hole transport regions HTR-1, HTR-2, HTR-3, and HTR-4, the light emitting layers EML-1, EML-2, EML-3, and EML-4, and electron transport regions ETR-1, ETR-2, ETR-3, and ETR-4, which are stacked. For example, the light emitting element OEL of an embodiment may be a light emitting element of a tandem structure including multiple light emitting layers stacked in the thickness direction DR3.

The hole transport regions HTR-1, HTR-2, HTR-3, and HTR-4 respectively included in the light emitting structures EU-1, EU-2, EU-3, and EU-4 may have a single-layered structure having a single layer formed of a single material, a single-layered structure having a single layer formed of different materials, or a multi-layered structure having multiple layers formed of multiple different materials.

The hole transport regions HTR-1, HTR-2, HTR-3, and HTR-4 may each be formed by using various methods such as vacuum deposition, spin coating, casting, Langmuir-Blodgett (LB), inkjet printing, laser printing, and laser induced thermal imaging (LITI).

The hole transport regions HTR-1, HTR-2, HTR-3, and HTR-4 may each include a hole transport material. For example, the hole transport regions HTR-1, HTR-2, HTR-3, and HTR-4 may include a phthalocyanine compound such as copper phthalocyanine, $N^1,N^{1'}$-([1,1'-biphenyl]-4,4'-diyl)bis($N^1$-phenyl-$N^4,N^4$-di-m-tolylbenzene-1,4-diamine) (DNTPD), 4,4',4"-[tris(3-methylphenyl)phenylamino] triphenylamine (m-MTDATA), 4,4'4"-Tris(N,N-diphenylamino) triphenylamine (TDATA), 4,4',4"-tris[N-(1-naphthyl)-N-phenylamino]-triphenylamine (1-TNATA), 4,4',4"-tris[N (2-naphthyl)-N-phenylamino]-triphenylamine (2-TNATA), Poly(3,4-ethylenedioxythiophene)/Poly(4-styrenesulfonate) (PEDOT/PSS), Polyaniline/Dodecylbenzenesulfonic acid (PANI/DBSA), Polyaniline/Camphor sulfonicacid (PANI/CSA), Polyaniline/Poly(4-styrenesulfonate) (PANI/PSS), N,N'-di(naphthalene-1-yl)-N,N'-diphenyl-benzidine (NPB) (or NPD, or α-NPD), triphenylamine-containing polyether ketone (TPAPEK), 4-Isopropyl-4'-methyldiphenyliodonium [Tetrakis(pentafluorophenyl) borate], dipyrazino[2,3-f: 2',3'-h] quinoxaline-2,3,6,7,10,11-hexacarbonitrile (HATCN), or the like.

The hole transport regions HTR-1, HTR-2, HTR-3, and HTR-4 may include a carbazole-based derivative such as N-phenylcarbazole and polyvinylcarbazole, a fluorene-based derivative, a triphenylamine-based derivative such as 4,4',4"-tris(N-carbazolyl) triphenylamine (TCTA), or N,N'-bis(3-methylphenyl)-N,N'-diphenyl-[1,1'-biphenyl]-4,4'-diamine (TPD), N,N'-di(naphthalene-1-yl)-N,N'-diphenyl-benzidine (NPB), 4,4'-Cyclohexylidene bis[N,N-bis(4-methylphenyl)benzenamine] (TAPC), 4,4'-Bis[N,N'-(3-tolyl)amino]-3,3'-dimethylbiphenyl (HMTPD), 1,3-Bis(N-carbazolyl)benzene (mCP), or the like.

The hole transport regions HTR-1, HTR-2, HTR-3, and HTR-4 may include 9-(4-tert-Butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), or the like.

The hole transport regions HTR-1, HTR-2, HTR-3, and HTR-4 may further include, in addition to the above-mentioned materials, a charge generating material to improve conductivity. The charge generating material may be uniformly or non-uniformly dispersed in the hole transport region HTR-1, HTR-2, and HTR-3. The charge generating material may be, for example, a p-dopant. The p-dopant may include at least one of a halogenated metal compound, a quinone derivative, a metal oxide, and a cyano group-containing compound, but the disclosure is not limited thereto. For example, the p-dopant may be a halogenated metal compound such as CuI and RbI, a quinone derivative such as tetracyanoquinodimethane (TCNQ) and 2,3,5,6-tetrafluoro-7,7',8,8'-tetracyanoquinodimethane (F4-TCNQ), a metal oxide such as a tungsten oxide and a molybdenum oxide, a cyano group-containing compound such as dipyrazino[2,3-f: 2',3'-h] quinoxaline-2,3,6,7,10,11-hexacarbonitrile (HATCN) and 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), and the like, but the disclosure is not limited thereto.

FIG. 6A and FIG. 6B schematically illustrate an embodiment of green light emitting structures EU-G and EU-Ga among light emitting structures included in the light emitting element OEL. FIG. 7A and FIG. 7B schematically illustrate an embodiment of blue light emitting structures EU-B and EU-Ba among light emitting structures included in the light emitting element OEL.

In an embodiment, the green light emitting structures EU-G and EU-Ga illustrated in FIG. 6A and FIG. 6B may be included in the position of the fourth light emitting structure EU-4 in the light emitting element OEL of FIG. 5. The blue light emitting structures EU-B and EU-Ba illustrated in FIG. 7A and FIG. 7B may be included in the first light emitting structure to the third light emitting structure EU-1, EU-2, and EU-3 in the light emitting element OEL of FIG. 5. In an embodiment, the green light emitting structures EU-G and EU-Ga may emit green light having a light emission center wavelength in a range of about 520 nm to about 600 nm. In an embodiment, the blue light emitting structures EU-B and EU-Ba may emit blue light having a light emission center wavelength in a range of about 430 nm to about 470 nm.

Referring to FIG. 6A to FIG. 7B, a hole transport region HTR may include a hole injection layer HIL and a hole transport layer HTL. The hole transport region HTR may include at least one of the hole injection layer HIL, the hole transport layer HTL, a buffer layer or a light emitting auxiliary layer (not shown), and an electron blocking layer (not shown). In an embodiment, the hole transport region HTR may have a single-layered structure having a single layer formed of different materials, or have a structure of the hole injection layer HIL/the hole transport layer HTL, the hole injection layer HIL/the hole transport layer HTL/the buffer layer (not shown), the hole injection layer HIL/the buffer layer (not shown), or the hole transport layer HTL/the buffer layer (not shown), which are sequentially stacked, but the disclosure is not limited thereto.

For example, the hole transport region HTR may include multiple stacked hole transport layers. In case that the hole transport region HTR includes multiple hole transport layers, one of the hole transport layers may include a low refractive hole transport material. The low refractive hole transport material may have a relatively low refractive index in the same wavelength compared to a hole transport material included in another neighboring hole transport layer.

In the light emitting element OEL of an embodiment illustrated in FIG. 5, the light emitting layers EML-1, EML-2, EML-3, and EML-4 are respectively disposed on the hole transport regions HTR-1, HTR-2, HTR-3, and HTR-4. The light emitting layers EML-1, EML-2, EML-3, and EML-4 may each have, for example, a thickness in a range of about 100 Å to about 1000 Å or in a range of about 100 Å to about 300 Å. The light emitting layers EML-1, EML-2, EML-3, and EML-4 may have a single-layered structure having a single layer formed of a single material, a single-layered structure having a single layer formed of different materials, or a multi-layered structure having multiple layers formed of multiple different materials. The light emitting layers EML-1, EML-2, EML-3, and EML-4 may include a fluorescent light emitting material or phosphorescent light emitting material. The light emitting layers EML-1, EML-2, EML-3, and EML-4 may include a host material. In an embodiment, at least one of the light emitting layers EML-1, EML-2, EML-3, and EML-4 may include both a hole transporting host and an electron transporting host.

In the light emitting element OEL of an embodiment, the light emitting layers EML-1, EML-2, EML-3, and EML-4 may include an anthracene derivative, a pyrene derivative, a fluoranthene derivative, a chrysene derivative, a dihydrobenz anthracene derivative, a triphenylene derivative, or the like. For example, a light emitting layer EML may include an anthracene derivative or a pyrene derivative. However, the disclosure is not limited thereto, and the light emitting layer EML may include another light emitting material.

In the light emitting element OEL of an embodiment, multiple light emitting layers EML-1, EML-2, EML-3, and EML-4 of first to fourth light emitting structures EU-1, EU-2, EU-3, and EU-4 may be blue light emitting layers which emit blue light. For example, in an embodiment, the light emitting layer EML-1 of the first light emitting structure EU-1, the light emitting layer EML-2 of the second light emitting structure EU-2, and the light emitting layer EML-3 of the third light emitting structure EU-3 may be blue light emitting layers. In the light emitting element OEL of an embodiment, the light emitting layer EML-4 of the fourth light emitting structure EU-4 may be a green light emitting layer which emits green light.

In the light emitting element OEL of an embodiment, at least one light emitting layer EML-1, EML-2, EML-3, and EML-4 of the light emitting structures EU-1, EU-2, EU-3, and EU-4 may include multiple sub-light emitting layers. For example, the fourth light emitting layer EML-4 may have a double-layered structure. At least one of the first to third light emitting layers EML-1, EML-2, and EML-3 may have a double-layered structure.

FIG. 6A and FIG. 6B illustrate an embodiment of the green light emitting structures EU-G and EU-Ga among the light emitting structures included in the light emitting element OEL. FIG. 7A and FIG. 7B illustrate an embodiment of the blue light emitting structures EU-B and EU-Ba among the light emitting structures included in the light emitting element OEL.

Referring to FIG. 6A and FIG. 6B, the green light emitting structures EU-G and EU-Ga may include two stacked sub-light emitting layers EML-GB and EML-GT. The green light emitting structure EU-G and EU-Ga may include a first sub-light emitting layer EML-GB including a low refractive material and a second sub-light emitting layer EML-GT not including a low refractive material.

A low refractive material included in the first sub-light emitting layer EML-GB may have a refractive index value less than or equal to about 1.7 at 460 nm. The low refractive material included in the first sub-light emitting layer EML-GB may be a host material. In an embodiment, the low refractive material included in the first sub-light emitting layer EML-GB may be a hole transporting host.

The first sub-light emitting layer EML-GB may include a host and a dopant in addition to the low refractive material. The first sub-light emitting layer EML-GB may include a hole transporting first host, an electron transporting second host, and a green light emitting dopant in addition to the low refractive material.

For example, the low refractive material included in the first sub-light emitting layer EML-GB may be an amine compound or a nitrogen-containing compound. However, the disclosure is not limited thereto, and the low refractive material included in the first sub-light emitting layer EML-GB may have a refractive index value less than or equal to about 1.7 at 460 nm, and may be applied without limitation as long as it can be used as a host material of a light emitting layer.

The first sub-light emitting layer EML-GB may include a low refractive material of Compound Group 1 below. However, the disclosure is not limited thereto.

[Compound Group 1]

1

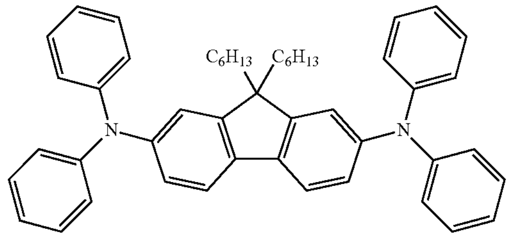

-continued
2
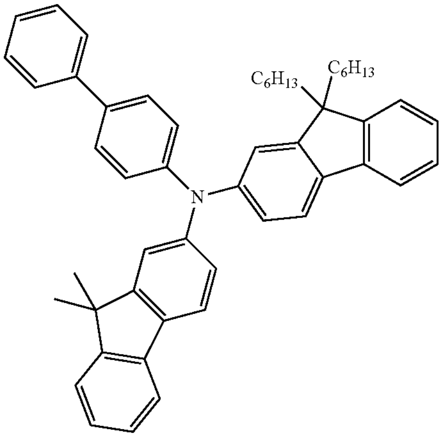
3
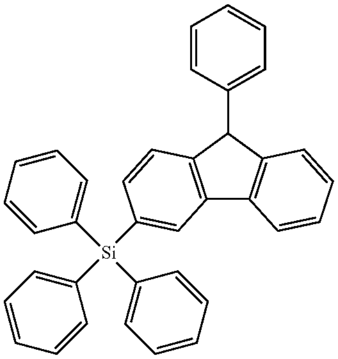
4
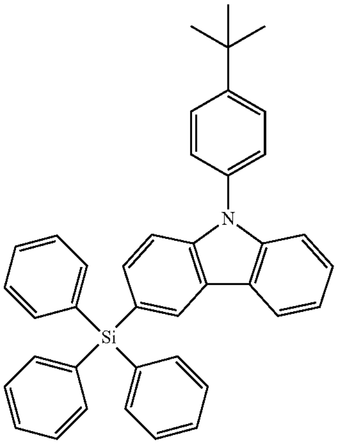
-continued
5
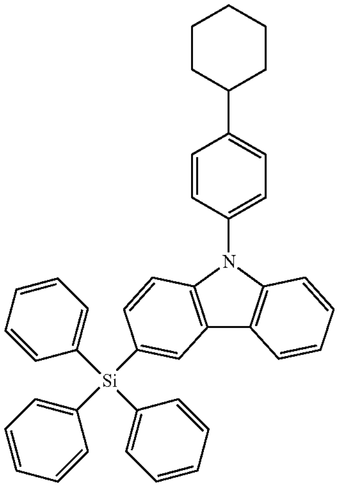
6
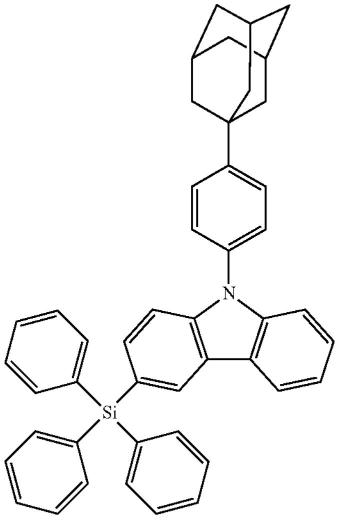
7
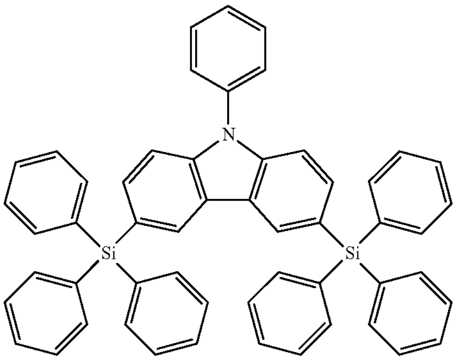

8
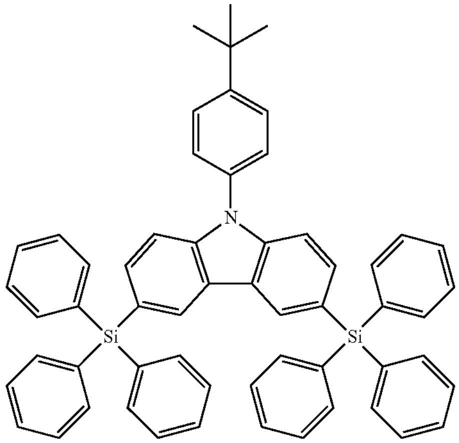
9
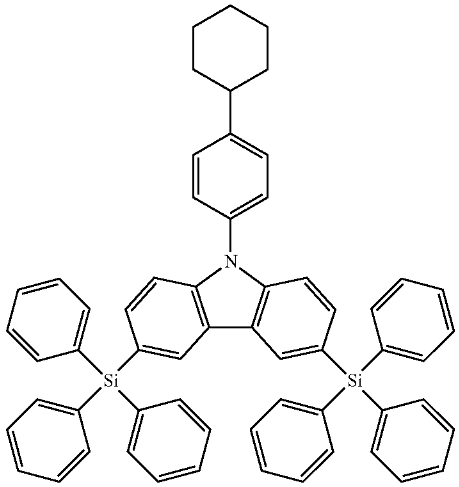
10
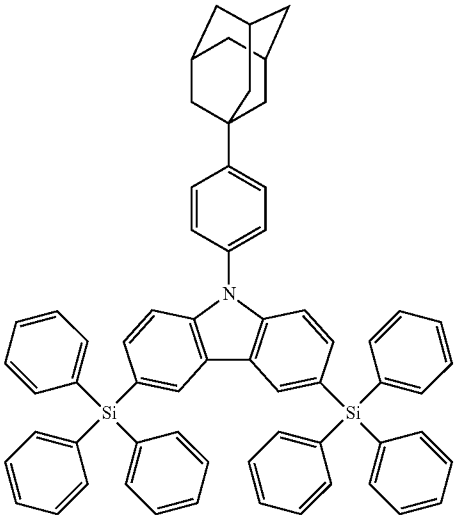
11
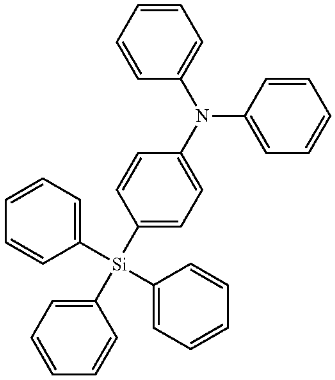
12
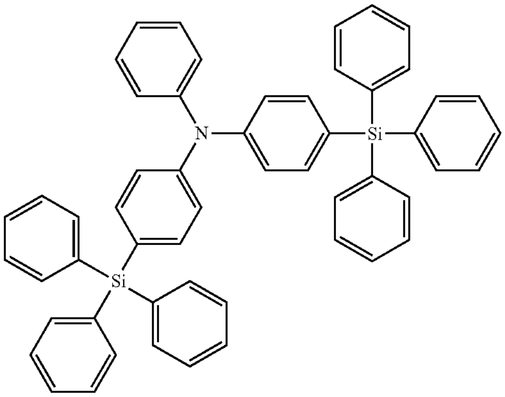
13
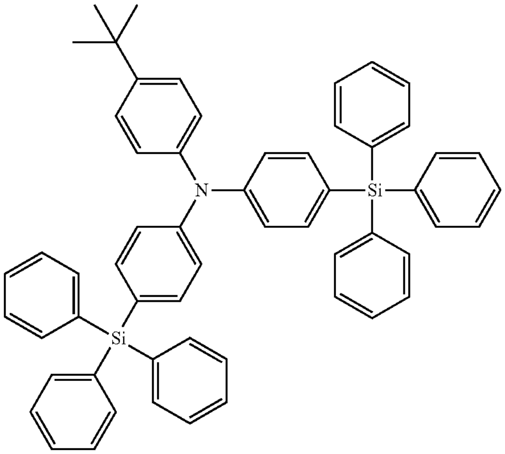

-continued
14
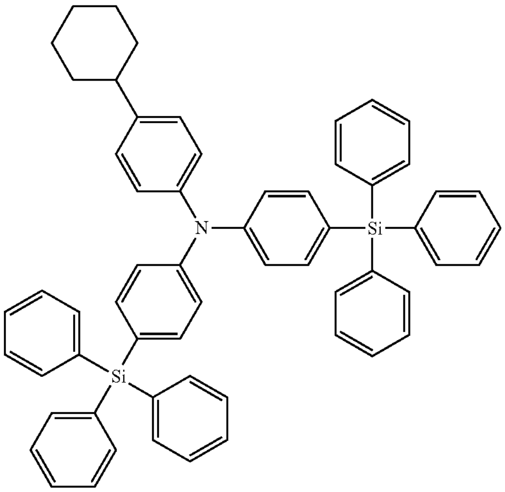
14
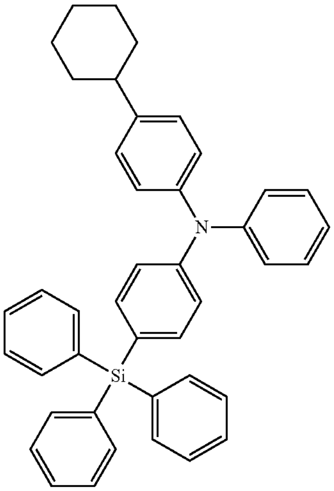
15
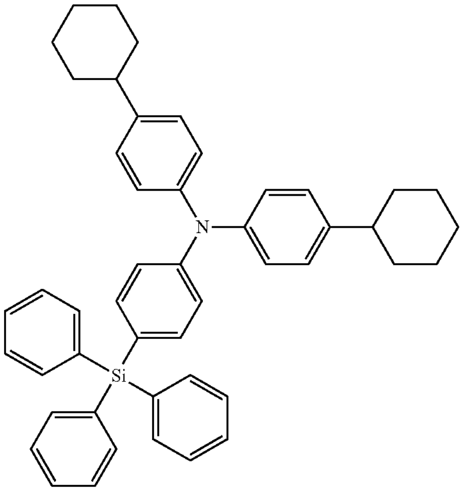
-continued
17
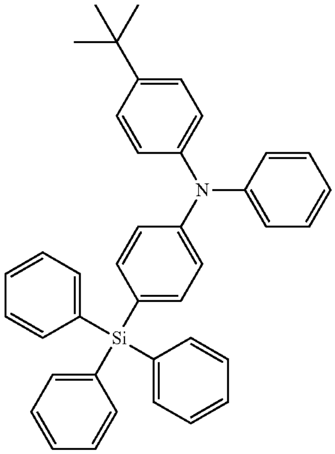
18
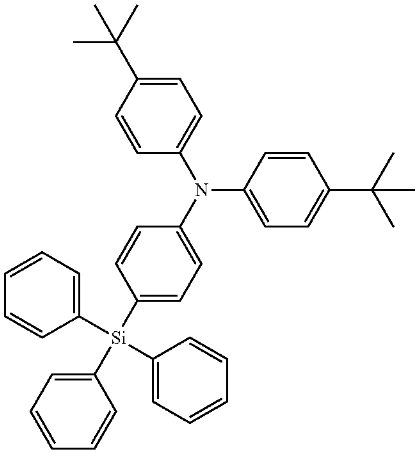
19
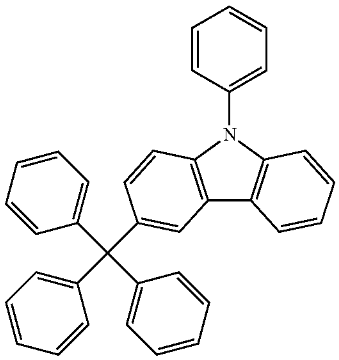

-continued
20
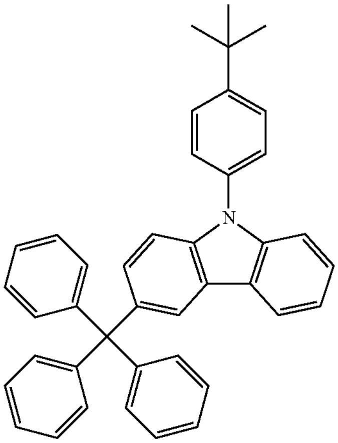
21
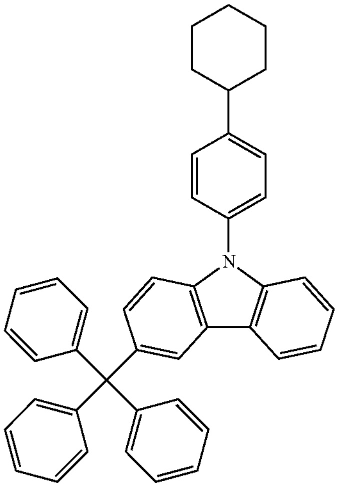
22
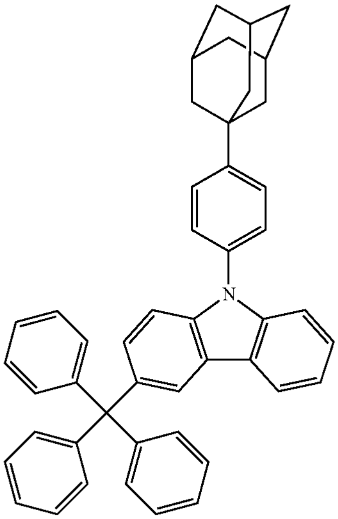
-continued
23
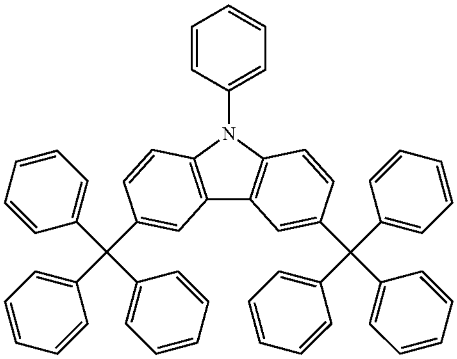
24
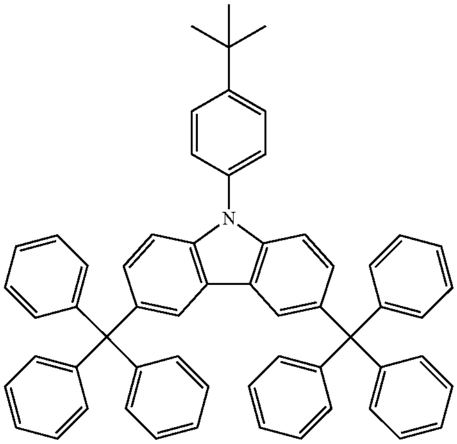
25
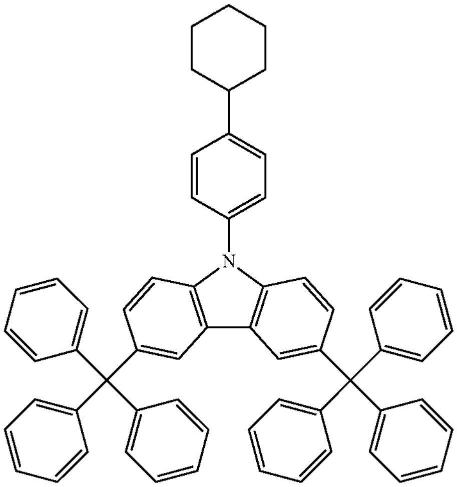

-continued

26

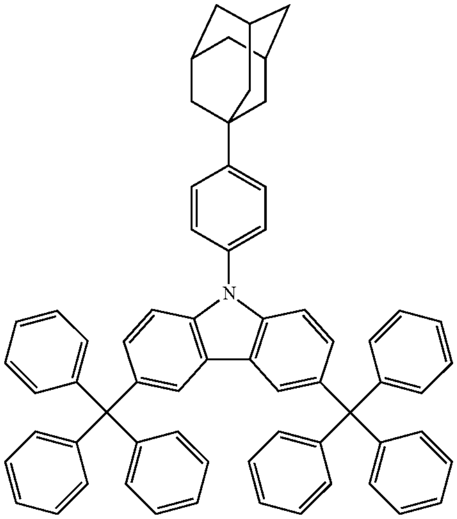

27

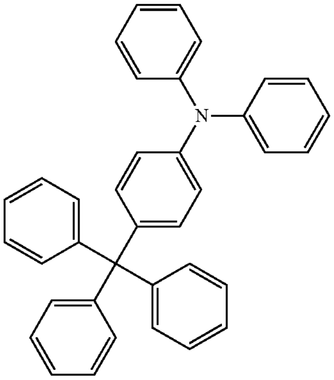

28

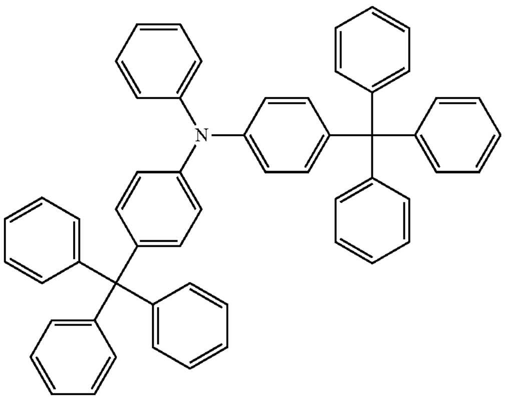

-continued

29

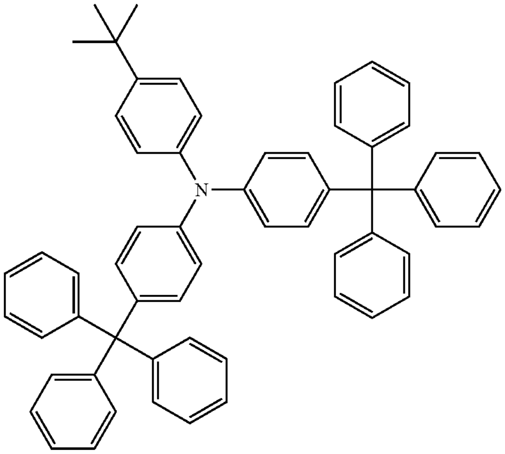

30

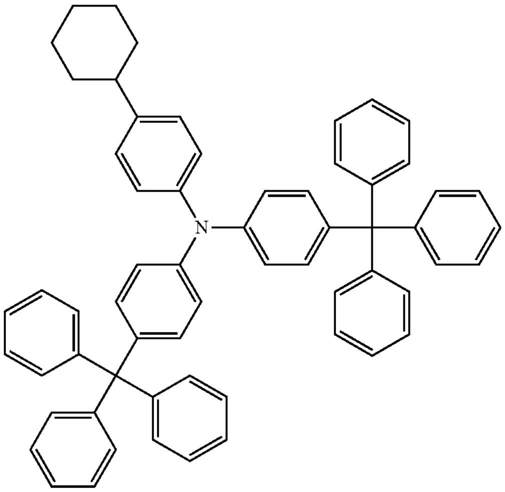

The first sub-light emitting layer EML-GB including a low refractive material may be disposed (e.g., directly disposed) on the hole transport region HTR. In case that the hole transport region HTR includes the hole injection layer HIL and the hole transport layer HTL, the first sub-light emitting layer EML-GB may be disposed (e.g., directly disposed) on the hole transport layer HTL.

The second sub-light emitting layer EML-GT may include a host and a dopant. The second sub-light emitting layer EML-GT may not include a low refractive material. The second sub-light emitting layer EML-GT may be disposed on an upper side of the first sub-light emitting layer EML-GB. The second sub-light emitting layer EML-GT may be disposed adjacent to the electron transport region ETR. For example, the second sub-light emitting layer EML-GT may be disposed (e.g., directly disposed) on the first sub-light emitting layer EML-GB. The second sub-light emitting layer EML-GT may include a hole transporting first host, an electron transporting second host, and a green light emitting dopant.

The first sub-light-emitting layer EML-GB and the second sub-light emitting layer EML-GT may include a same host material and a same light emitting dopant material. However, the disclosure is not limited thereto, and the first sub-light emitting layer EML-GB and the second sub-light emitting layer EML-GT may include different host materials or different light emitting dopant materials.

In an embodiment, a material containing a carbazole derivative moiety or an amine derivative moiety may be included as the hole transporting first host. In an embodiment, a material containing a nitrogen-containing aromatic ring structure, such as a pyridine derivative moiety, a pyridazine derivative moiety, a pyrimidine derivative moiety, a pyrazine derivative moiety, a triazine derivative moiety, or the like, may be included as the electron transporting second host.

In the light emitting element OEL according to an embodiment, the hole transporting first host included in the light emitting layer EML-G of the green light emitting structures EU-G and EU-Ga may include one of the materials H4-1 to H4-12 listed below. However, the hole transporting first host material included in the light emitting layer EML-G is not limited to the following embodiments.

H4-1

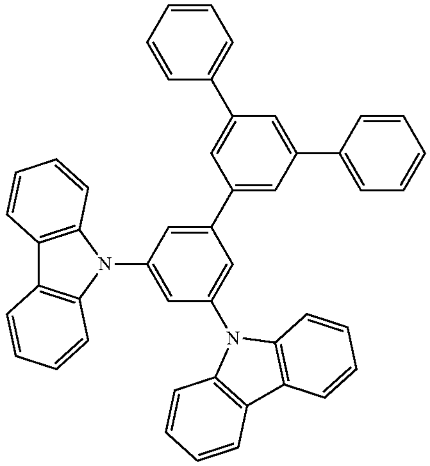

H4-2

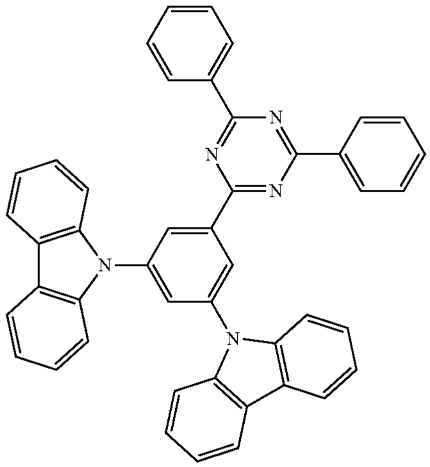

-continued

H4-3

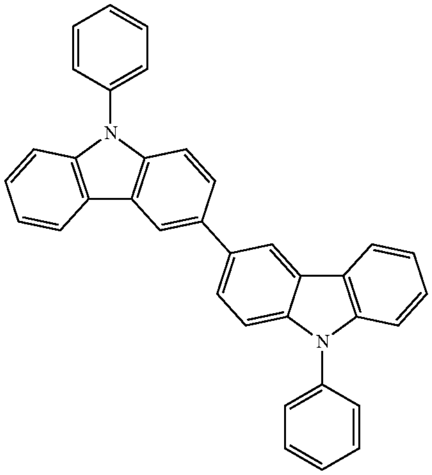

H4-4

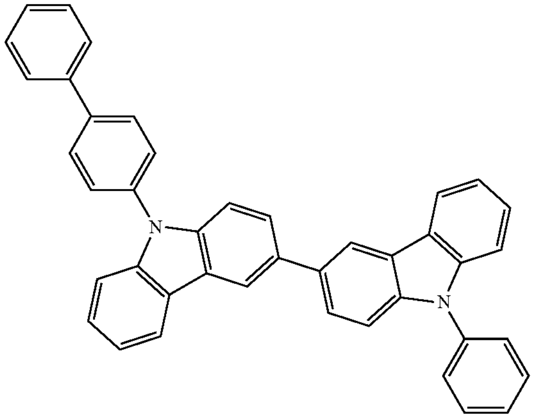

H4-5

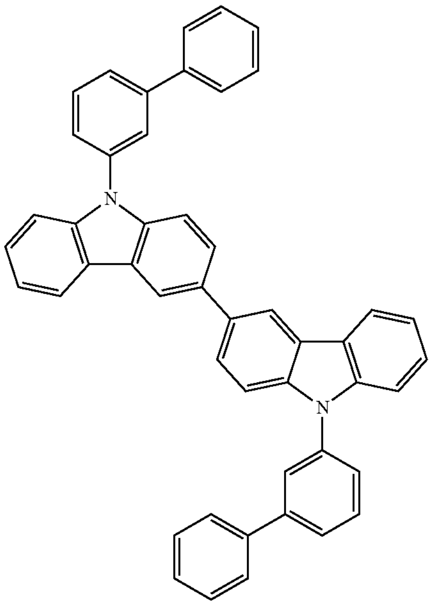

-continued
H4-6
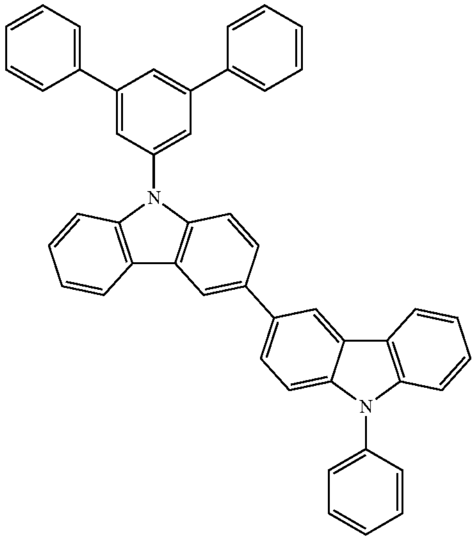
H4-7
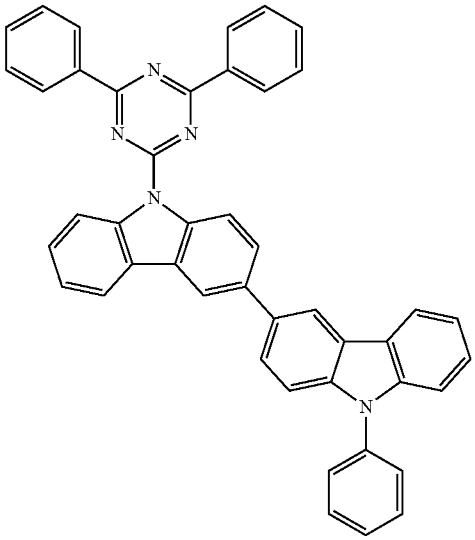
H4-8
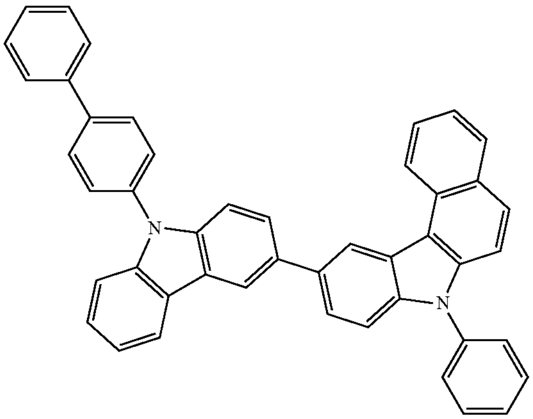
-continued
H4-9
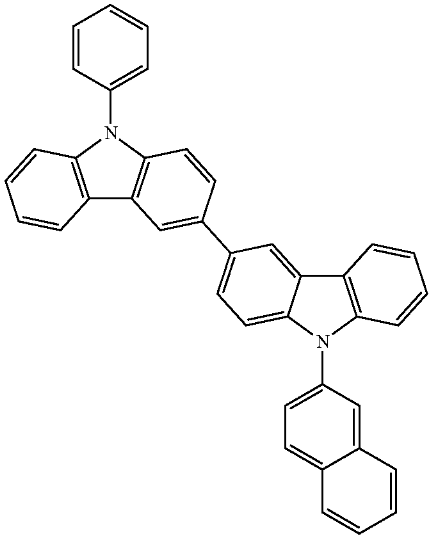
H4-10
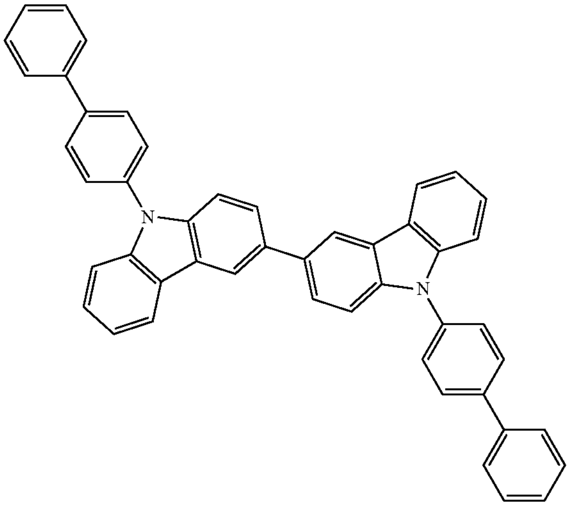
H4-11
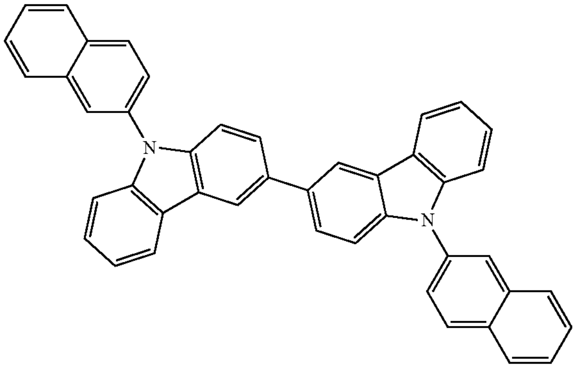

-continued

H4-12

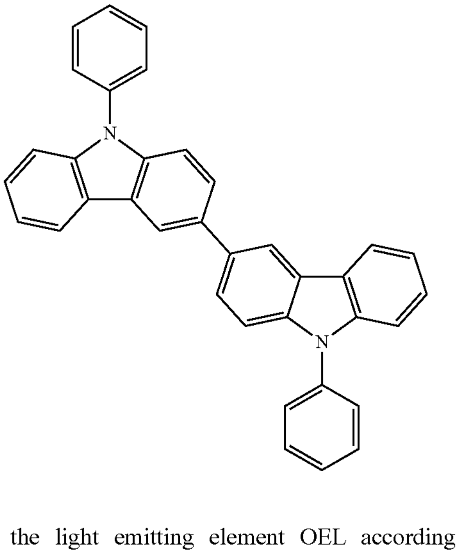

In the light emitting element OEL according to an embodiment, the electron transporting second host included in the light emitting layer EML-G of the green light emitting structures EU-G and EU-Ga may include one of the materials H3-1 to H3-23 listed below. However, the electron transporting second host material included in the light emitting layer EML-G is not limited to the following compounds.

H3-1

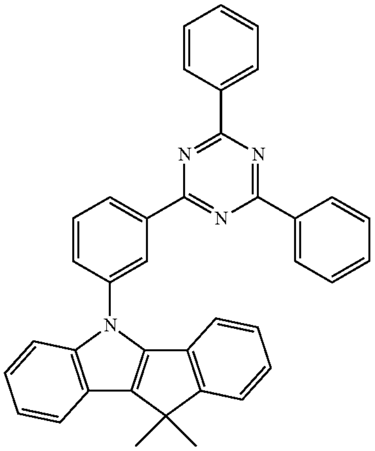

H3-2

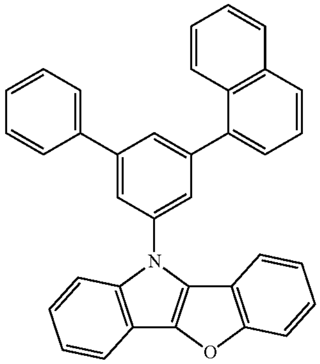

-continued

H3-3

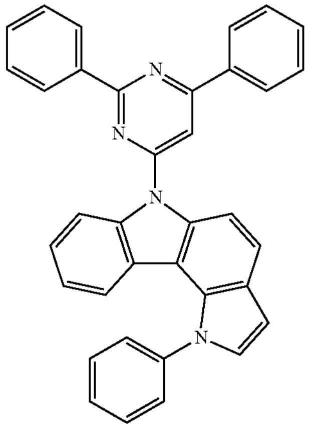

H3-4

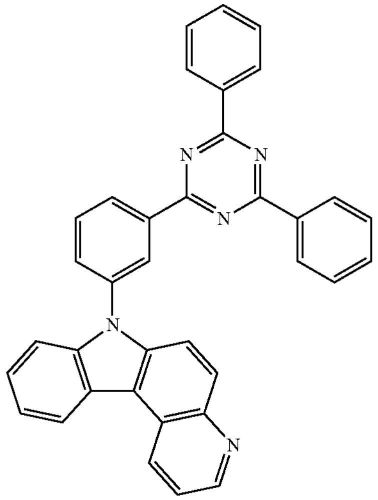

H3-5

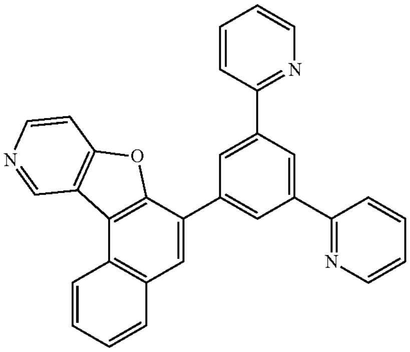

-continued
H3-6
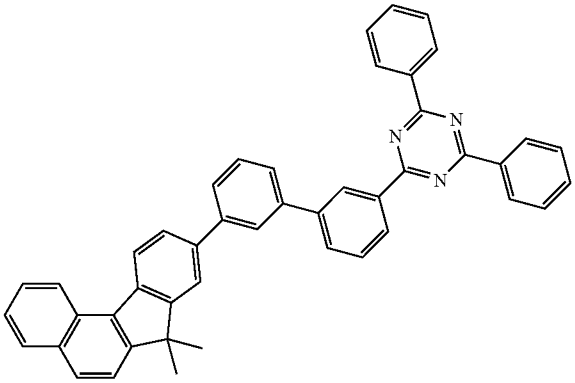
H3-7
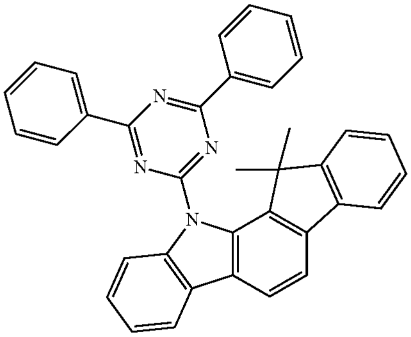
H3-8
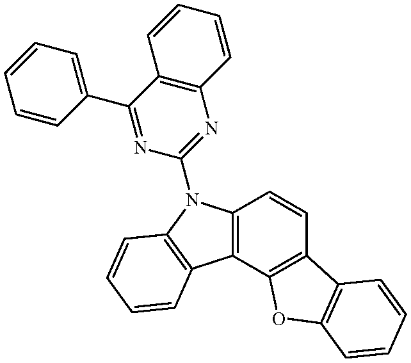
H3-9
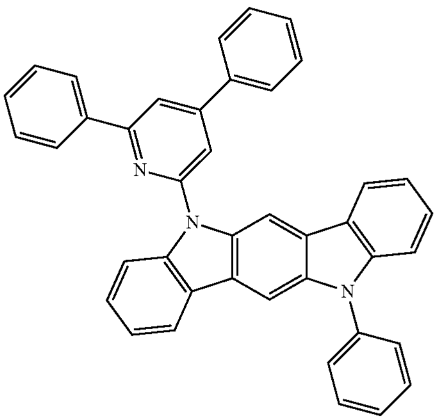
-continued
H3-10
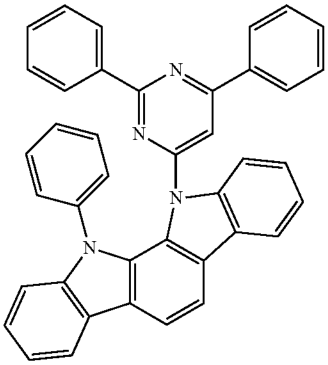
H3-11
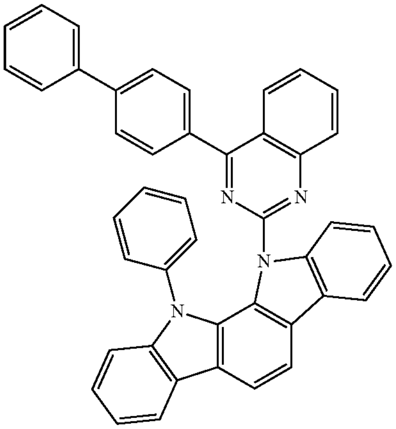
H3-12
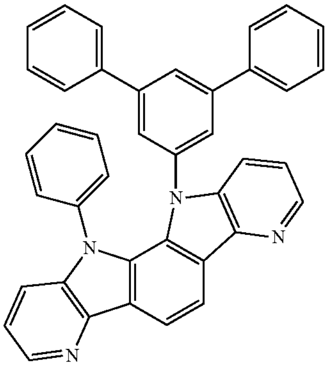
H3-13
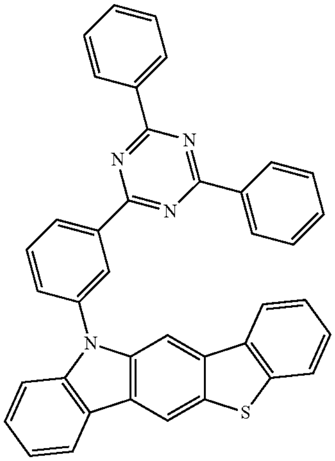

-continued
H3-14
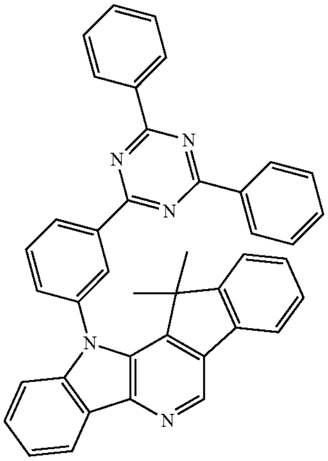
H3-15
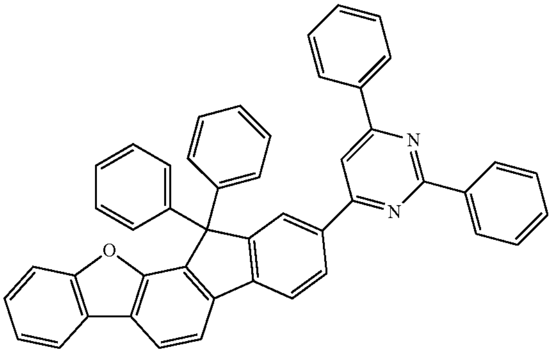
H3-16
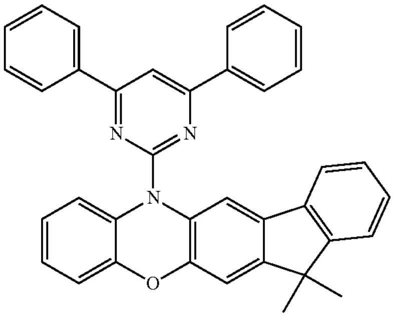
-continued
H3-17
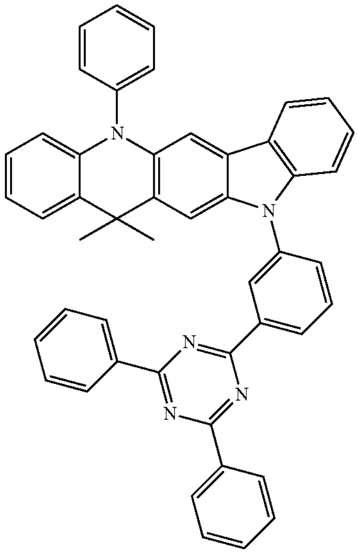
H3-18
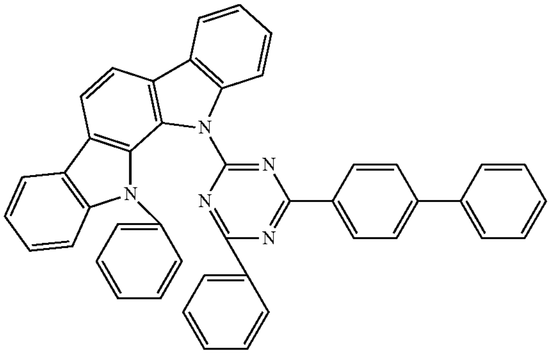
H3-19
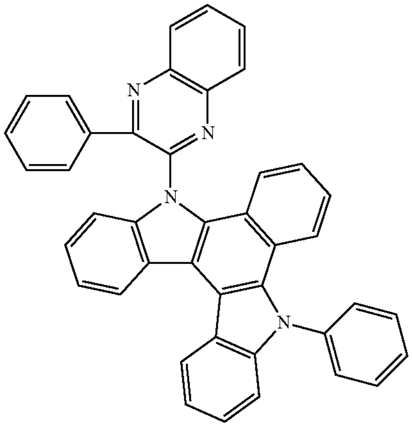

-continued

H3-20

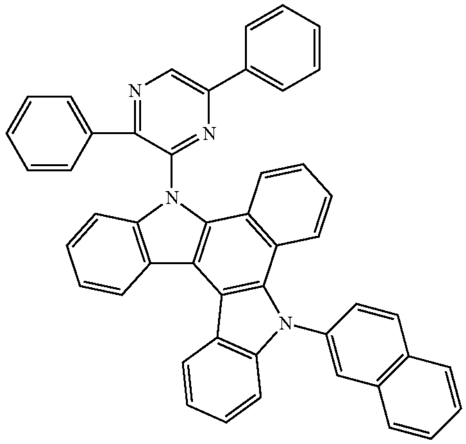

H3-21

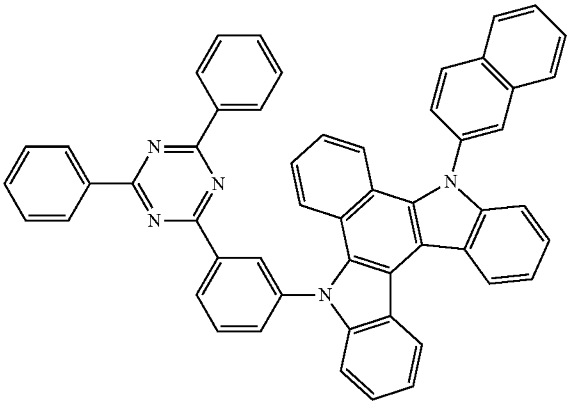

H3-22

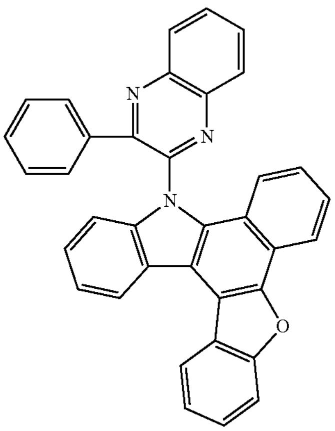

-continued

H3-23

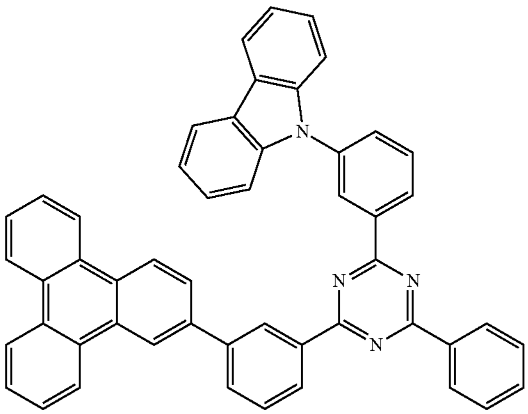

In the light emitting element OEL according to an embodiment, a light emitting dopant included in the green light emitting structures EU-G and EU-Ga may be a phosphorescent dopant. For example, the light emitting dopant included in the light emitting layers EML-G and EML-Ga of the green light emitting structures EU-G and EU-Ga may be an organo metal complex. However, the disclosure is not limited thereto. The first sub-light emitting layer EML-GB and the second sub-light emitting layer EML-GT may include a same light emitting dopant, or different light emitting dopants.

In the light emitting element OEL according to an embodiment, the light emitting dopant included in the green light emitting layer EML-G and EML-Ga of the green light emitting structures EU-G and EU-Ga may include one of the materials PD1 to PD25 listed below. However, the light emitting dopant included in the light emitting layers EML-G and EML-Ga of the green light emitting structures EU-G and EU-Ga is not limited to the following embodiments.

PD1

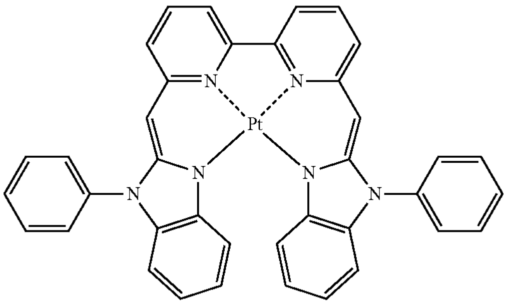

PD2

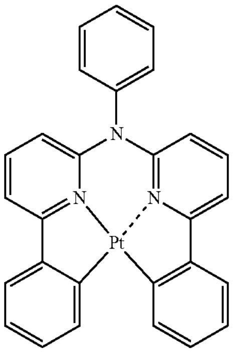

-continued
PD3
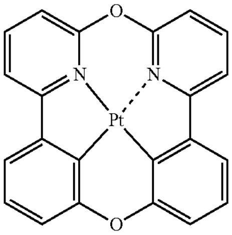
PD4
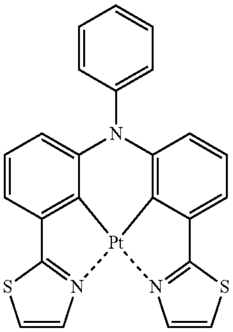
PD5
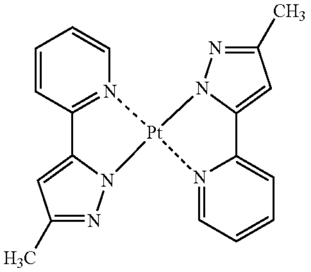
PD6
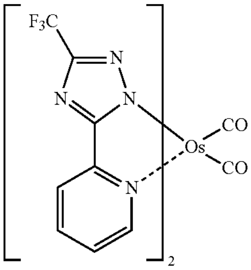
PD7
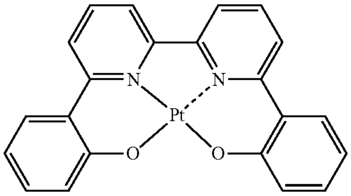
PD8
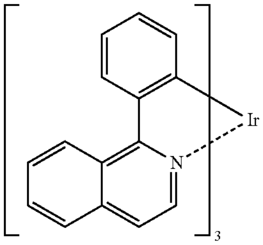
-continued
PD9
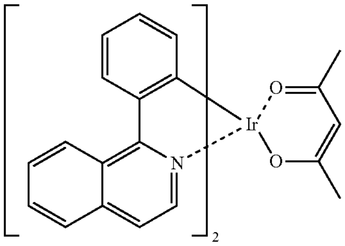
PD10
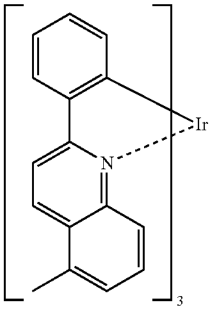
PD11
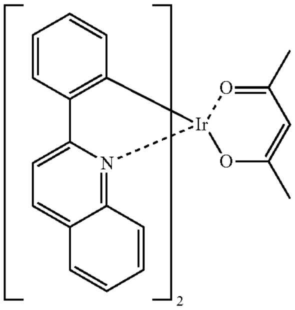
PD12
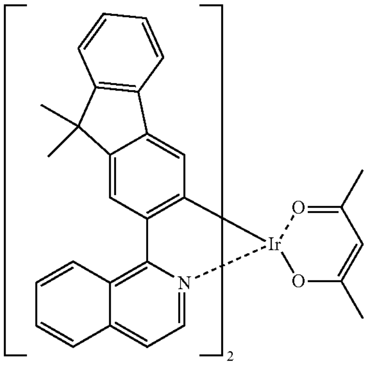
PD13
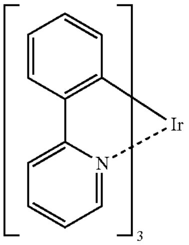

-continued
PD14
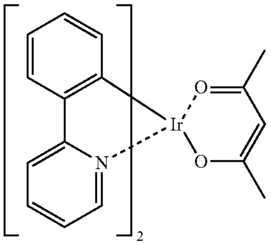
PD15
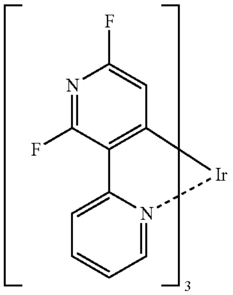
PD16
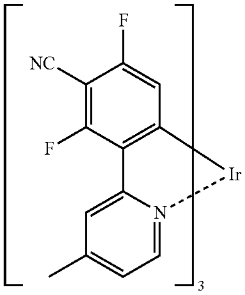
PD17
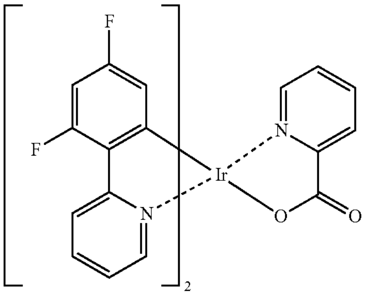
PD18
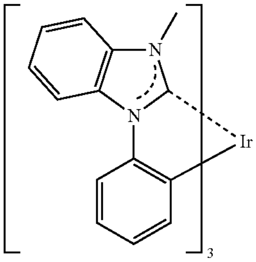
-continued
PD19
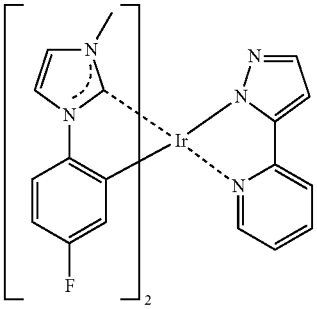
PD20
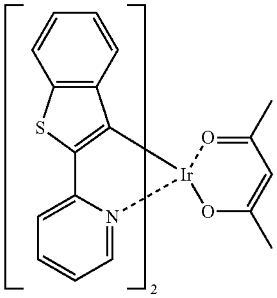
PD21
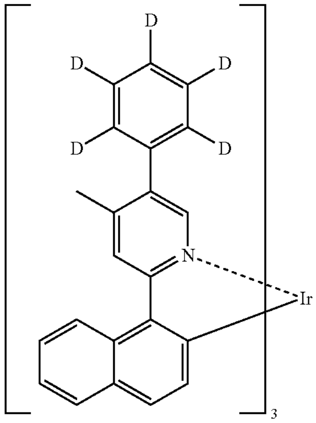
PD22
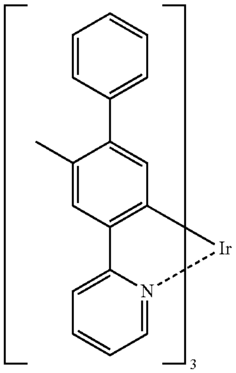

-continued

PD23

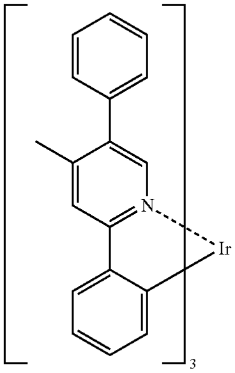

PD24

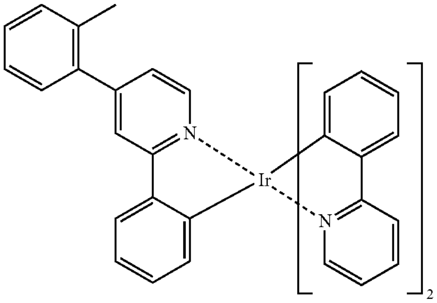

PD25

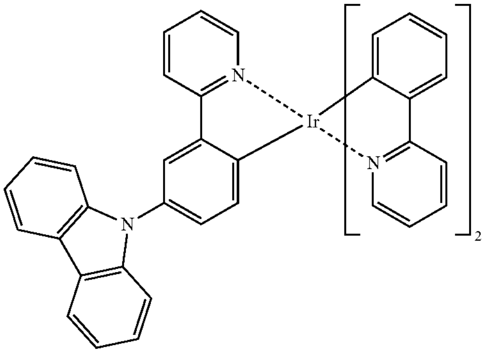

For example, in an embodiment, the hole transporting first host and the electron transporting second host may respectively have the following structures.

<Hole transporting first host>

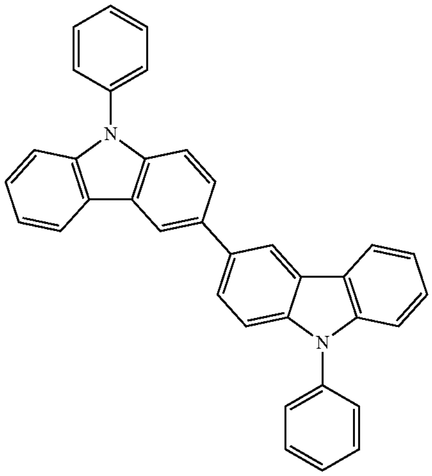

<Electron transporting second host>

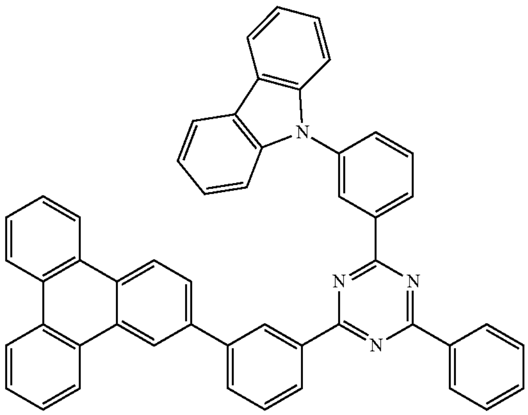

The green light emitting dopant of each of the first sub-light emitting layer EML-GB and the second sub-light emitting layer EML-GT may be a phosphorescent light emitting dopant. For example, in an embodiment, the first sub-light emitting layer EML-GB and the second sub-light emitting layer EML-GT may include a green light emitting dopant having the following structure.

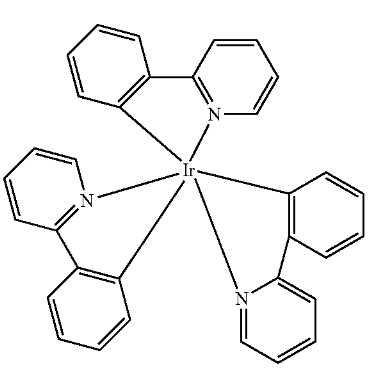

The thickness ratio of the first sub-light emitting layer EML-GB and the second sub-light emitting layer EML-GT may be adjusted depending on light emission properties required in a light emitting structure. For example, the first sub-light emitting layer EML-GB and the second sub-light emitting layer EML-GT may have a same thickness. The meaning of the same thickness corresponds to being in a range including a process error.

However, the disclosure is not limited thereto, and the thickness of the first sub-light emitting layer EML-GB and the thickness of the second sub-light emitting layer EML-GT in the light emitting layers EML-GB and EML-GBa may be different from each other. For example, the thickness ratio of the first sub-light emitting layer EML-GB and the second sub-light emitting layer EML-GT constituting the light emitting layers EML-GB and EML-GBa may be in a range of about 7:3 to about 3:7.

The green light emitting structure EU-Ga according to an embodiment illustrated in FIG. 6B differs in the configuration of a hole transport region compared to the green light emitting structure EU-G of an embodiment illustrated in FIG. 6A.

The green light emitting structure EU-Ga, according to an embodiment illustrated in FIG. 6B may further include an auxiliary hole transport layer HTL-L containing a low refractive hole transport material. A hole transport region HTR-a may include the auxiliary hole transport layer HTL-L, and the auxiliary hole transport layer HTL-L may be disposed adjacent to an upper surface of the hole transport region HTR-a. In an embodiment, the hole transport region HTR-a of the green light emitting structure EU-Ga may include the hole injection layer HIL, the hole transport layer HTL, and the auxiliary hole transport layer HTL-L which are sequentially stacked.

In an embodiment, the auxiliary hole transport layer HTL-L may be a hole transport layer disposed adjacent to the light emitting layer EML-G. The auxiliary hole transport layer HTL-L may include a low refractive hole transport material having a refractive index value less than or equal to about 1.7.

In an embodiment, the first sub-light emitting layer EML-GB may be disposed (e.g., directly disposed) on the auxiliary hole transport layer HTL-L. The second sub-light emitting layer EML-GT may be spaced apart from the auxiliary hole transport layer HTL-L with the first sub-light emitting layer EML-GB interposed between the second sub-light emitting layer EML-GT and the auxiliary hole transport layer HTL-L.

For example, the low refractive hole transport material included in the auxiliary hole transport layer HTL-L may be an amine compound. However, the disclosure is not limited thereto, and the low refractive hole transport material included in the auxiliary hole transport layer HTL-L may have a refractive index value less than or equal to about 1.7 at 460 nm, and may be applied without limitation as long as it is a material having hole transport properties.

In an embodiment, the low refractive material included in the first sub-light emitting layer EML-GB and the low refractive hole transport material included in the auxiliary hole transport layer HTL-L may be the same. However, the disclosure is not limited thereto.

For example, the auxiliary hole transport layer HTL-L may include the following compound as the low refractive hole transport material.

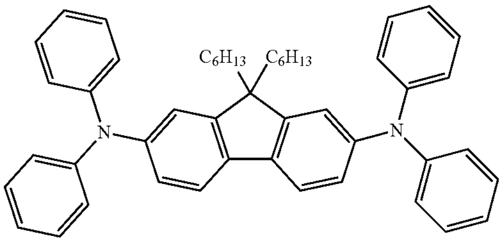

For example, the auxiliary hole transport layer HTL-L may include a low refractive material of Compound Group 1 described above as the low refractive hole transport material.

The green light emitting structures EU-G and EU-Ga according to an embodiment described with reference to FIG. 6A and FIG. 6B include a low refractive material in the first sub-light emitting layer EML-GB spaced apart from the electron transport region ETR, and thus, may have increased light extraction properties without degrading electrical properties in the light emitting layer EML-G. The light emitting layer EML-G of the green light emitting structures EU-G and EU-Ga may be referred to as a green light emitting layer.

The light-emitting element OEL including the green light emitting structures EU-G and EU-Ga according to an embodiment may have excellent light efficiency. For example, the green light emitting layer EML-G including a low refractive material in the first sub-light emitting layer EML-GB may be disposed in the light emitting stack ST (see FIG. 3) relatively adjacent to a light extraction surface, so that the light emitting element OEL may have excellent light emission efficiency.

In FIG. 7A and FIG. 7B, the blue light emitting structures EU-B and EU-Ba respectively including blue light emitting layers EML-B and EML-Ba are illustrated. In FIG. 7A, an embodiment that the blue light emitting structure EU-B has one light emitting layer EML-B is illustrated, and in FIG. 7B, an embodiment that the light emitting layer EML-Ba of the blue light emitting structure EU-Ba includes two sub-light emitting layers EML-BB and EML-BT.

The blue light emitting layers EML-B and EML-Ba may each include a host and a blue light emitting dopant. The blue light emitting dopant may be a fluorescent dopant. However, the disclosure is not limited thereto.

In an embodiment of FIG. 7B, the blue light emitting layer EML-Ba may include both a hole transporting host and an electron transporting host. The blue light emitting layers EML-B and EML-Ba may further include a phosphorescent sensitizer and the like in addition to the blue light emitting dopant, which is a fluorescent dopant. The blue light emitting layers EML-B and EML-Ba may not include a low refractive material.

In case that the light emitting layer EML-Ba includes two sub-light emitting layers EML-BB and EML-BT, the material composition of a lower sub-light emitting layer EML-BB and the material composition of an upper sub-light emitting layer EML-BT may be the same or at least one of the material compositions may be different from the material composition of the rest of the sub-light emitting layers.

The light emitting layers EML-B and EML-Ba of the blue light emitting structures EU-B and EU-Ba may include a host and a dopant. In an embodiment, the light emitting layers EML-B and EML-Ba of the blue light emitting structures EU-B and EU-Ba may include a host, and a blue dopant. The host included in each of the light emitting layers EML-B and EML-Ba of the blue light emitting structures EU-B and EU-Ba may be a blue fluorescence host, and the dopant may be a blue fluorescent dopant.

In the light emitting element OEL according to an embodiment, the host included in each of the light emitting layers EML-B and EML-Ba of the blue light emitting structures EU-B and EU-Ba may include one of the materials H1-1 to H1-18 listed below. However, the host material included in the light emitting layers EML-B and EML-Ba of the blue light emitting structures EU-B and EU-Ba is not limited to the following compounds.

H1-1

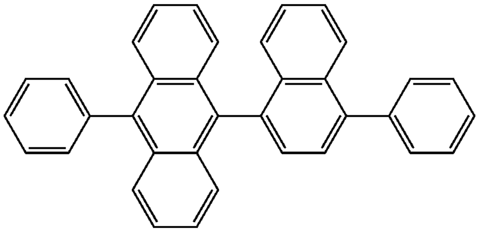

H1-2

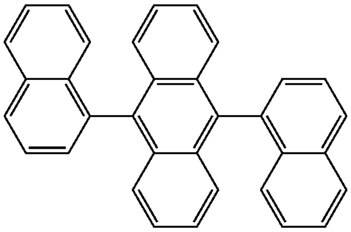

H1-3

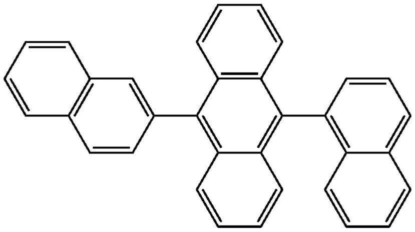

H1-4

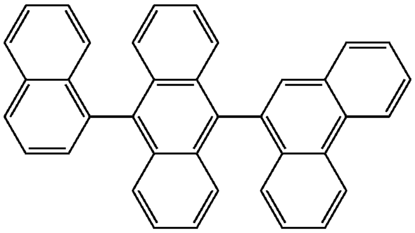

H1-5

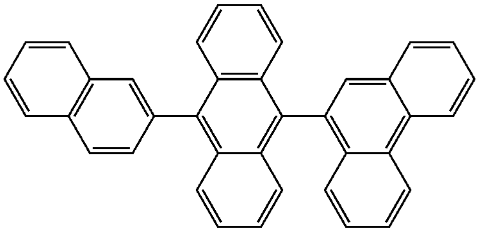

-continued

H1-6

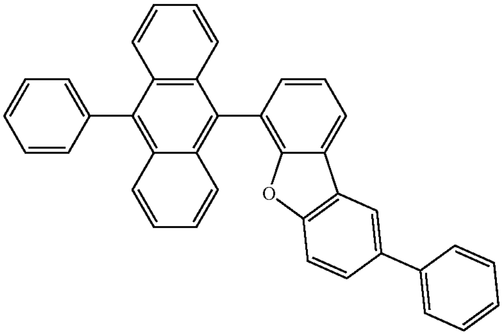

H1-7

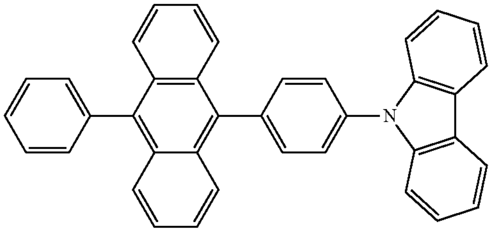

H1-8

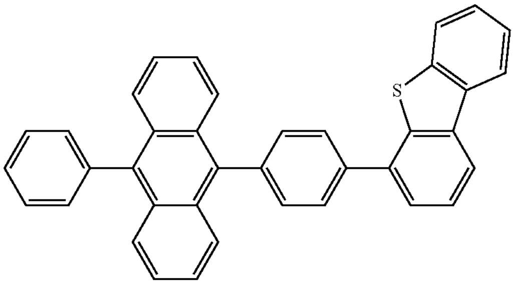

H1-9

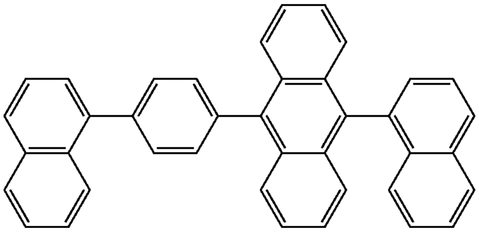

-continued
H1-10
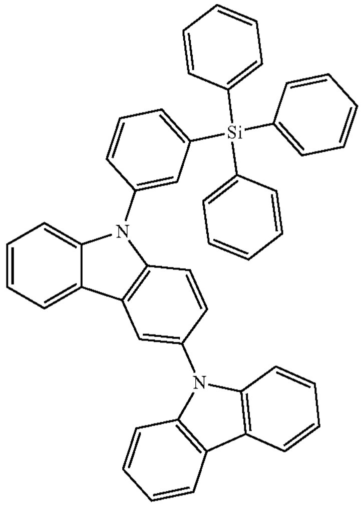
H1-11
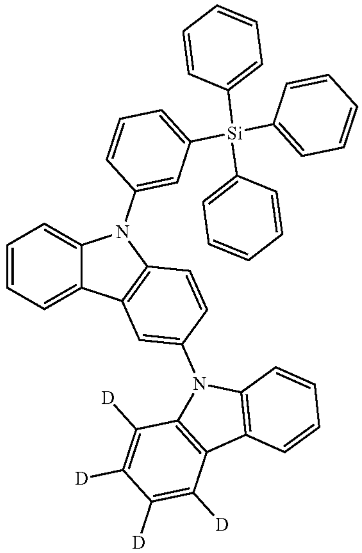
H1-12
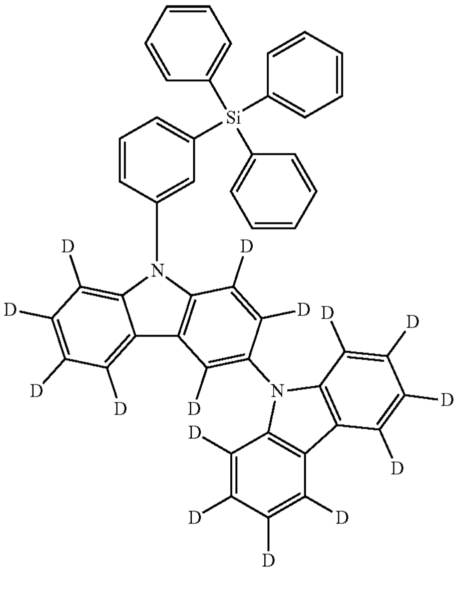
-continued
H1-13
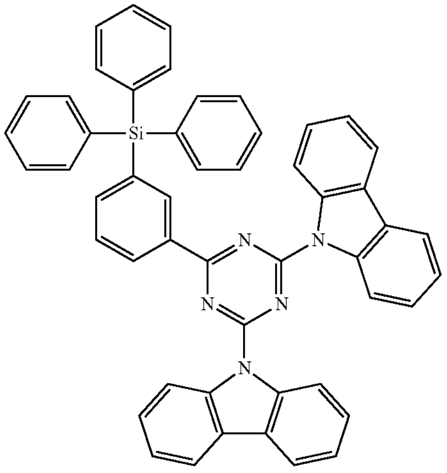
H1-14
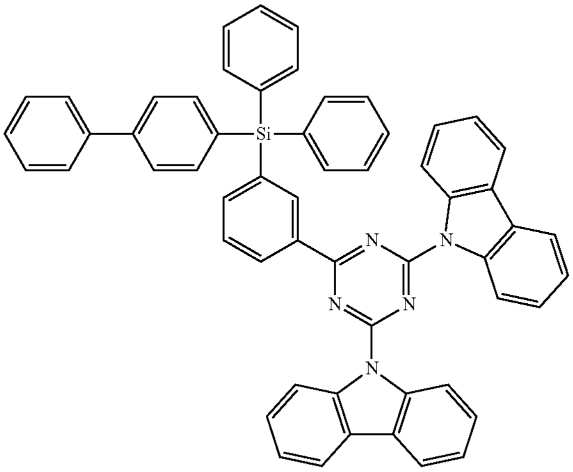
H1-15
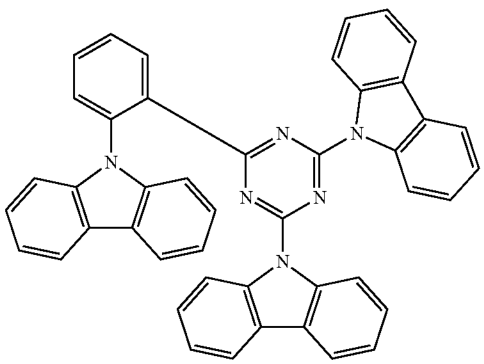

-continued

H1-16

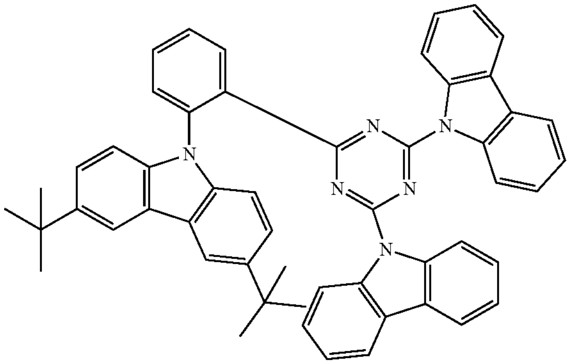

H1-17

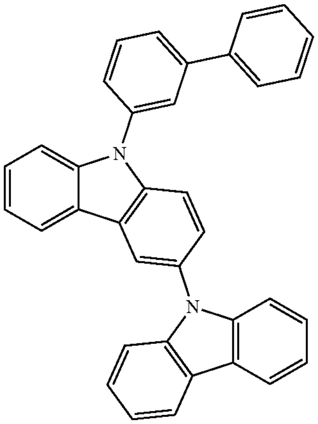

H1-18

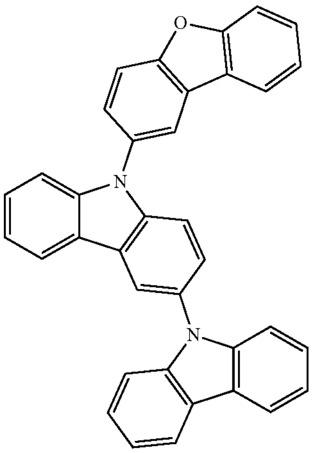

In an embodiment, the above H1-1 to H1-18 compounds may each independently have one of hydrogen atoms substituted with a deuterium atom. For example, the above H1-1 may be denoted as H1-1D below.

H1-1D

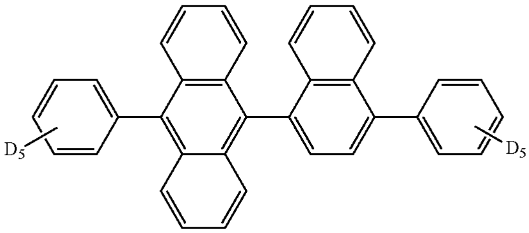

In the light emitting element OEL according to an embodiment, a light emitting dopant included in the light emitting layers EML-B and EML-Ba of the blue light emitting structures EU-B and EU-Ba may include one of the materials FD1 to FD48 listed below. However, a dopant material included in the light emitting layers EML-B and EML-Ba is not limited to the following compounds.

FD1

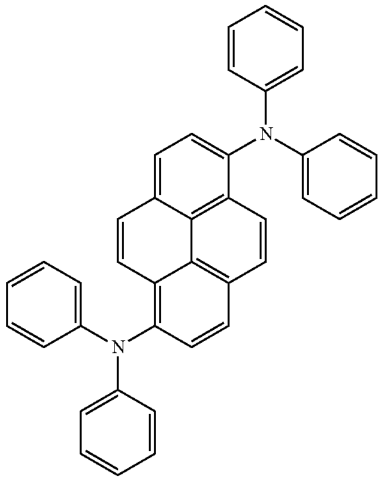

FD2

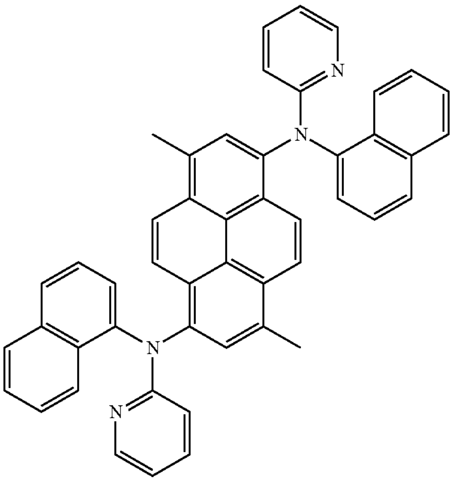

-continued
FD3
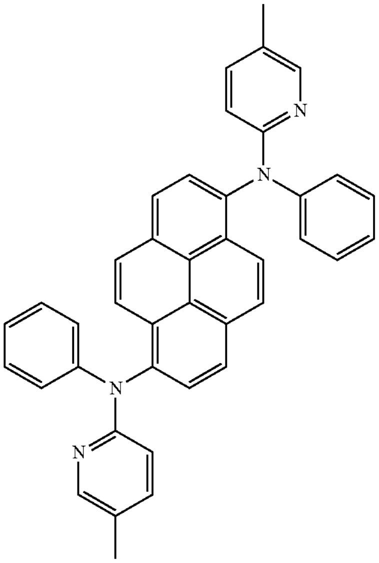
FD4
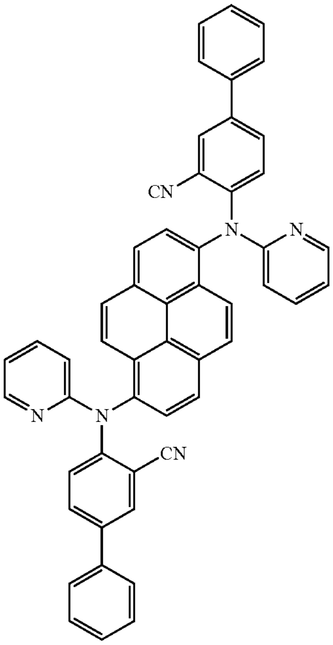
-continued
FD5
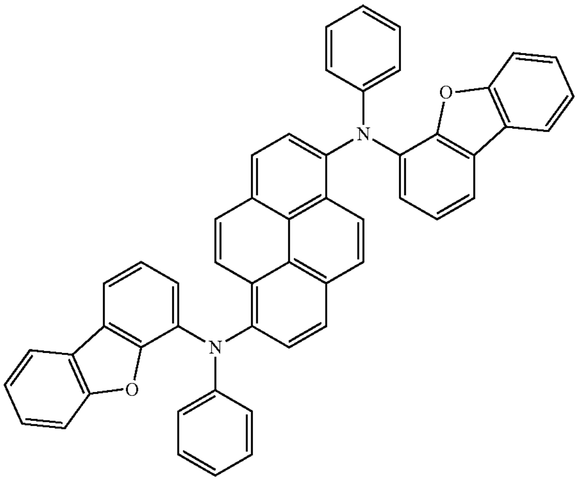
FD6
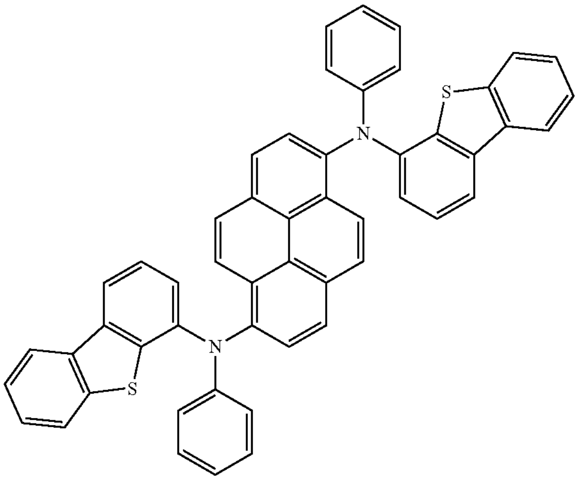
FD7
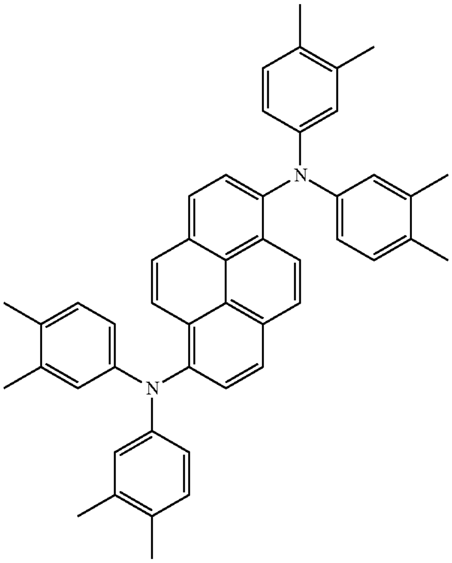

-continued
FD8
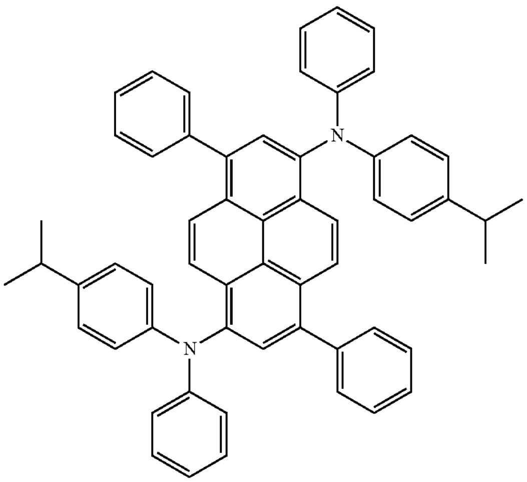
FD9
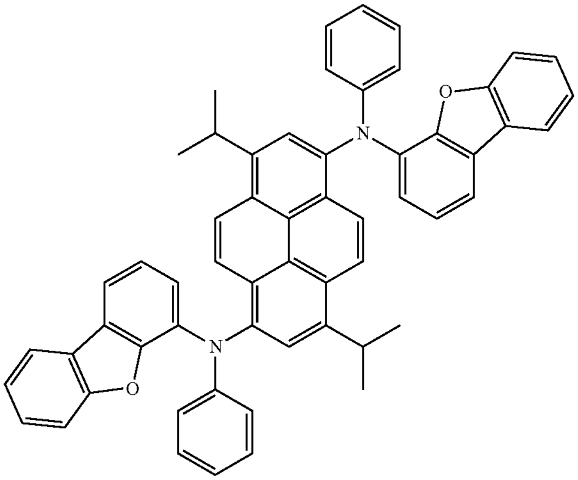
FD10
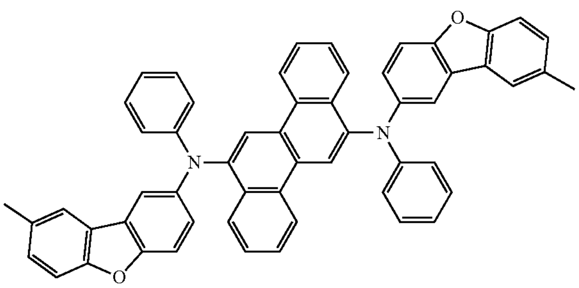
FD11
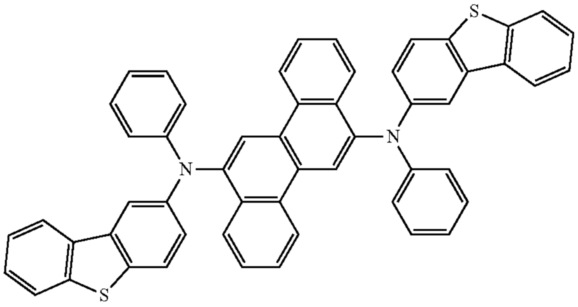
-continued
FD12
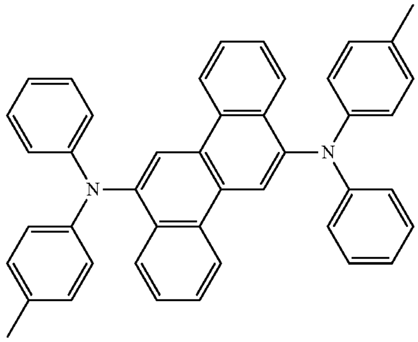
FD13
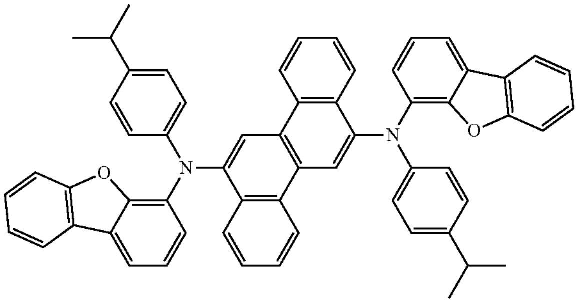
FD14
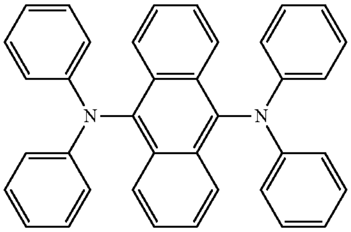
FD15
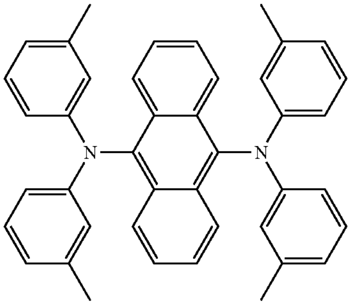
FD16
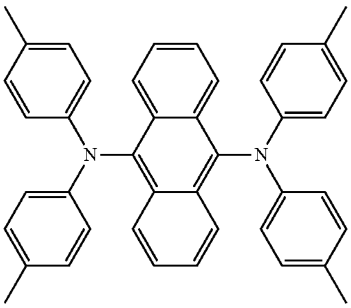

-continued
FD17
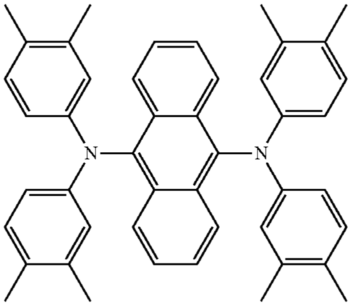
FD18
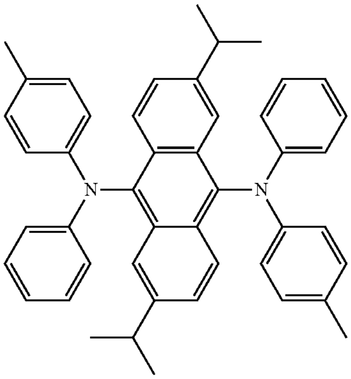
FD19
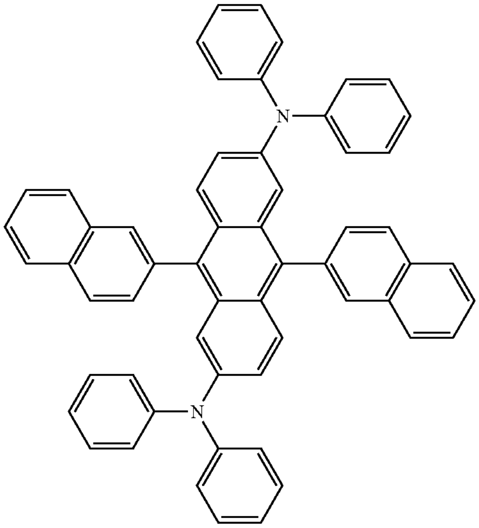
FD20
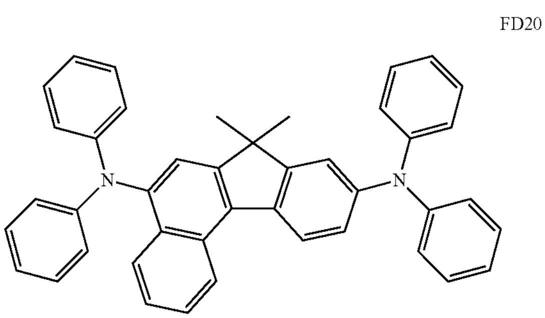
-continued
FD21
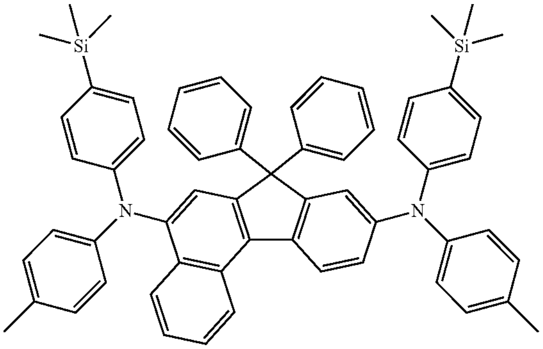
FD22
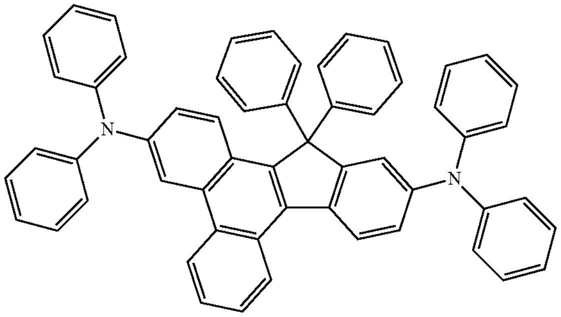
FD23
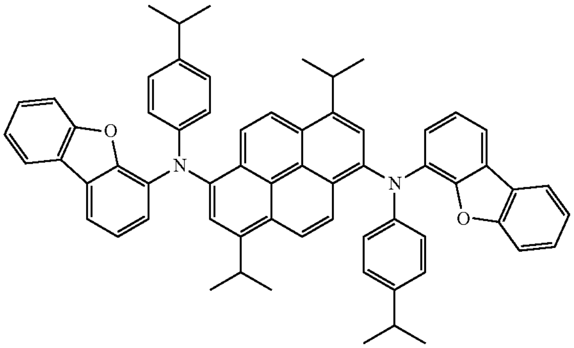
FD24
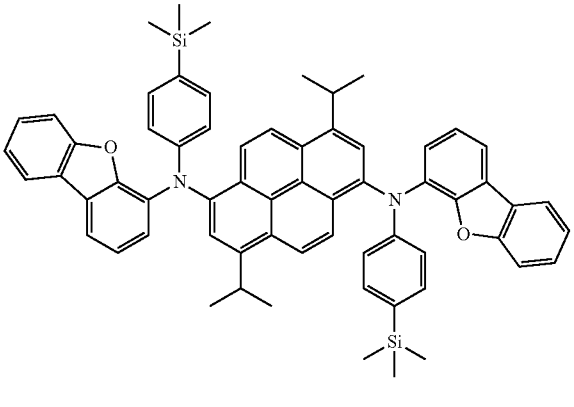

-continued
FD25
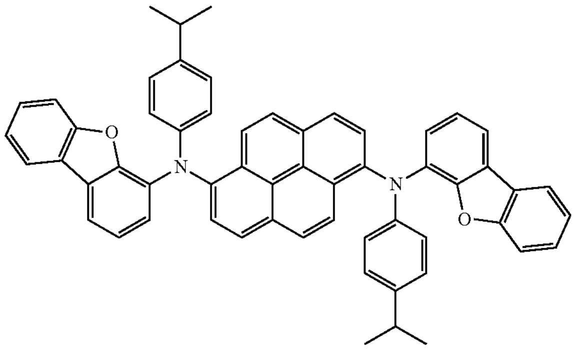
FD26
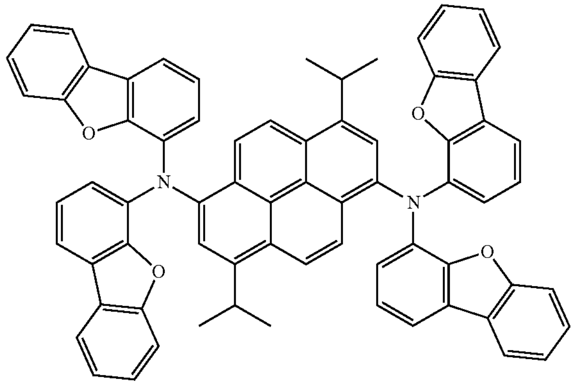
FD27
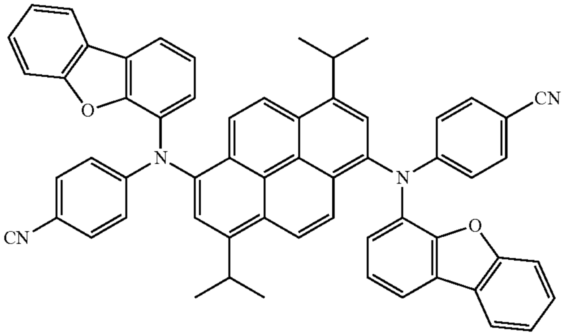
FD28
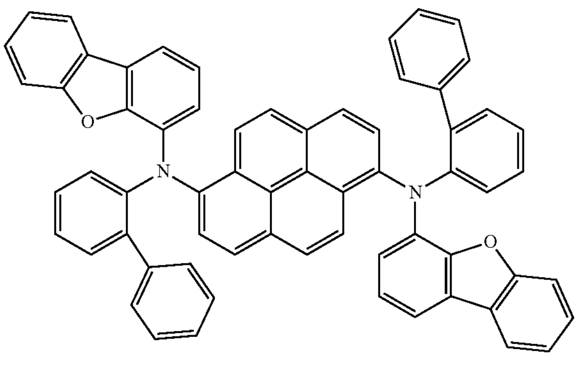
-continued
FD29
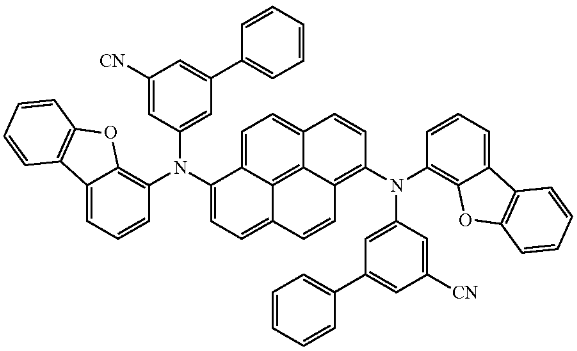
FD30
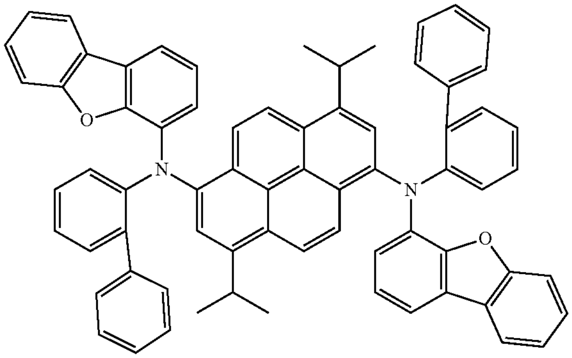
FD31
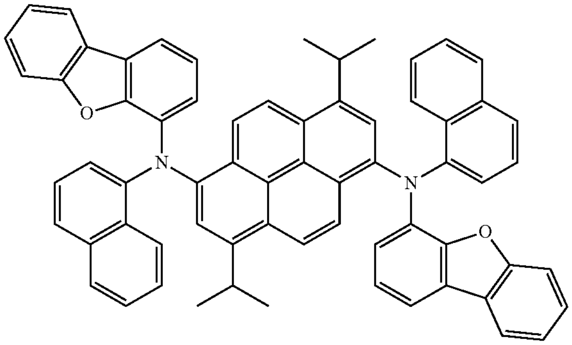
FD32
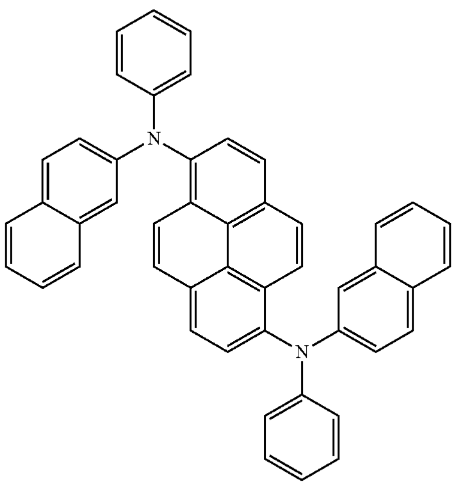

-continued
FD33
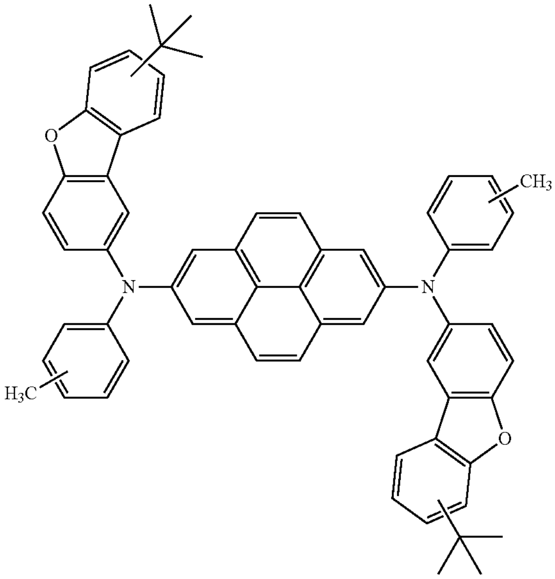
FD34
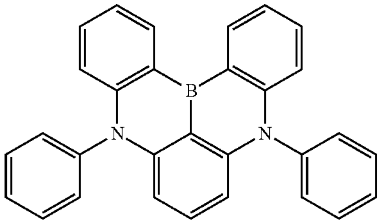
FD35
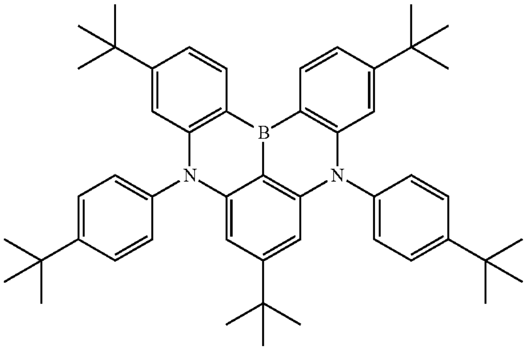
-continued
FD36
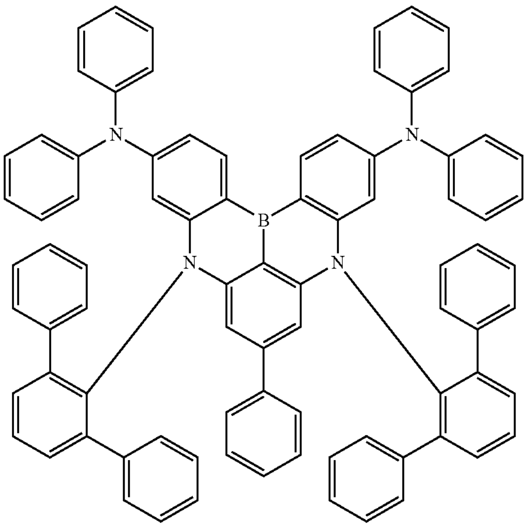
FD37
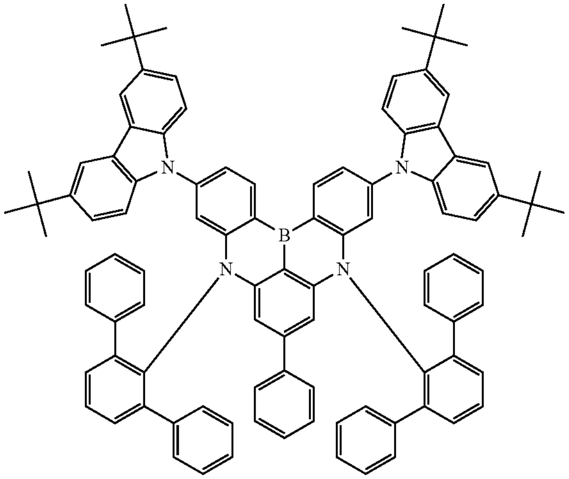

-continued
FD38
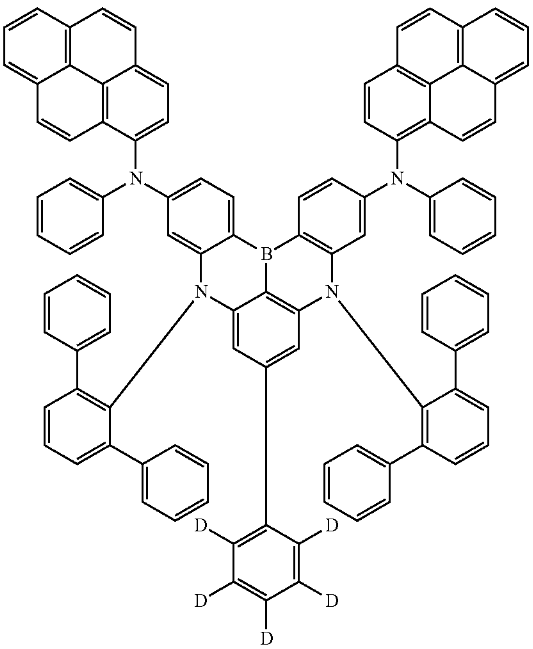
FD39
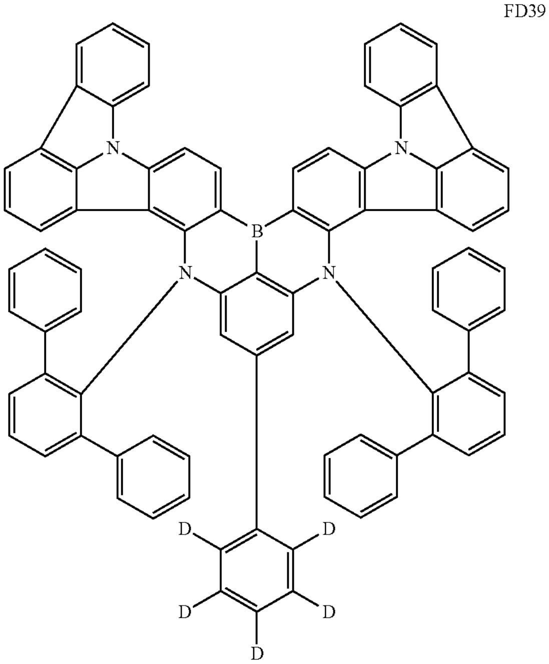
-continued
FD40
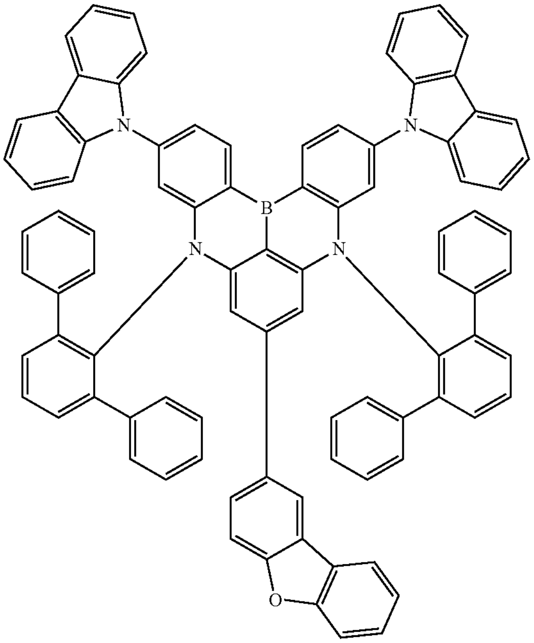
FD41
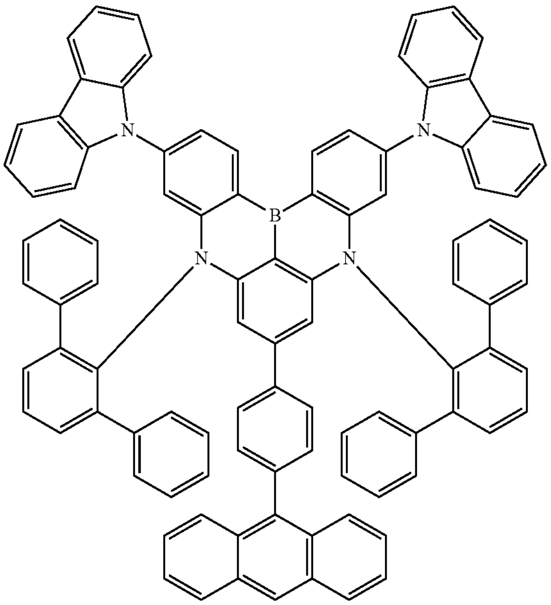

-continued
FD42
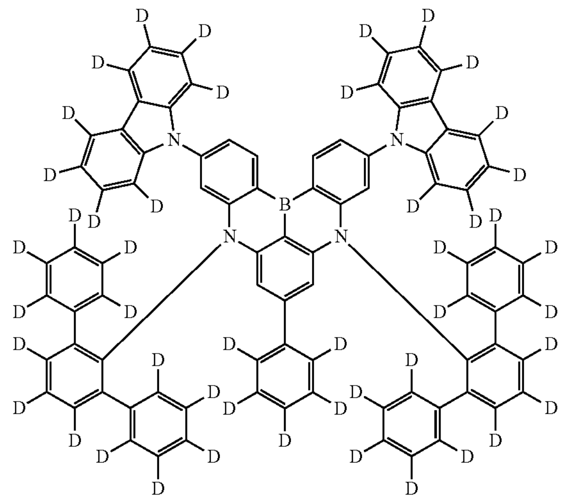
FD43
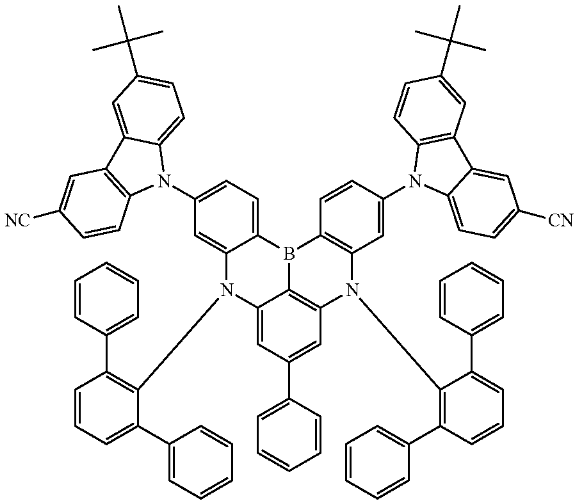
FD44
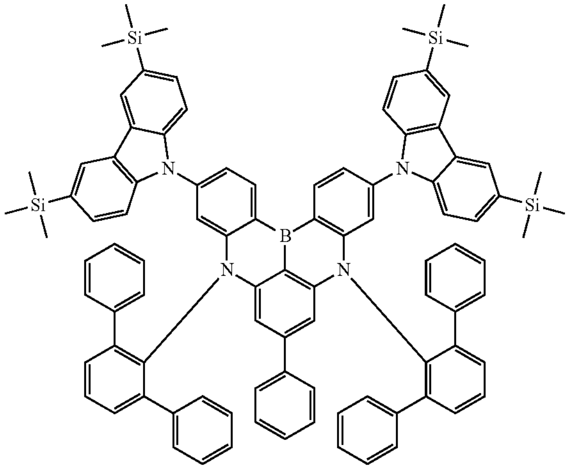
-continued
FD45
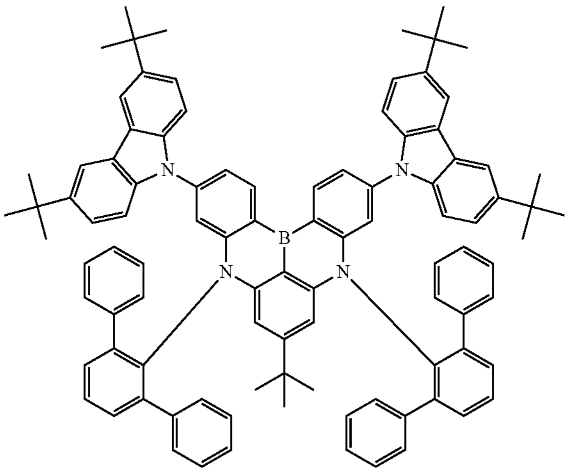
FD46
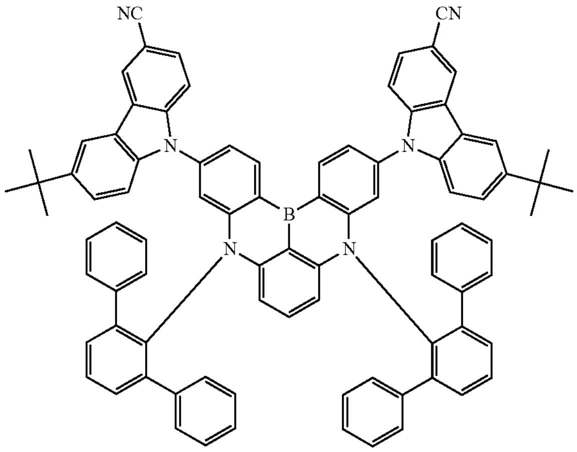
FD47
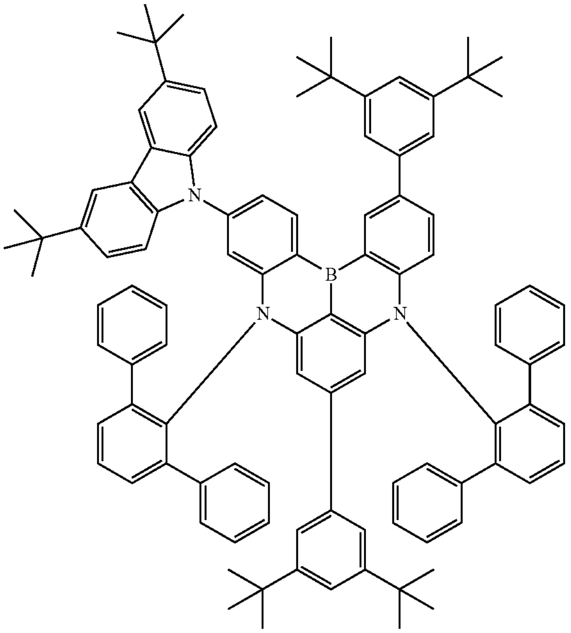

-continued

FD48

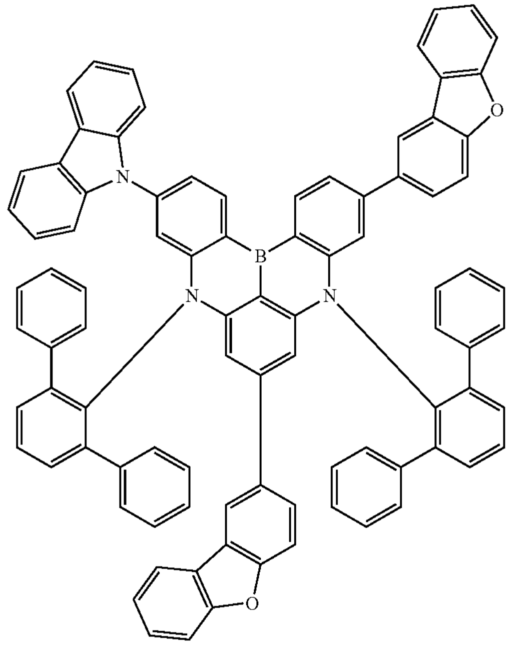

In addition to the host and dopant materials in a light emitting structure described with reference to FIG. 6A to FIG. 7B, each of the blue light emitting layers EML-B and EML-Ba and the green light emitting layers EML-G and EML-Ga may include an anthracene derivative, a pyrene derivative, a fluoranthene derivative, a chrysene derivative, a dihydrobenzanthracene derivative, a triphenylene derivative, or the like as a host material. Each of the blue light emitting layers EML-B and EML-Ba and the green light emitting layers EML-G and EML-Ga may further include a material known in the art as the host material. For example, each of the blue light emitting layers EML-B and EML-Ba and the green light emitting layers EML-G and EML-Ga may include, as a host material, at least one of Bis[2-(diphenylphosphino)phenyl]ether oxide (DPEPO), 4,4'-Bis(carbazol-9-yl)biphenyl (CBP), 1,3-Bis(n-carbazolyl)benzene (mCP), 2,8-Bis(diphenylphosphoryl)dibenzo[b,d]furan (PPF), 4,4',4"-Tris(carbazol-9-yl)-triphenylamine (TCTA), and 1,3,5-tris(1-phenyl-1H-benzo[d]imidazole-2-yl)benzene (TPBi). However, the type of the host material is not limited thereto, and for example, tris(8-hydroxyquinolino) aluminum ($Alq_3$), poly(N-vinylcarbazole (PVK), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis (triphenylsilyl)benzene (UGH2), hexaphenylcyclotrisiloxane ($DPSiO_3$), octaphenylcyclotetra siloxane ($DPSiO_4$), and the like may be used as the host material.

Referring back to FIG. 5, the light emitting structures EU-1, EU-2, EU-3, and EU-4 of the light emitting element OEL of an embodiment may include the electron transport regions ETR-1, ETR-2, ETR-3, and ETR-4. The electron transport regions ETR-1, ETR-2, ETR-3, and ETR-4 respectively included in the light emitting structures EU-1, EU-2, EU-3, and EU-4 may have a single-layered structure having a single layer formed of a single material, a single-layered structure having a single layer formed of different materials, or a multi-layered structure having multiple layers formed of multiple different materials.

The electron transport regions ETR-1, ETR-2, ETR-3, and ETR-4 may be formed by using various methods such as vacuum deposition, spin coating, casting, Langmuir-Blodgett (LB), inkjet printing, laser printing, and laser induced thermal imaging (LITI).

The electron transport regions ETR-1, ETR-2, ETR-3, and ETR-4 may include an anthracene-based compound. However, the disclosure is not limited thereto, and the electron transport regions ETR-1, ETR-2, ETR-3, and ETR-4 may include tris(8-hydroxyquinolinato)aluminum ($Alq_3$), 1,3,5-tri[(3-pyridyl)-phen-3-yl]benzene, 2,4,6-tris(biphenyl-3-yl)-1,3,5-triazine (T2T), 2,4,6-Tris(3-(pyrimidin-5-yl)phenyl)-1,3,5-triazine (TPM-TAZ), 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-Tri(1-phenyl-1H-benzo[d]imidazol-2-yl)benzene (TPBi), 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato) aluminum (Balq), berylliumbis(benzoquinolin-10-olate) ($Bebq_2$), 9,10-di(naphthalene-2-yl)anthracene (ADN), 1,3-Bis[3,5-di(pyridin-3-yl)phenyl]benzene (BmPyPhB), diphenyl(4-(triphenylsilyl)phenyl)phosphine oxide (TSPO1), or a compound thereof.

The electron transport regions ETR-1, ETR-2, ETR-3, and ETR-4 may include a halogenated metal such as LiF, NaCl, CsF, RbCl, RbI, CuI, and KI, a lanthanum group metal such as Yb, or a co-deposition material of the above halogenated metal and the lanthanum group metal. For example, the electron transport regions ETR-1, ETR-2, ETR-3, and ETR-4 may include KI:Yb, RbI:Yb, LiF:Yb, or the like as the co-deposition material. As the electron transport region ETR, a metal oxide such as $Li_2O$ and BaO, or 8-hydroxyl-Lithium quinolate (Liq) and the like may be used, but the disclosure is not limited thereto. The electron transport regions ETR-1, ETR-2, ETR-3, and ETR-4 may include a mixture of an electron transport material and an insulating organo metal salt. The organo metal salt may be a material with an energy band gap greater than or equal to approximately 4 eV. For example, the organo metal salt may include a metal acetate, a metal benzoate, a metal acetoacetate, a metal acetylacetonate, or a metal stearate.

The electron transport regions ETR-1, ETR-2, ETR-3, and ETR-4 may further include, in addition to the aforementioned materials, at least one of 2,9-dimethyl-4,7-diphenyl-1,10-phenanthroline (BCP), diphenyl(4-(triphenylsilyl)phenyl)phosphine oxide (TSPO1), and 4,7-diphenyl-1,10-phenanthroline (Bphen), but the disclosure is not limited thereto.

Referring to FIG. 6A to FIG. 7B, the electron transport region ETR may include an electron transport layer ETL and an electron injection layer EIL. The electron transport region ETR may include at least one of the electron injection layer EIL, the electron transport layer ETL, and a hole blocking layer (not shown). In an embodiment, the electron transport region ETR may have a stacked structure of the electron transport layer ETL/the electron injection layer EIL, the hole blocking layer (not shown)/the electron transport layer ETL/the electron injection layer EIL, the electron transport layer ETL/a buffer layer (not shown)/the electron injection layer EIL, or the like, but the disclosure is not limited thereto. At least one of the electron injection layer EIL, the electron transport layer ETL, or the hole blocking layer (not shown) may include the aforementioned material of the electron transport region.

In the light emitting element OEL of an embodiment illustrated in FIG. 5, at least one of the light emitting structures may include the green light emitting structures EU-G and EU-Ga according to an embodiment containing a low refractive material in the first sub-light emitting layer EML-GB, and due to the high light extraction efficiency in the green light emitting structures EU-G and EU-Ga, the light emitting element OEL may have excellent light emission efficiency properties. In the light emitting element OEL of an embodiment illustrated in FIG. 5, light emitted from the light emitting structures EU-1, EU-2, EU-3, and EU-4 may have a front-emitting light emitting structure that emits light to an upper portion of the second electrode EL2. In the front-emitting light emitting structure, the light emitting structure EU-4 adjacent to the second electrode EL2 may be a green light emitting structure containing a low refractive material in a light emitting layer.

In case that the light emitting structure EU-4 adjacent to the second electrode EL2 is a green light emitting structure, the first sub-light emitting layer EML-GB of the green light emitting structure may include a hole transporting host material having low refractive properties, and a light extraction effect may be increased without degrading electrical properties of the light emitting layer EML-G. Accordingly, the light emitting element OEL of an embodiment may have excellent light emission efficiency properties.

Figure 8:
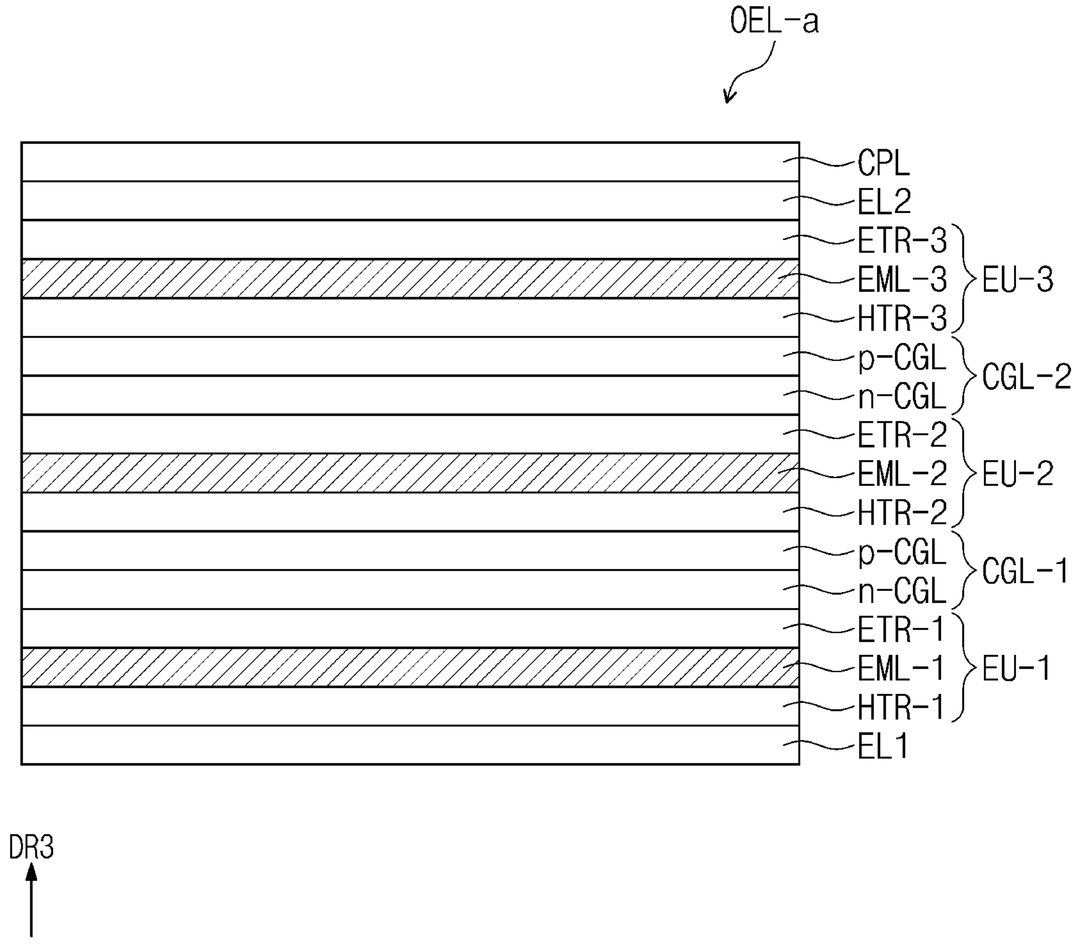
FIG. 8 is a schematic cross-sectional view of a light emitting element of an embodiment of the disclosure.
Figure 9:
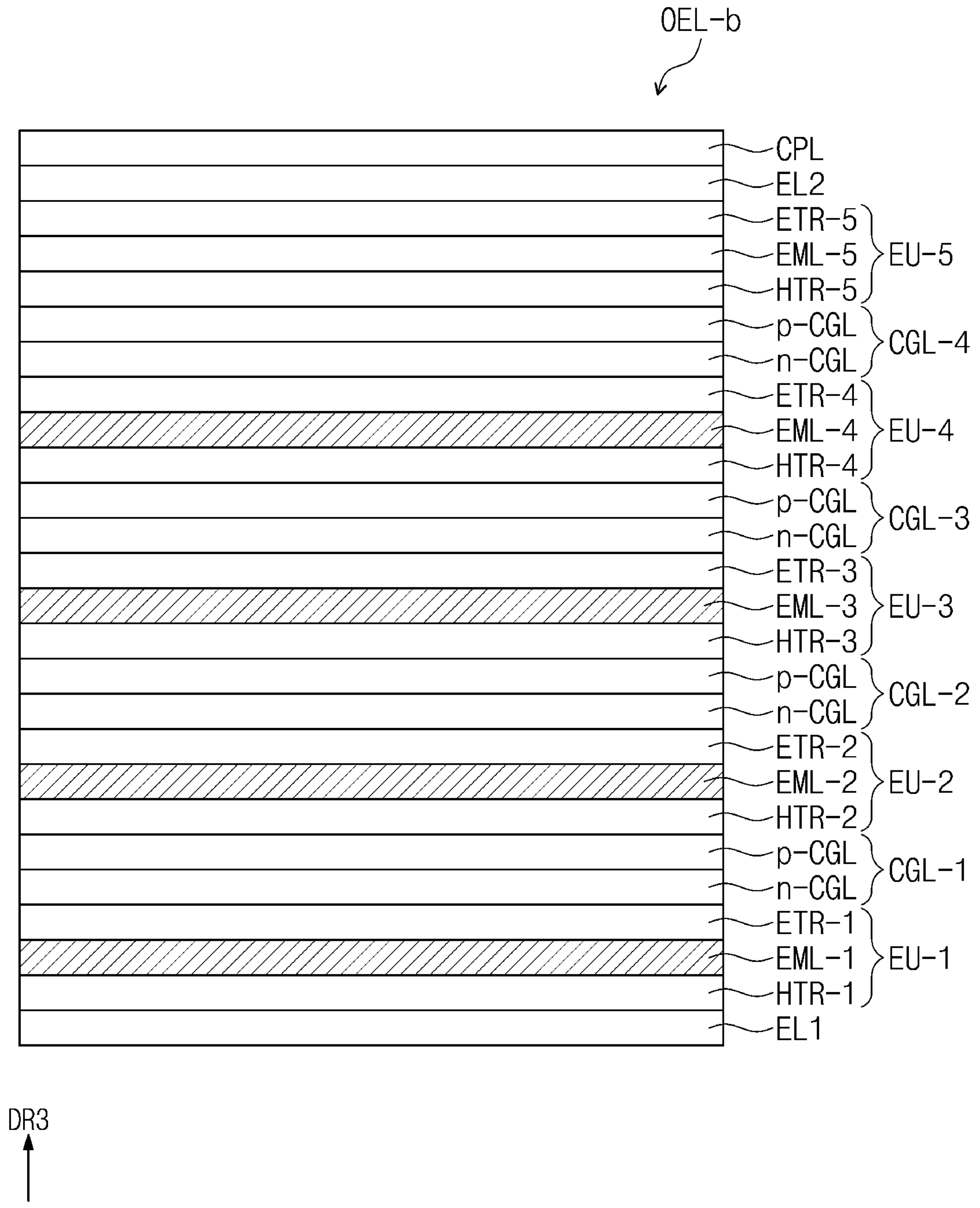
FIG. 9 is a schematic cross-sectional view of a light emitting element of an embodiment of the disclosure.

FIG. 8 and FIG. 9 are each a schematic cross-sectional view showing a light emitting element according to an embodiment of the disclosure. FIG. 8 and FIG. 9 differ from each other in the number or combination of light emitting structures included in the light emitting stack ST (see FIG. 3). In the description of each composition of light emitting elements OEL-a and OEL-b illustrated in FIG. 8 and FIG. 9, the same contents as those described with reference to FIG. 5 to FIG. 7B will not be described again, and instead, differences will be described.

Referring to FIG. 8, the light emitting element OEL-a of an embodiment may include a first electrode EL1, a second electrode EL2 facing the first electrode EL1, multiple light emitting structures EU-1, EU-2, and EU-3 disposed between the first electrode EL1 and the second electrode EL2, and charge generating layers CGL-1 and CGL-2 disposed between the light emitting structures EU-1, EU-2, and EU-3. A first charge generating layer CGL-1 may be disposed between a first light emitting structure EU-1 and a second light emitting structure EU-2, and a second charge generating layer CGL-2 may be disposed between the second light emitting structure EU-2 and a third light emitting structure EU-3. The first charge generating layer CGL-1 and the second charge generating layer CGL-2 may each include an n-type charge generating layer n-CGL and a p-type charge generating layer p-CGL. The light emitting element OEL-a may include a capping layer CPL disposed on the second electrode EL2.

One of the light emitting structures EU-1, EU-2, and EU-3 of the light emitting element OEL-a of an embodiment may be a green light emitting structure EU-G or EU-Ga (see FIG. 6A and FIG. 6B), and the rest of the light emitting structures may be blue light emitting structures EU-B and EU-Ba (see FIG. 7A and FIG. 7B). In the structure of the light emitting element OEL-a in which light is emitted in an upper surface direction of the second electrode EL2, the third light emitting structure EU-3 may correspond to the green light emitting structures EU-G and EU-Ga described with reference to FIG. 6A or FIG. 6B, and the first light emitting structure EU-1 and the second light emitting structure EU-2 may respectively correspond to the blue light emitting structures EU-B and EU-Ba described with reference to FIG. 7A or FIG. 7B.

The light emitting element OEL-a of an embodiment may include the first light emitting structure EU-1 and the second light emitting structure EU-2 disposed between the first electrode EL1 and the second electrode EL2 and being blue light emitting structures, and may include the third light emitting structure EU-3 disposed on the second light emitting structure EU-2 and being a green light emitting structure, wherein the third light emitting structure EU-3 may include a light emitting layer containing a low refractive material. Accordingly, the light emitting element OEL-a of an embodiment may include a low refractive material in a first sub-light emitting layer EML-GB (see FIG. 6A or FIG. 6B) of the third light emitting structure EU-3, which is a green light emitting structure, and thus, may have excellent light emission efficiency in accordance with an increase in the light extraction effect in the light emitting structure EU-3. The third light emitting structure EU-3 may include a low refractive host material having low refractive properties in a sub-light emitting layer adjacent to a hole transport region, and thus, may maintain electrically good properties and may have an optical effect of improved light extraction. Accordingly, the light emitting element OEL-a of an embodiment may have high light efficiency properties.

Referring to FIG. 9, the light emitting element OEL-b of an embodiment may include a first electrode EL1, a second electrode EL2 facing the first electrode EL1, multiple light emitting structures EU-1, EU-2, EU-3, EU-4, and EU-5 disposed between the first electrode EL1 and the second electrode EL2, and charge generating layers CGL-1, CGL-2, CGL-3, and CGL-4 disposed between the light emitting structures EU-1, EU-2, EU-3, EU-4, and EU-5. A first charge generating layer CGL-1 may be disposed between a first light emitting structure EU-1 and a second light emitting structure EU-2, a second charge generating layer CGL-2 may be disposed between the second light emitting structure EU-2 and a third light emitting structure EU-3, a third charge generating layer CGL-3 may be disposed between the third light emitting structure EU-3 and a fourth light emitting structure EU-4, and a fourth charge generating layer CGL-4 may be disposed between the fourth light emitting structure EU-4 and a fifth light emitting structure EU-5. The first charge generating layer to the fourth charge generating layer CGL-1, CGL-2, CGL-3, and CGL-4 may each include an n-type charge generating layer n-CGL and a p-type charge generating layer p-CGL. The light emitting element OEL-b may include a capping layer CPL disposed on the second electrode EL2.

At least one of the light emitting structures EU-1, EU-2, EU-3, EU-4, and EU-5 of the light emitting element OEL-b of an embodiment may be a green light emitting structure EU-G or EU-Ga (see FIG. 6A and FIG. 6B), and the rest of the light emitting structures may be blue light emitting structures EU-B and EU-Ba (see FIG. 7A and FIG. 7B). In an embodiment, two of the light emitting structures EU-1, EU-2, EU-3, EU-4, and EU-5 of the light emitting element OEL-b may be green light emitting structures, and the rest of the light emitting structures may be blue light emitting structures.

In the structure of the light emitting element OEL-b in which light is emitted in an upper surface direction of the second electrode EL2, the third light emitting structure EU-3 and the fifth light emitting structure EU-5 may each be a green light emitting structure. The third light emitting structure EU-3 may be referred to as a first green light emitting structure, and the fifth light emitting structure EU-5 may be referred to as a second green light emitting structure.

The first light emitting structure EU-1, the second light emitting structure EU-2, and the fourth light emitting structure EU-4 may correspond to the blue light emitting structures EU-B and EU-Ba described with reference to FIG. 7A or FIG. 7B, respectively.

The light emitting element OEL-b of an embodiment may include light emitting structures disposed in the order of a blue light emitting structure, a blue light emitting structure, a green light emitting structure, a blue light emitting structure, and a green light emitting structure in the thickness direction, which is the third direction axis DR3 direction, between the first electrode EL1 and the second electrode EL2.

In an embodiment, both the third light emitting structure EU-3 and the fifth light emitting structure EU-5 may be light emitting structures which emit green light, and the fifth light emitting structure EU-5 (or the second green light emitting structure) thereof may correspond to the green light emitting structures EU-G and EU-Ga described with reference to FIG. 6A or FIG. 6B. For example, in the light emitting element OEL-b of an embodiment, the fifth light emitting structure EU-5 disposed adjacent to the second electrode EL2 may include the green light emitting structures EU-G and EU-Ga (see FIG. 6A and FIG. 6B) according to the above-described embodiment. For example, the fifth light emitting structure EU-5 may include a hole transport region HTR-5, a light emitting layer EML-5, and an electron transport region ETR-5. The fifth light emitting structure EU-5 may include the green light emitting structures EU-G and EU-Ga (see FIG. 6A and FIG. 6B) including a first sub-light emitting layer EML-GB (see FIG. 6A and FIG. 6B) containing a low refractive material, and thus, may have a high light extraction effect, and accordingly, the light emitting element OEL-b of an embodiment may have excellent light emission efficiency properties.

The light emitting element OEL-b of an embodiment may also include the green light emitting structures EU-G and EU-Ga (see FIG. 6A and FIG. 6B) including the first sub-light emitting layer EML-GB (see FIG. 6A and FIG. 6B) containing a low refractive material in the third light emitting structure EU-3 other than the fifth light emitting structure EU-5. Since the fifth light emitting structure EU-5 and the third light emitting structure EU-3 each include the green light emitting structures EU-G and EU-Ga (see FIG. 6A and FIG. 6B) including the first sub-light emitting layer EML-GB (see FIG. 6A and FIG. 6B) including a low refractive material, the fifth light emitting structure EU-5 and the third light emitting structure EU-3 may have a high light extraction efficiency effect. The fifth light emitting structure EU-5 and the third light emitting structure EU-3 may include a low refractive host material having low refractive properties in a sub-light emitting layer adjacent to a hole transport region, and thus, may maintain electrically good properties and may have an optical effect of improved light extraction. Accordingly, the light emitting element OEL-b of an embodiment may have excellent light emission efficiency properties.

Among multiple light emitting structures included in the light emitting elements OEL, OEL-a, and OEL-b described with reference to FIG. 5, FIG. 7, and FIG. 8, a light emitting structure which emits blue light may not include a low refractive material in a light emitting layer. For example, among the light emitting structures included in the light emitting elements OEL, OEL-a, and OEL-b, the light emitting layer of the light emitting structure which emits blue light may not include a host material having low refractive properties.

A light emitting element of an embodiment may include multiple light emitting structures, and may include a low refractive material in a light emitting layer of a light emitting structure which emits green light among the light emitting structures. In an embodiment, a low refractive material may be included in a light emitting layer spaced apart from an electron transport region among sub-light emitting layers included in a light emitting layer of a green light emitting structure positioned at a relatively upper portion in a light extraction direction among multiple light emitting structures staked. In an embodiment, a hole transporting host material having low refractive properties may be included in a light emitting layer spaced apart from an electron transport region among sub-light emitting layers included in a light emitting layer of a green light emitting structure to have high light extraction efficiency without degrading electrical properties in the light emitting layer, and a light emitting element may have excellent light emission efficiency.

Hereinafter, with reference to Examples and Comparative Examples, results of the evaluation of properties of a light emitting element according to an embodiment of the disclosure will be described. Examples shown below are for illustrative purposes only to facilitate the understanding of the disclosure, and thus, the scope of the disclosure is not limited thereto.

<Manufacturing of Light Emitting Element>

The light emitting element of each of Examples 1-1 to 1-3, Example 2, and Comparative Example 1 to Comparative Example 7 was manufactured as a tandem light emitting element by forming a first electrode on a glass substrate, and forming four light emitting structures on the first electrode, and a charge generating layer disposed between the four light emitting structures, and forming a second electrode and a capping layer.

The tandem light emitting element of each of Examples and Comparative Examples was manufactured based on the light emitting element structure illustrated in FIG. 5.

A charge generating layer including an n-type charge generating layer and a p-type charge generating layer was provided between each of the stacked light emitting structures. 2,9-Dimethyl-4,7-diphenyl-1,10-phenanthroline (BCP) was doped with Li to form the n-type charge generating layer. In the n-type charge generating layer, BCP and Li were provided at a weight ratio of 90:10. The n-type charge generating layer was formed to a thickness of 65 Å.

On the n-type charge generating layer, a p-type charge generating layer was formed with 1,4,5,8,9,11-Hexaazatriphenylenehexacarbonitrile (HATCN). The p-type charge generating layer was formed to a thickness of 50 Å.

The first electrode was formed to have the structure of ITO/Ag/ITO, and the second electrode was formed with AgMg. In the first to third light emitting structures EU-1, EU-2, and EU-3 (see FIG. 5), a hole transport region was manufactured by forming N,N'-Di(1-naphthryl)-N,N'-diphenyl-(1,1'-biphenyl)-4,4'-diamine) (NPB) to a thickness of 250 Å, and forming 4,4',4"-tris(N-carbazolyl) triphenylamine (TCTA) to a thickness of 75 Å on the NPB layer. In the fourth light emitting structure EU-4, a hole transport area was formed to a thickness of 50 Å by including NPB.

In the first to third light emitting structures EU-1, EU-2, and EU-3 (see FIG. 5), an electron transport region was formed by including a 50 Å thick 2,4,6-tris(biphenyl-3-yl)-

1,3,5-triazine (T2T) layer and a 100 Å thick layer co-deposited by adding Liq to 2,4,6-Tris(3-(pyrimidin-5-yl) phenyl)-1,3,5-triazine (TPM-TAZ). In the electron transport region, TPM-TAZ and Liq were included at a weight ratio of 5:5.

In the fourth light emitting structure EU-4 (see FIG. 5) disposed at the uppermost portion, an electron transport region was formed to include a 570 Å thick layer co-deposited by adding Liq to TPM-TAZ, and a 10 Å thick layer including Yb.

Each layer of the light emitting structures was formed by deposition under vacuum conditions. On the second electrode, P4 was used to form a capping layer having a thickness of 500 Å.

The structure of each of the light emitting structures in Examples and Comparative Examples is as follows.

EML-Ba' corresponds to the configuration of a blue light emitting layer further including an additional auxiliary light emitting layer in addition to the configuration of the lower sub-light emitting layer and the upper sub-light emitting layer of EML-Ba. The auxiliary light emitting layer is disposed on a lower side of the lower sub-light emitting layer, and corresponds to the configuration of a light emitting layer including a low refractive material, the first blue host, and the first blue dopant. In the auxiliary light emitting layer, the ratio of the total weight of the low refractive material and the first blue host and the weight of the first blue dopant is 99:1, and in the light emitting layer, the low refractive material and the first blue host were included in the same weight ratio of 1:1.

EML-G has a green light emitting structure included in the light emitting element of an embodiment. EML-G is the

TABLE 1

| Classifications | EU-1 | EU-2 | EU-3 | EU-4 |
|---|---|---|---|---|
| Example 1-1 | HTR/EML-Ba/ETR | HTR/EML-Ba/ETR | HTR/EML-Ba/ETR | HTR/EML-G/ETR |
| Example 1-2 | HTR/EML-Ba/ETR | HTR/EML-Ba/ETR | HTR/EML-Ba/ETR | HTR/EML-G/ETR |
| Example 1-3 | HTR/EML-Ba/ETR | HTR/EML-Ba/ETR | HTR/EML-Ba/ETR | HTR/EML-G/ETR |
| Example 2 | HTR/EML-Ba/ETR | HTR/EML-Ba/ETR | HTR/EML-Ba/ETR | HTR-L/EML-G/ETR |
| Comparative Example 1 | HTR/EML-Ba/ETR | HTR/EML-Ba/ETR | HTR/EML-Ba/ETR | HTR/EML-G'/ETR |
| Comparative Example 2 | HTR/EML-Ba/ETR | HTR/EML-Ba/ETR | HTR/EML-Ba/ETR | HTR-L/EML-G'ETR |
| Comparative Example 3 | HTR/EML-Ba'/ETR | HTR/EML-Ba/ETR | HTR/EML-Ba/ETR | HTR-L/EML-G'/ETR |
| Comparative Example 4 | HTR/EML-Ba/ETR | HTR/EML-Ba'/ETR | HTR/EML-Ba/ETR | HTR-L/EML-G'ETR |
| Comparative Example 5 | HTR/EML-Ba/ETR | HTR/EML-Ba/ETR | HTR/EML-Ba'/ETR | HTR-L/EML-G'ETR |
| Comparative Example 6 | HTR/EML-Ba/ETR | HTR/EML-Ba/ETR | HTR/EML-Ba/ETR | HTR-L/EML-G"/ETR |
| Comparative Example 7 | HTR/EML-Ba/ETR | HTR/EML-Ba/ETR | HTR/EML-Ba/ETR | HTR-L/EML-G'"/ETR |

In Table 1, one denoted with HTR or HTR-L in each light emitting structure corresponds to the configuration of a hole transport region, and ETR corresponds to the configuration of an electron transport region. One denoted with EML-Ba or EML-Ba' corresponds to the configuration of a blue light emitting layer, and those denoted with EML-G, EML-G', and EML-G" correspond to the configuration of a green light emitting layer.

In Table 1, one denoted with HTR corresponds to NPB formed to a thickness of 50 Å. HTR-L corresponds to the configuration including an NPB layer formed with NPB to a thickness of 50 Å, and an auxiliary hole transport layer formed with a low refractive hole transport material (LRM) to a thickness of 200 Å on an upper side of the NPB layer.

In the light emitting structures of EU-1 to EU-3, ETR was co-deposited by adding Liq to TPM-TAZ. In ETR, TPM-TAZ and Liq were included at a weight ratio of 5:5. In the light emitting structures of EU-1 to EU-3, ETR was provided to a thickness of 100 Å. In the light emitting structure of EU-4, ETR was provided to include a 570 Å thick layer in which TPM-TAZ and Liq were co-deposited at a weight ratio of 5:5 and a 10 Å thick layer including Yb.

EML-Ba corresponds to the configuration of a blue light emitting layer including two sub-light emitting layers. EML-Ba corresponds to the configuration including a lower sub-light emitting layer formed to a thickness of 85 Å by co-depositing a first blue host and a first blue dopant at a weight ratio of 99:1, and an upper sub-light emitting layer formed to a thickness of 85 Å by co-depositing a second blue host and the first blue dopant at a weight ratio of 99:1.

configuration which includes a first sub-light emitting layer including a low refractive material, a hole transporting first host H4-12, an electron transporting second host H3-23, and a green light emitting dopant PD13, and a second sub-light emitting layer disposed on the first sub-light emitting layer and including a hole transporting first host, an electron transporting second host, and a green light emitting dopant.

In the first sub-light emitting layer, the ratio of the host weight, which is the sum of the weights of the low refractive material, the hole transporting first host, and the electron transporting second host, and the weight of the green light emitting dopant corresponds to 91:9. The weight ratio of the low refractive material, the hole transporting first host, and the electron transporting second host is 1:0.5:0.5. In Example 1-1 to Example 1-3, the thickness of the first sub-light emitting layer is 187 Å, 140 Å, and 93 Å, respectively. In Example 2, the thickness of the first sub-light emitting layer is 140 Å.

In the second sub-light emitting layer, the ratio of the host weight, which is the sum of the weights of the hole transporting first host and the electron transporting second host, and the weight of the green light emitting dopant corresponds to 91:9. The weight ratio of the hole transporting first host and the electron transporting second host is 1:1. In Example 1-1 to Example 1-3, the thickness of the second sub-light emitting layer is 93 Å, 140 Å, and 187 Å, respectively. In Example 2, the thickness of the second sub-light emitting layer is 140 Å.

EML-G' corresponds to the configuration of a green light emitting layer not including a low refractive material. EML- G' includes a hole transporting first host, an electron transporting second host, and a green light emitting dopant. The ratio of the host weight, which is the sum of the weights of the hole transporting first host and the electron transporting second host, and the weight of the green light emitting dopant corresponds to 91:9. The weight ratio of the hole transporting first host and the electron transporting second host is 1:1. The thickness of EML-G' is 250 Å.

Compared to EML-G, EML-G" corresponds to the configuration which forms a single green light emitting layer without being separated into sub-light emitting layers. EML-G" is a single layer and has a thickness of 250 Å. EML-G" includes a hole transporting first host, an electron transporting second host, and a green light emitting dopant, and the ratio of the host weight, which is the sum of the weights of the hole transporting first host and the electron transporting second host, and the weight of the green light emitting dopant corresponds to 91:9. The weight ratio of the hole transporting first host and the electron transporting second host is 1:1.

EML-G'" corresponds to the configuration of a green light emitting layer including two sub-light emitting layers. EML-G" includes a lower sub-light emitting layer disposed adjacent to the hole transport region HTR-L and an upper sub-light emitting layer disposed on the lower sub-light emitting layer. The lower sub-light emitting layer includes a hole transporting first host, an electron transporting second host, and a green light emitting dopant, and the upper sub-light emitting layer includes a low-refractive material, a hole transporting first host, an electron transporting second host, and a green light emitting dopant. The thickness of each of the upper sub-light emitting layer and the lower sub-light emitting layer is 125 Å. In the lower sub-light emitting layer, the ratio of the host weight, which is the sum of the weights of the hole transporting first host and the electron transporting second host, and the weight of the green light emitting dopant corresponds to 91:9. The weight ratio of the hole transporting first host and the electron transporting second host is 1:1.

In the upper sub-light emitting layer, the ratio of the host weight, which is the sum of the weights of the low refractive material, the hole transporting first host, and the electron transporting second host, and the weight of the green light emitting dopant corresponds to 91:9. The weight ratio of the low refractive material, the hole transporting first host, and the electron transporting second host is 1:0.5:0.5.

The compounds used in the preparation of Examples and Comparative Examples are as follows.

HATCH

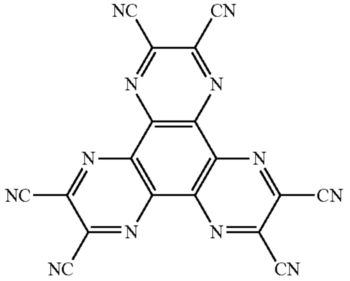

-continued

NPB

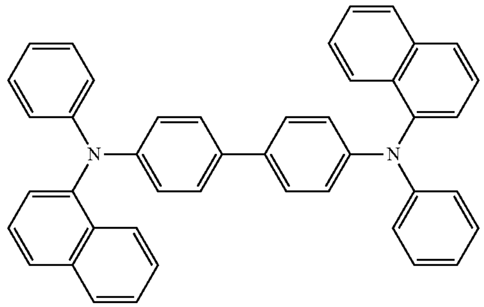

HATCH

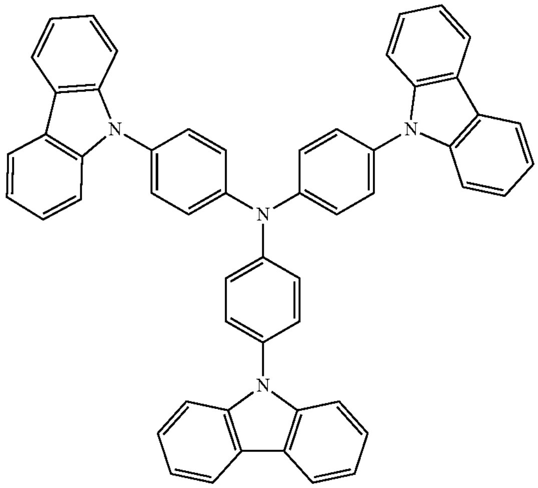

T2T

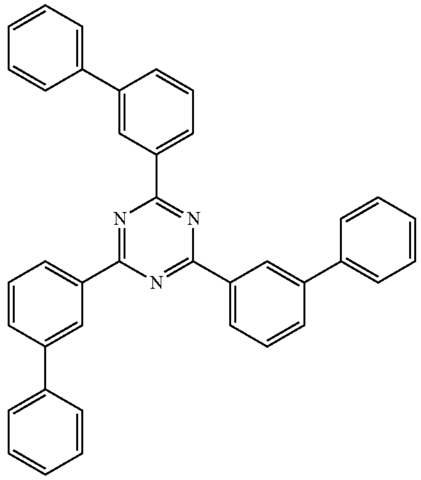

-continued
TPM-TAZ
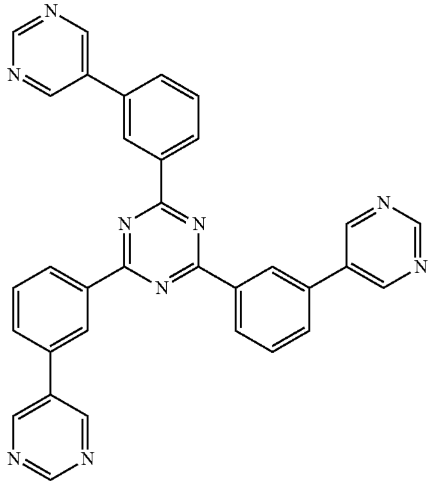
BCP
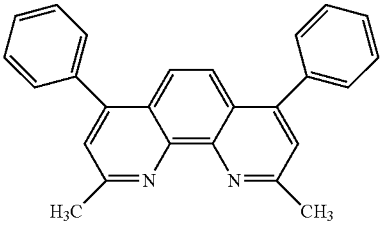
BH1
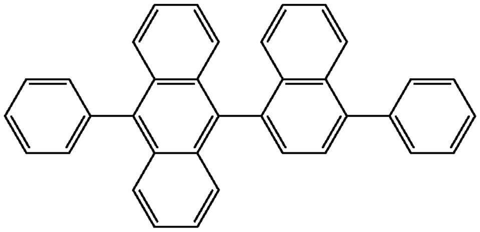
BH2
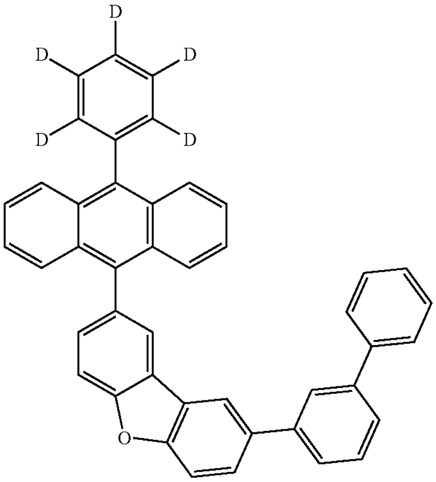
-continued
FD32
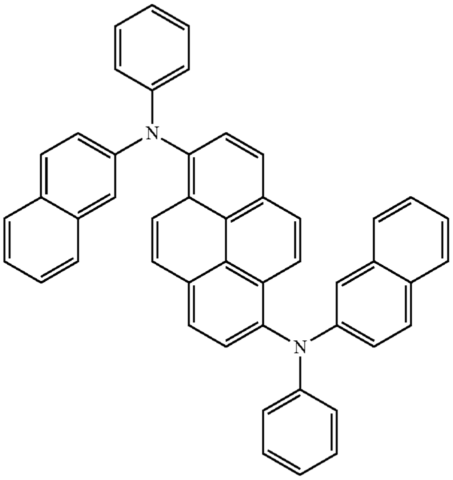
P4
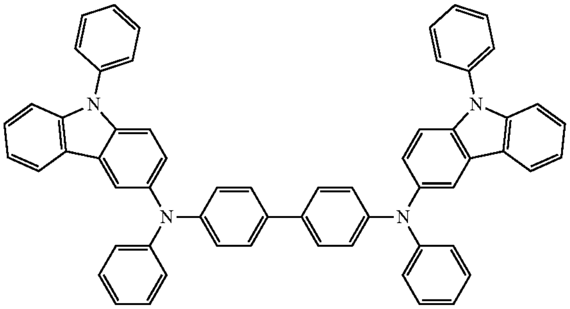
H4-12
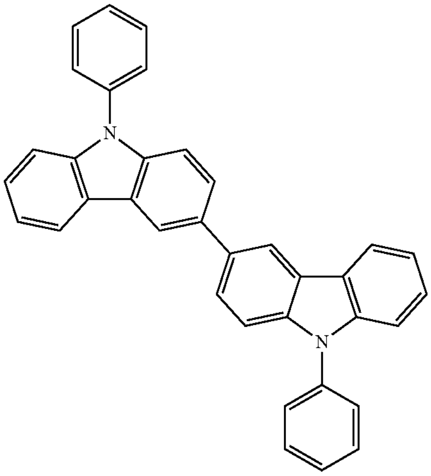

-continued

H3-23

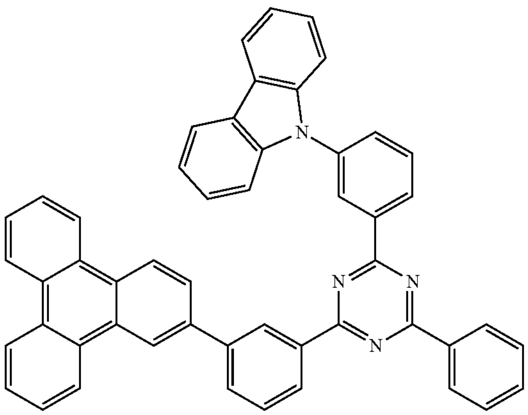

PD13

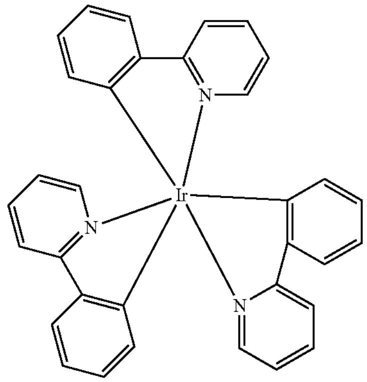

LRM

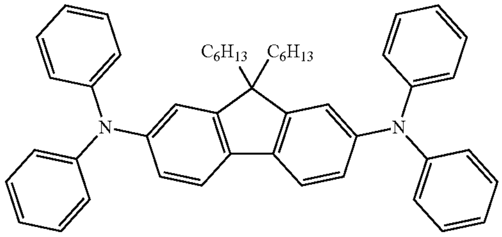

<Evaluation of Light Emitting Element>

The evaluation results of Examples 1-1 to 1-3, Example 2, and Comparative Example 1 to Comparative Example 7 are shown in Table 2. In the evaluation results of the light emitting elements in Table 2, the light emission efficiency and the driving voltage are expressed as relative comparison values after measuring the light emission efficiency and the driving voltage corresponding to a luminance of 3500 nit. The light emission efficiency is expressed as a relative comparison value by setting the light emission efficiency of Comparative Example 2 to 100%, and the driving voltage is expressed as a relative comparison value by setting the driving voltage of Comparative Example 1 to 100%.

TABLE 2

| Classifications | Light emission efficiency (%) | Driving voltage (%) |
|---|---|---|
| Example 1-1 | 102 | 98 |
| Example 1-2 | 105 | 97 |
| Example 1-3 | 103 | 96 |
| Example 2 | 101 | 99 |
| Comparative Example 1 | 97 | 100 |
| Comparative Example 2 | 100 | 99 |
| Comparative Example 3 | 95 | 99 |
| Comparative Example 4 | 94 | 99 |
| Comparative Example 5 | 97 | 98 |
| Comparative Example 6 | 94 | 101 |
| Comparative Example 7 | 95 | 102 |

Referring to Table 2, it can be seen that Examples 1-1 to 1-3 and Example 2 show excellent light emission efficiency properties compared to Comparative Examples. It can be confirmed that Examples 1-1 to 1-3 and Example 2 show low driving voltage properties or similar driving voltage properties compared to Comparative Examples.

Compared to Comparative Example 1, which includes a green light emitting structure not having a low refractive material, Examples showed high light emission efficiency properties and low driving voltage properties. Compared to Comparative Example 2, which includes a low refractive hole transport material in a hole transport region, Examples showed high light emission efficiency properties and low driving voltage properties.

Compared to Comparative Example 1 or Comparative Example 2, Examples showed an effect of increasing light emission efficiency by 3% to 5% or greater while having low driving voltage properties. This is determined to be due to the fact that in the case of Examples which includes a light emitting layer containing a low refractive material in a green light emitting structure in a light emitting element, light extraction from the light emitting layer by the low refractive material was increased. For example, Examples include a low refractive material in a sub-light emitting layer constituting a light emitting layer, and thus, may show light emission efficiency properties improved by an optical effect such as increased light extraction.

Comparative Example 3 to Comparative Example 5 have a light emitting element structure in which a blue light emitting layer containing a low refractive material is included in one blue light emitting structure among blue light emitting structures. Compared to Examples including a low refractive material in a green light emitting structure, the light emission efficiency properties were degraded in the case of Comparative Example 3 to Comparative Example 5, and the driving voltage was also higher than that of Examples. In the case of Comparative Example 3 to Comparative Example 5, it can be seen that the light emission efficiency is decreased by about 3% to 5% compared to that of Comparative Example 1 to Comparative Example 2. For example, in case that the blue light emitting layer includes a low refractive material, it is determined that the degradation in electrical properties is greater than the improvement of an optical effect such as light extraction, and as a result, the light emission efficiency is decreased.

In Comparative Example 6, a green light emitting layer is provided as a single layer and the green light emitting layer provided as a single layer includes a low refractive material, and Comparative Example 7 differs from Examples in that an upper sub-light emitting layer among sub-light emitting layers of a green light emitting layer includes a low refractive material. Compared to Examples, Comparative Example 6 and Comparative Example 7 showed significantly degraded light emission efficiency properties, and high driving voltage properties. This is determined to be due to the fact that a low refractive material is included adjacent to the electron transport region ETR of a green light emitting structure, and hole transporting properties of the low refractive material prevents electrons provided from the electron transport region from being injected into a light emitting layer.

Therefore, by comparing the results of Examples and the results of Comparative Example 1 to Comparative Example 7, it can be said that in a stacked structure of the same light emitting structures, in case that a low refractive material is included in a sub-light emitting layer adjacent to a hole transport region among light emitting layers of a green light emitting structure, excellent light emitting efficiency is shown in accordance with increased light extraction efficiency.

A light emitting element of an embodiment may include multiple light emitting structures, and may include a material having low refractive properties in a light emitting layer of a light emitting structure that emits green light among the light emitting structures, and thus, may exhibit high efficiency properties.

A light emitting element of a display device of an embodiment may include a material having low refractive properties in a light emitting layer of a light emitting structure that emits green light among multiple light emitting structures, and thus, may exhibit excellent light emission efficiency.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A light emitting element comprising:

a first electrode;

a second electrode facing the first electrode; and a plurality of light emitting structures stacked between the first electrode and the second electrode, each of the plurality of light emitting structures including a hole transport region, a light emitting layer, and an electron transport region, wherein at least one of the plurality of light emitting structures is a green light emitting structure which emits green light, and the light emitting layer of the green light emitting structure includes:

a first sub-light emitting layer including a low refractive material having a refractive index value less than or equal to about 1.7 at 460 nm; and a second sub-light emitting layer not including the low refractive material, and disposed on the first sub-light emitting layer.

2. The light emitting element of claim 1, wherein the first sub-light emitting layer and the second sub-light emitting layer each comprises a hole transporting first host, an electron transporting second host, and a green light emitting dopant.

3. The light emitting element of claim 1, wherein the low refractive material is a hole transporting host.

4. The light emitting element of claim 1, wherein the first sub-light emitting layer is directly disposed on the hole transport region of the green light emitting structure.

5. The light emitting element of claim 4, wherein the hole transport region of the green light emitting structure comprises:

a hole transport layer; and an auxiliary hole transport layer disposed on the hole transport layer, and including a low refractive hole transporting material having a refractive index value less than or equal to about 1.7 at 460 nm.

6. The light emitting element of claim 5, wherein the first sub-light emitting layer is directly disposed on the auxiliary hole transport layer.

7. The light emitting element of claim 5, wherein the low refractive material and the low refractive hole transport material are same.

8. The light emitting element of claim 1, wherein the plurality of light emitting structures comprise:

a first light emitting structure disposed on the first electrode and emitting blue light;

a second light emitting structure disposed on the first light emitting structure and emitting blue light;

a third light emitting structure disposed on the second light emitting structure and emitting blue light; and the green light emitting structure disposed on the third light emitting structure.

9. The light emitting element of claim 8, wherein the light emitting layer of each of the first light emitting structure, the second light emitting structure, and the third light emitting structure comprises a hole transporting host, an electron transporting host, and a blue light emitting dopant.

10. The light emitting element of claim 1, wherein the plurality of light emitting structures comprise:

a first light emitting structure disposed on the first electrode and emitting blue light;

a second light emitting structure disposed on the first light emitting structure and emitting blue light; and the green light emitting structure disposed on the second light emitting structure.

11. The light emitting element of claim 1, wherein the plurality of light emitting structures comprise a first light emitting structure, a second light emitting structure, a third light emitting structure, and a fourth light emitting structure each emitting blue light and sequentially stacked between the first electrode and the second electrode, the green light emitting structure comprises:

a first green light emitting structure disposed between the second light emitting structure and the third light emitting structure; and a second green light emitting structure disposed on an upper side of the fourth light emitting structure, and the second green light emitting structure includes the first sub-light emitting layer having the low refractive material and the second sub-light emitting layer not including the low refractive material.

12. The light emitting element of claim 1, wherein the first sub-light emitting layer and the second sub-light emitting layer have a same thickness.

13. A light emitting element comprising:

a first electrode;

a second electrode facing the first electrode;

a plurality of light emitting structures sequentially stacked between the first electrode and the second electrode, each of the plurality of light emitting structures including a hole transport region, a light emitting layer, and an electron transport region; and a charge generating layer disposed between adjacent ones of the plurality of light emitting structures between the first electrode and the second electrode, wherein two or more of the plurality of light emitting structures are blue light emitting structures that emit blue light, at least one of the plurality of light emitting structures is a green light emitting structure that emits green light, and the green light emitting structure includes:

a first sub-light emitting layer including a first host, a first dopant, and a low refractive material having a refractive index value less than or equal to about 1.7 at 460 nm; and a second sub-light emitting layer disposed on the first sub-light emitting layer, and including a second host and a second dopant.

14. The light emitting element of claim 13, wherein the charge generating layer comprises:

a n-type charge generating layer doped with a n-type dopant; and a p-type charge generating layer doped with a p-type dopant.

15. The light emitting element of claim 13, wherein the second sub-light emitting layer does not comprise the low refractive material, the first host and the second host are same, and the first dopant and the second dopant are same.

16. The light emitting element of claim 13, wherein the plurality of light emitting structures comprise:

a first blue light emitting structure disposed on the first electrode;

a second blue light emitting structure disposed on the first blue light emitting structure;

a third blue light emitting structure disposed on the second blue light emitting structure; and the green light emitting structure disposed on the third blue light emitting structure.

17. The light emitting element of claim 16, wherein the hole transport region of the green light emitting structure comprises an auxiliary hole transport layer directly disposed on a lower side of the first sub-light emitting layer, and including a low refractive hole transport material having a refractive index value less than or equal to about 1.7 at 460 nm.

18. The light emitting element of claim 13, wherein light emitted from the plurality of light emitting structures is emitted to an upper side of the second electrode.

19. The light emitting element of claim 18, wherein among the plurality of light emitting structures, the green light emitting structure is disposed adjacent to the second electrode.

20. The light emitting element of claim 16, wherein the light emitting layer of each of the first blue light emitting structure, the second blue light emitting structure, and the third blue light emitting structure does not include the low refractive index material.

21. A display device comprising:

a light emitting element that outputs source light; and an optical layer disposed on the light emitting element, and either transmitting the source light or converting a wavelength of the source light, wherein the light emitting element includes:

a first electrode;

a second electrode facing the first electrode; and a plurality of light emitting structures stacked between the first electrode and the second electrode, each of the plurality of light emitting structures including a hole transport region, a light emitting layer, and an electron transport region, at least one of the plurality of light emitting structures is a green light emitting structure that emits green light, and the light emitting layer of the green light emitting structure includes:

a first sub-light emitting layer including a low refractive material having a refractive index value less than or equal to about 1.7 at 460 nm; and a second sub-light emitting layer not including the low refractive material, and disposed on the first sub-light emitting layer.

22. The display device of claim 21, wherein the optical layer includes a light control layer including quantum dots that convert the wavelength of the source light.

23. The display device of claim 22, further comprising:

a first pixel region that emits red light;

a second pixel region that emits green light; and a third pixel region that emits blue light, wherein the first pixel region, the second pixel region, and the third pixel region do not overlap with each other in a plan view, and the light control layer includes:

a first light control part disposed corresponding to the first pixel region, and including a first quantum dot that converts the wavelength of the source light;

a second light control part disposed corresponding to the second pixel region, and including a second quantum dot that converts the wavelength of the source light; and a third light control part disposed corresponding to the third pixel region.

24. The display device of claim 21, wherein the low refractive material is a hole transporting host.

25. The display device of claim 21, wherein the hole transport region of the green light emitting structure comprises:

a hole injection layer:

a hole transport layer disposed on the hole injection layer; and an auxiliary hole transport layer disposed on the hole transport layer, and including a low refractive hole transporting material having a refractive index value less than or equal to about 1.7 at 460 nm, and the first sub-light emitting layer is directly disposed on the auxiliary hole transport layer.

* * * * *